US009165502B2

(12) United States Patent
Yamazaki et al.

(10) Patent No.: US 9,165,502 B2
(45) Date of Patent: Oct. 20, 2015

(54) DISPLAY DEVICE AND ELECTRONIC DEVICE INCLUDING DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Jun Koyama, Sagamihara (JP); Hiroyuki Miyake, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/540,326

(22) Filed: Nov. 13, 2014

(65) Prior Publication Data

US 2015/0070254 A1 Mar. 12, 2015

Related U.S. Application Data

(63) Continuation of application No. 12/906,538, filed on Oct. 18, 2010, now Pat. No. 8,890,781.

(30) Foreign Application Priority Data

Oct. 21, 2009 (JP) ................................. 2009-242757
Dec. 8, 2009 (JP) ................................. 2009-278997

(51) Int. Cl.
*G09G 3/32* (2006.01)
*H01L 27/12* (2006.01)
(52) U.S. Cl.
CPC .......... *G09G 3/3233* (2013.01); *H01L 27/1225* (2013.01)
(58) Field of Classification Search
CPC ......................... G09G 3/3233; H01L 27/1225
See application file for complete search history.

(56) References Cited

U.S. PATENT DOCUMENTS 5,298,297 A   3/1994   Takei
5,731,856 A   3/1998   Kim et al.
(Continued)

FOREIGN PATENT DOCUMENTS

CN   101425543 A   5/2009
CN   101491086 A   7/2009
(Continued)

OTHER PUBLICATIONS

International Search Report (Application No. PCT/JP2010/067193) Dated Dec. 7, 2010.
(Continued)

*Primary Examiner* — Liliana Cerullo
(74) *Attorney, Agent, or Firm* — Eric J. Robinson; Robinson Intellectual Property Law Office, P.C.

(57) ABSTRACT

Objects are to provide a display device the power consumption of which is reduced, to provide a self-luminous display device the power consumption of which is reduced and which is capable of long-term use in a dark place. A circuit is formed using a thin film transistor in which a highly-purified oxide semiconductor is used and a pixel can keep a certain state (a state in which a video signal has been written). As a result, even in the case of displaying a still image, stable operation is easily performed. In addition, an operation interval of a driver circuit can be extended, which results in a reduction in power consumption of a display device. Moreover, a light-storing material is used in a pixel portion of a self-luminous display device to store light, whereby the display device can be used in a dark place for a long time.

18 Claims, 28 Drawing Sheets

(56) References Cited

U.S. PATENT DOCUMENTS

| | | | |
|---|---|---|---|
| 5,744,864 A | 4/1998 | Cillessen et al. |
| 6,169,532 B1 | 1/2001 | Sumi et al. |
| 6,294,274 B1 | 9/2001 | Kawazoe et al. |
| 6,498,369 B1 | 12/2002 | Yamazaki et al. |
| 6,563,174 B2 | 5/2003 | Kawasaki et al. |
| 6,646,288 B2 | 11/2003 | Yamazaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,321,353 B2 | 1/2008 | Tsuda et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,439,545 B2 | 10/2008 | Honda |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,583,021 B2 | 9/2009 | Mikami et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,791,074 B2 | 9/2010 | Iwasaki |
| 7,855,379 B2 | 12/2010 | Hayashi et al. |
| 7,928,647 B2 | 4/2011 | Mikami et al. |
| 8,088,652 B2 | 1/2012 | Hayashi et al. |
| 8,183,097 B2 | 5/2012 | Kwak et al. |
| 8,188,467 B2 | 5/2012 | Itagaki et al. |
| 8,212,248 B2 | 7/2012 | Itagaki et al. |
| 8,436,349 B2 | 5/2013 | Sano et al. |
| 8,471,805 B2 | 6/2013 | Teranishi et al. |
| 2001/0043292 A1 | 11/2001 | Tsujimura et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0063078 A1 | 4/2003 | Hanari et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0017854 A1 | 1/2008 | Marks et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308809 A1 | 12/2008 | Yang et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0127550 A1 | 5/2009 | Imai |
| 2009/0127551 A1 | 5/2009 | Imai |
| 2009/0134389 A1* | 5/2009 | Matsunaga ............... 257/43 |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0167663 A1 | 7/2009 | Ker et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0051949 A1 | 3/2010 | Yamazaki et al. |
| 2010/0065844 A1 | 3/2010 | Tokunaga |
| 2010/0072468 A1 | 3/2010 | Yamazaki et al. |
| 2010/0084648 A1 | 4/2010 | Watanabe |
| 2010/0092800 A1 | 4/2010 | Itagaki et al. |
| 2010/0102312 A1 | 4/2010 | Yamazaki et al. |
| 2010/0109002 A1 | 5/2010 | Itagaki et al. |
| 2010/0276689 A1 | 11/2010 | Iwasaki |
| 2010/0279462 A1 | 11/2010 | Iwasaki |
| 2010/0295042 A1 | 11/2010 | Yano et al. |
| 2011/0006297 A1 | 1/2011 | Inoue et al. |
| 2011/0062433 A1 | 3/2011 | Yamazaki |
| 2012/0217495 A1 | 8/2012 | Kwak et al. |

FOREIGN PATENT DOCUMENTS

| | | |
|---|---|---|
| EP | 1045447 A | 10/2000 |
| EP | 1737044 A | 12/2006 |
| EP | 2023614 A | 2/2009 |
| EP | 2061086 A | 5/2009 |
| EP | 2226847 A | 9/2010 |
| EP | 2410567 A | 1/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-222136 A | 8/1998 |
| JP | 11-505377 | 5/1999 |
| JP | 2000-044236 A | 2/2000 |
| JP | 2000-150900 A | 5/2000 |

(56) References Cited

FOREIGN PATENT DOCUMENTS

| | | |
|---|---|---|
| JP | 2002-076356 A | 3/2002 |
| JP | 2002-140052 A | 5/2002 |
| JP | 2002-169499 A | 6/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-056813 A | 3/2005 |
| JP | 2005-071920 A | 3/2005 |
| JP | 2006-003924 A | 1/2006 |
| JP | 2006-084758 A | 3/2006 |
| JP | 2006-165527 A | 6/2006 |
| JP | 2006-165528 A | 6/2006 |
| JP | 2006-165529 A | 6/2006 |
| JP | 2007-103918 A | 4/2007 |
| JP | 2008-033066 A | 2/2008 |
| JP | 2008-116855 A | 5/2008 |
| JP | 2008-281988 A | 11/2008 |
| JP | 2008-294136 A | 12/2008 |
| JP | 2008-300518 A | 12/2008 |
| JP | 2009-099847 A | 5/2009 |
| JP | 2009-141341 A | 6/2009 |
| JP | 2009-164393 A | 7/2009 |
| JP | 2009-224479 A | 10/2009 |
| JP | 5154627 | 2/2013 |
| KR | 2001-0006985 A | 1/2001 |
| TW | 200737550 | 10/2007 |
| TW | 200929149 | 7/2009 |
| WO | WO-2004/114391 | 12/2004 |
| WO | WO-2007/029844 | 3/2007 |
| WO | WO-2008/105347 | 9/2008 |
| WO | WO-2008/126879 | 10/2008 |
| WO | WO-2008/149754 | 12/2008 |
| WO | WO-2009/075161 | 6/2009 |
| WO | WO-2009/087943 | 7/2009 |
| WO | WO-2009/093625 | 7/2009 |
| WO | WO-2011/048924 | 4/2011 |

OTHER PUBLICATIONS

Written Opinion (Application No. PCT/JP2010/067193) Dated Dec. 7, 2010.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,Or Zn] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=in,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a charge-generation layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vaccum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Kato.K et al., "Evaluation of Off-State Current Characteristics of Transistor Using Oxide Semiconductor Material, Indium.Gallium. Zinc Oxide", Jpn. J. Appl. Phys. (Japanese Journal of Applied Physics), 2012, vol. 51, pp. 021201-1-021201-7.

Kawamura.T et al., "1.5-V Operating Fully-Depleted Amorphous Oxide Thin Film Transistors Achieved by 63-mV/dec Subthreshold Slope", IEDM 08: Technical Digest of International Electron Devices Meeting, Dec. 15, 2008.

Chinese Office Action (Application No. 201080039655.X) Dated Jun. 5, 2014.

\* cited by examiner

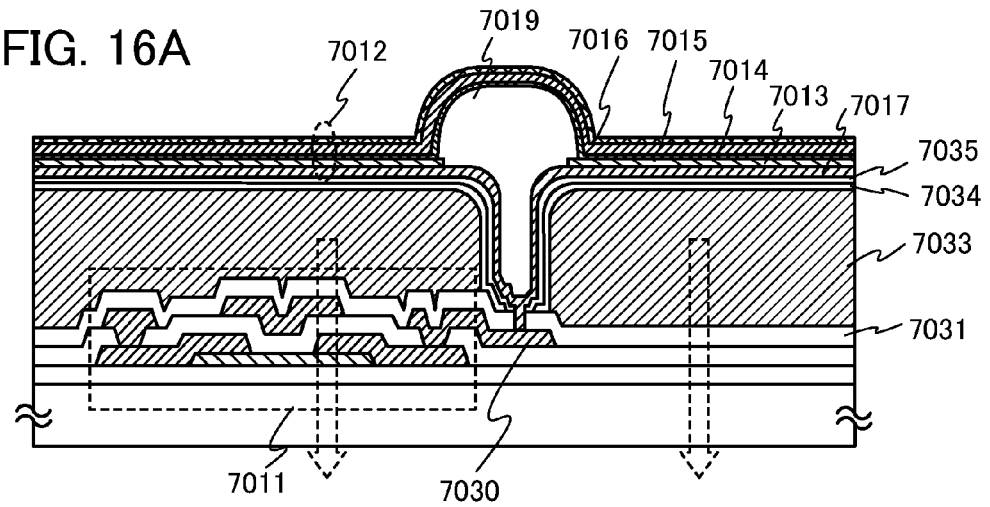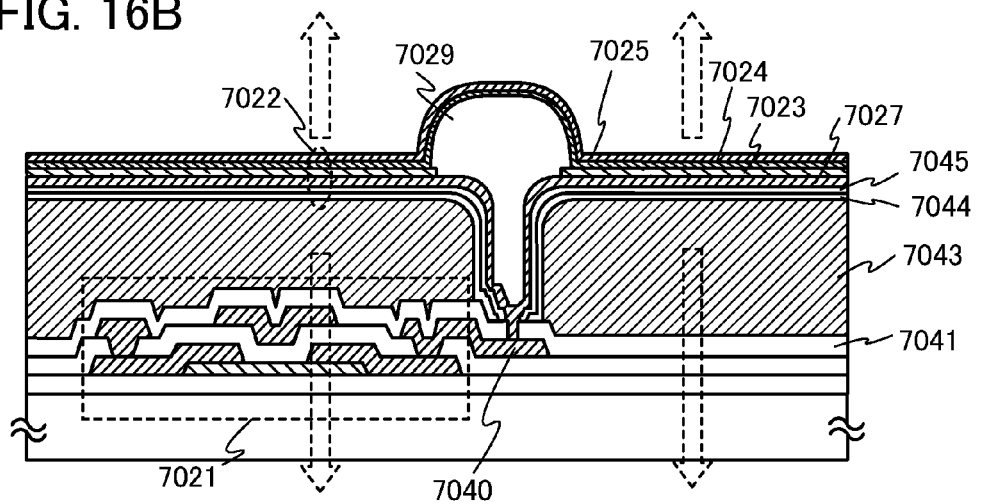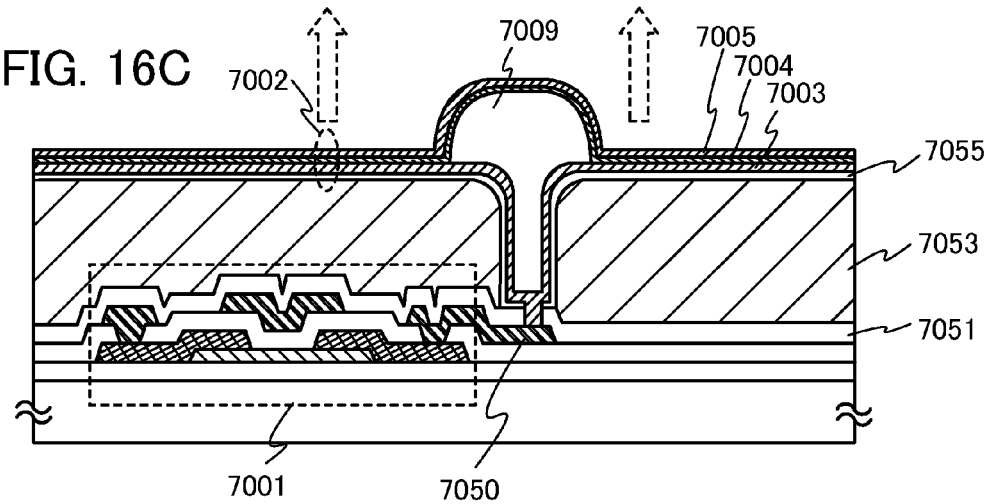

DISPLAY DEVICE AND ELECTRONIC DEVICE INCLUDING DISPLAY DEVICE

TECHNICAL FIELD

The present invention relates to display devices and electronic devices each including the display device. In particular, one embodiment of the present invention relates to a display device including a field effect transistor in which an oxide semiconductor is used and a light-emitting element, and an electronic device including the display device.

BACKGROUND ART

A technique for forming a thin film transistor (TFT) by using a semiconductor thin film formed over a substrate having an insulating surface has attracted attention. The thin film transistor has been used in a display device typified by a liquid crystal television. A silicon-based semiconductor material is known as a material of a semiconductor thin film that can be used in a thin film transistor. Besides, an oxide semiconductor has attracted attention as another material.

As a material of the oxide semiconductor, zinc oxide or a substance containing zinc oxide is known. Thin film transistors each of which is formed using an amorphous oxide (an oxide semiconductor) having an electron carrier concentration of lower than $10^{18}/cm^3$ are disclosed in Patent Documents 1 to 3.

A field-effect transistor in which an oxide semiconductor is used can be used in, for example, a display device. As examples of the display device, the following are given: a self-luminous display device for displaying an image by emitting light, a transmissive display device for displaying an image by selectively transmitting part of light from a backlight, and a reflective display device for displaying an image by reflecting external light.

The self-luminous display device and the transmissive display device are insusceptible to external light, emit bright light, and have excellent capability to display images.

The reflective display device has a feature in that power saving is easily achieved because it does not need to incorporate a light source. Needless to say, displayed images can be rewritten. Therefore, the reflective display device has attracted attention as electronic paper substituted for a print medium from societies aiming for saving of natural resources.

However, the visibility of the reflective display device is decreased in an environment where the amount of external light is small; thus, lighting is needed for using the reflective display device. The use of lighting damages the feature of the reflective display device of low power consumption. Hence, inventions, in each of which a substance that stores external light such as a light-storing fluorescent material or a light-storing material is used in a reflective display device for increasing the visibility in a dark place with power consumption suppressed, are disclosed in Patent Documents 4 and 5.

REFERENCE

[Patent Document 1] Japanese Published Patent Application No. 2006-165527
[Patent Document 2] Japanese Published Patent Application No. 2006-165528
[Patent Document 3] Japanese Published Patent Application No. 2006-165529
[Patent Document 4] Japanese Published Patent Application No. 2006-3924
[Patent Document 5] Japanese Published Patent Application No. 2008-116855

DISCLOSURE OF INVENTION

Deviation from the stoichiometric composition of an oxide semiconductor arises when the oxide semiconductor is formed as a thin film. For example, the electric conductivity of the oxide semiconductor is changed due to excess or deficiency of oxygen. In addition, hydrogen which is mixed into the oxide semiconductor during the thin film formation forms an oxygen (O)-hydrogen (H) bond and the OH bond serves as an electron donor, which is a factor for changing the electric conductivity. Furthermore, O—H is a polar molecule, and thus serves as a factor for changing characteristics of an active device such as a thin film transistor manufactured using the oxide semiconductor.

Even when the electron carrier concentration is lower than $10^{18}/cm^3$, the oxide semiconductor is substantially n-type, and the on/off ratio of the thin film transistors disclosed in the above patent documents is only $10^3$. The above low on/off ratio of the thin film transistors is caused by large off-state current.

In the case where a thin film transistor with a large amount of off-state current is used in a pixel portion of a display device, a capacitor needs to be additionally provided for keeping signal voltage applied to a pixel. The provision of the capacitor in the pixel causes problems such as a decrease in aperture ratio of the pixel and an increase in power consumption of the display device.

Further, a decrease in energy supplied to a light-emitting element included in a self-luminous display device or a transmissive display device for reducing power consumption of the display device has a significant influence on the display quality such as dark display or display disappearance.

Further, the reflective display devices in each of which a light-storing material is used, which are disclosed in the above patent documents, can perform display with low power consumption even in an environment where the amount of external light is small; however, the light-storing material needs to be irradiated with external light in advance in order to store the light. Therefore, such a reflective display device is not suitable for long-term use in a dark place.

The present invention is made in view of the foregoing technical background. Therefore, an object of one embodiment of the present invention is to provide a display device the power consumption of which is suppressed. Another object is to provide a self-luminous display device the power consumption of which is suppressed. Another object is to provide a self-luminous display device the power consumption of which is suppressed and which is capable of long-term use in a dark place.

One embodiment of the present invention is a self-luminous display device in which a thin film transistor having stable electric characteristics (e.g., an extremely small amount of off-state current) is used. Specifically, in the self-luminous display device, a driver circuit of a light-emitting element includes a thin film transistor in which a channel region is formed using an oxide semiconductor which is an intrinsic semiconductor or a substantially intrinsic semiconductor by removal of impurities that form as an electron donor (a donor) in the oxide semiconductor and which has a larger energy gap than a silicon semiconductor.

In other words, in one embodiment of the present invention, a driver circuit of a light-emitting element includes a thin film transistor in which a channel formation region is formed using an oxide semiconductor film in which hydrogen or OH groups contained in the oxide semiconductor is reduced to a concentration of hydrogen of $5\times10^{19}$/cm$^3$ or lower, preferably $5\times10^{18}$/cm$^3$ or lower, more preferably $5\times10^{17}$/cm$^3$ or lower and in which the carrier concentration is lower than $1\times10^{14}$/cm$^3$, preferably $1\times10^{12}$/cm$^3$ or lower.

The energy gap is 2 eV or more, preferably 2.5 eV or more, more preferably 3 eV or more, impurities such as hydrogen that forms a donor are reduced as much as possible, and the carrier concentration is lower than $1\times10^{14}$/cm$^3$, preferably $1\times10^{12}$/cm$^3$ or lower.

The oxide semiconductor that is highly purified as described above is used in a channel formation region of a thin film transistor, whereby the thin film transistor functions so that the drain current is $1\times10^{-13}$ A or less in a range of a gate voltage of −5 V to −20 V when the drain voltage is 1 V and 10 V, even in the case where the channel width is 10 mm.

Further, one embodiment of the present invention focuses on power consumed by a driver circuit included in a self-luminous display device. In other words, power consumed by the display device may be reduced by decreasing the frequency of operation of the driver circuit. In addition, power consumed by the display device may be reduced in such a manner that a light-storing layer is provided in a pixel portion of the self-luminous display device, light emitted from a light-emitting element is stored in the light-storing layer, and energy supplied to the light-emitting element is suppressed while an image is displayed with the use of light emitted from the light-storing layer.

In other words, one embodiment of the present invention is a display device including, in a pixel, a power supply line to which pulsed DC power is supplied, a light-emitting element to which power is supplied from the power supply line, a first thin film transistor which controls switching of a circuit which connects the power supply line to the light-emitting element, a signal line which supplies a video signal, and a second thin film transistor which controls switching of a circuit which connects the signal line to the first thin film transistor. A channel formation region in the second thin film transistor is formed using an oxide semiconductor which has a band gap of 2 eV or more and a hydrogen concentration of $5\times10^{19}$/cm$^3$ or lower. The second thin film transistor in which off-state current per a channel width of 1 μm is suppressed to $1\times10^{-16}$ A/μm or lower holds the first thin film transistor in an on state and connects the power supply line to the light-emitting element to display a still image.

One embodiment of the present invention is the display device which has a concentration of carriers in an oxide semiconductor layer of lower than $1\times10^{14}$/cm$^3$.

One embodiment of the present invention is the display device having a period in which output of a scan line signal is stopped, in a period in which a still image is displayed.

One embodiment of the present invention is the display device including a light-emitting element including a pair of electrodes and a layer containing a light-emitting organic substance between the pair of electrodes.

One embodiment of the present invention is the display device including a light-storing layer in a pixel.

One embodiment of the present invention is an electronic device including the display device.

Note that in this specification, a "light-storing material" refers to materials in general which absorbs external energy such as external light, is relatively stable, and generates an exciton with a long life and in which the exciton is deactivated after light emission for a relatively long time. The light-storing material in which the exciton with a long life is stored continues to emit light even when there is no external energy.

Note that in this specification, a "pixel" refers to an element group which includes elements provided in each pixel of a display device, for example, an element for controlling display in accordance with electric signals, such as a thin film transistor, an electrode functioning as a pixel electrode, or a wiring. Note that a pixel may include a color filter or the like, and may correspond to one color component whose illuminance can be controlled by one pixel. Thus, for example, in the case of a color display device including color components of R, G, and B, a minimum unit of an image includes three pixels of R, G, and B and an image can be obtained by a plurality of pixels.

Note that in this specification, when it is described that "A and B are connected", the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer).

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that in this specification, a "light emitting device" refers to an image display device, a light emitting device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

According to one embodiment of the present invention, a circuit is formed using a thin film transistor in which a highly-purified oxide semiconductor is used, whereby operation of the circuit included in a display device can be stabilized. In addition, off-state current reduced to $1\times10^{-13}$ A or lower allows omission of a capacitor which holds signal voltage applied to a pixel of the display device. In other words, a storage capacitor does not need to be provided in each pixel, which results in an increase in aperture ratio. When aperture ratio is increased, driving voltage of a light-emitting element is suppressed, which results in a reduction in power consumption of the display device.

Further, a pixel which is formed using the thin film transistor according to one embodiment of the present invention can maintain a constant state (a state in which an image signal is written), and thus can operate stably even in the case where a still image is displayed. In addition, operation interval of a driver circuit can be extended, which results in a reduction in power consumption of a display device.

Further, according to one embodiment of the present invention, a display device that can be used in an environment where external light is weak can be provided. In addition, a display device that can display an image with power consumption suppressed can be provided.

BRIEF DESCRIPTION OF DRAWINGS

In the Accompanying Drawings:

FIGS. 16A to 16C are cross-sectional views of pixels according to Embodiment;

BEST MODE FOR CARRYING OUT THE INVENTION

Figure 1A:
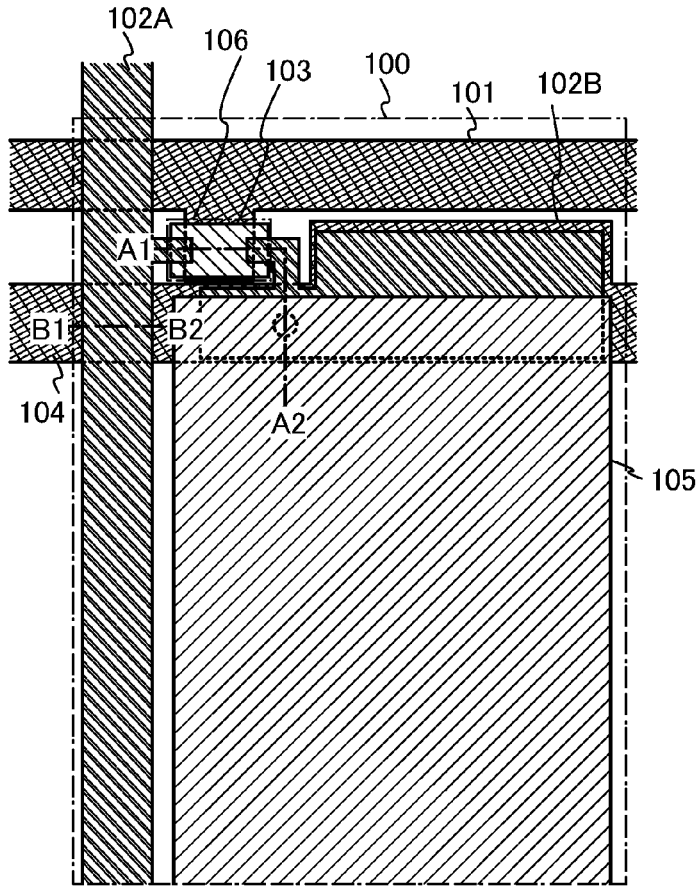
FIG. 1A is a top view of a pixel according to Embodiment and FIGS. 1B and 1C are cross-sectional views thereof.

Hereinafter, Embodiments and Example of the present invention will be described in detail with reference to the accompanying drawings. However, the present invention is not limited to the description below, and it is easily understood by those skilled in the art that modes and details disclosed herein can be modified in various ways without departing from the spirit and scope of the present invention. Therefore, the present invention is not construed as being limited to the description of Embodiments. In the structures to be given below, the same portions or portions having similar functions are denoted by the same reference numerals in different drawings, and explanation thereof will not be repeated.

Embodiment 1

In this embodiment, an example of a pixel including a thin film transistor in which a highly-purified oxide semiconductor is used and a pixel electrode will be described below with reference to FIGS. 1A to 1C, FIG. 2, FIG. 3, and FIGS. 4A and 4B.

First, FIG. 1A is a top view of the pixel. Note that as an example of a structure of a TFT illustrated in FIG. 1A, a bottom gate structure that is a so-called inverted staggered structure is illustrated, in which wiring layers that serve as source and drain electrodes of a TFT are provided on one side of an oxide semiconductor layer that serves as a channel region, and a wiring that serves as a gate is provided on the other side of the oxide semiconductor layer. A pixel 100 illustrated in FIG. 1A includes a first wiring 101 that functions as a scan line, a second wiring 102A that functions as a signal line, an oxide semiconductor layer 103, a capacitor line 104, and a pixel electrode 105, and in addition to the above, a third wiring 102B for electrically connecting the oxide semiconductor layer 103 to the pixel electrode 105, whereby a thin film transistor 106 is formed.

The first wiring 101 also functions as a gate of the thin film transistor 106. The second wiring 102A also functions as one of the source electrode and the drain electrode and one electrode of a storage capacitor. The third wiring 102B also functions as the other of the source electrode and the drain electrode. The capacitor line 104 functions as the other electrode of the storage capacitor. Note that the first wiring 101 and the capacitor line 104 are formed in the same layer, and the second wiring 102A and the third wiring 102B are formed in the same layer. In addition, the third wiring 102B and the capacitor line 104 partly overlap with each other to form a storage capacitor of a light-emitting element. Note that the oxide semiconductor layer 103 included in the thin film transistor 106 is provided over a wiring branching from the first wiring 101 with a gate insulating film (not illustrated) between the oxide semiconductor layer 103 and the wiring.

Figure 1B:
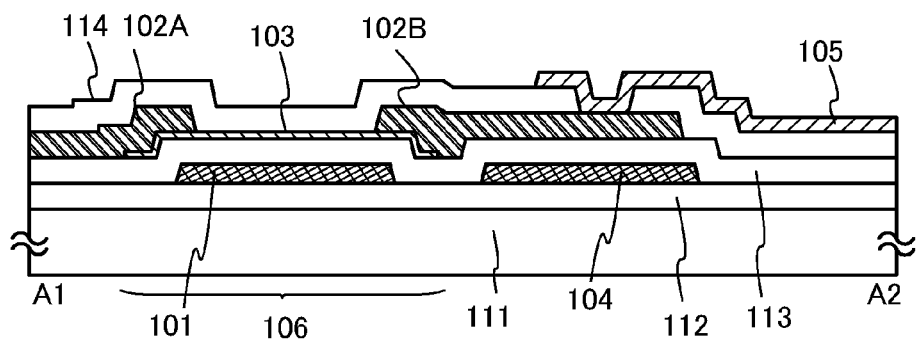

FIG. 1B illustrates a cross-sectional structure taken along chain line A1-A2 in FIG. 1A. In the cross-sectional structure illustrated in FIG. 1B, the first wiring 101 that functions as a gate and the capacitor line 104 are provided over a substrate 111 with a base film 112 therebetween. A gate insulating film 113 is provided so as to cover the first wiring 101 and the capacitor line 104. The oxide semiconductor layer 103 is provided over the gate insulating film 113. The second wiring 102A and the third wiring 102B are provided over the oxide semiconductor layer 103. An oxide insulating layer 114 that functions as a passivation film is provided over the oxide semiconductor layer 103, the second wiring 102A, and the third wiring 102B. An opening is formed in the oxide insulating layer 114, and the pixel electrode 105 and the third wiring 102B are connected to each other in the opening. A capacitor is constituted by the third wiring 102B, the capacitor line 104, and the gate insulating film 113 used as a dielectric.

Figure 1C:
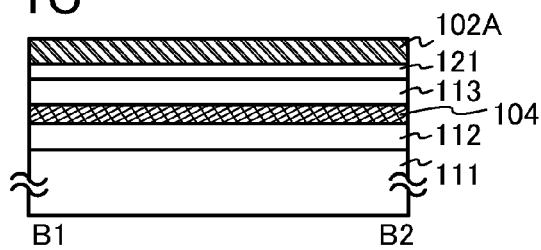

FIG. 1C is a cross-sectional view taken along chain line B1-B2 in FIG. 1A and illustrates a structure in which an insulating layer 121 is provided between the capacitor line 104 and the second wiring 102A.

In the case where the second wiring 102A is provided over the first wiring 101 and the capacitor line 104, parasitic capacitance might be generated between the first wiring 101 and the second wiring 102A and between the capacitor line 104 and the second wiring 102A, depending on the thickness of the gate insulating film 113. For that reason, the insulating layer 121 is provided as illustrated in FIG. 1C, so that defects such as a malfunction can be reduced.

Figure 2:
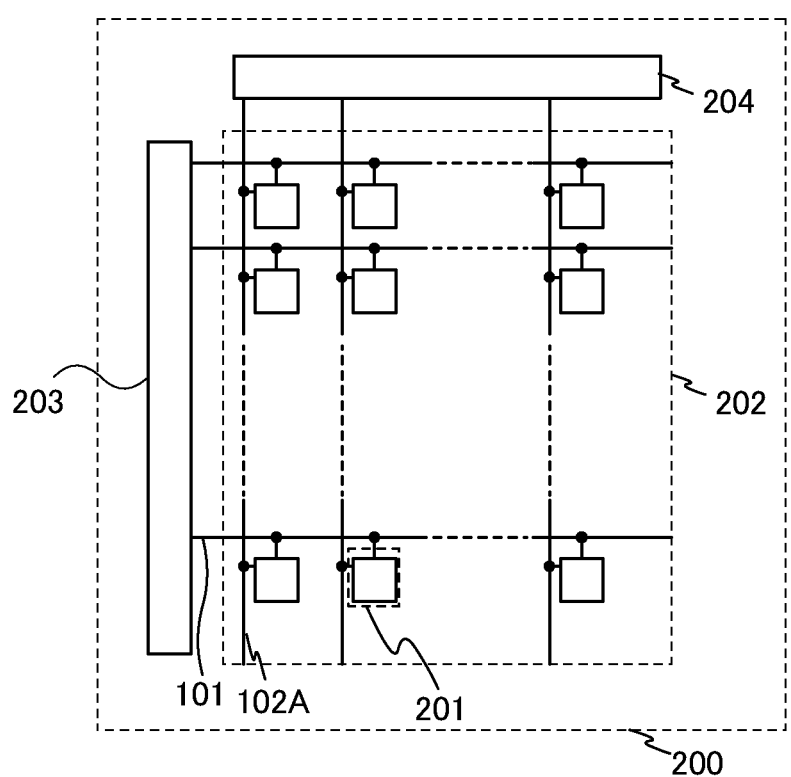
FIG. 2 illustrates a structure of a display device according to Embodiment.

Note that the pixel illustrated in FIGS. 1A to 1C corresponds to one of a plurality of pixels 201 arranged in matrix over a substrate 200 as illustrated in FIG. 2. FIG. 2 illustrates a structure in which a pixel portion 202, a scan line driver circuit 203, and a signal line driver circuit 204 are provided over the substrate 200. Whether the pixels 201 are in a selected state or in a non-selected state is determined per row in accordance with a scan signal supplied from the first wiring 101 connected to the scan line driver circuit 203. The pixel 201 selected by the scan signal is supplied with video voltage (also referred to as a video signal, an image signal, or video data) from the second wiring 102A connected to the signal line driving circuit 204.

Although the scan line driver circuit 203 and the signal line driver circuit 204 are provided over the substrate 200 in FIG. 2, either one of the scan line driver circuit 203 and the signal line driver circuit 204 may be provided over the substrate 200. Alternatively, only the pixel portion 202 may be provided over the substrate 200.

FIG. 2 illustrates an example in which the plurality of pixels 201 are arranged in matrix (in stripe) in the pixel portion 202. Note that the pixels 201 are not necessarily arranged in matrix and may be arranged in a delta pattern or in a Bayer pattern. As a display method of the display portion 202, a progressive method or an interlace method can be employed. Note that color elements controlled in the pixel for color display are not limited to three colors of R (red), G (green), and B (blue), and color elements of more than three colors may be employed, for example, RGBW (W corresponds to white), or RGB added with one or more of yellow, cyan, magenta, and the like. Note that the sizes of display regions may be different between respective dots of color elements.

In FIG. 2, the numbers of first wirings 101 and second wirings 102A correspond to the number of pixels in the row and column directions. The pixel 201 may be driven by the first wiring 101 and the second wiring 102A which are shared by plural pixels.

Note that, although the second wiring 102A is rectangular in FIG. 1A, the second wiring 102A may surround the third wiring 102B (specifically, the second wiring 102A may be U-shaped or C-shaped) so that an area of a region in which carriers move is increased to increase the amount of current flowing when the thin film transistor is in a conducting state (the current is also referred to as on-state current).

Note that "on-state current" described in this specification refers to current that flows between a source and a drain when a thin film transistor is on (when a thin film transistor is in a conducting state). In the case of an n-channel thin film transistor, "on-state current" refers to current that flows between a source and a drain when voltage applied between a gate and the source is higher than the threshold voltage ($V_{th}$).

Note that aperture ratio refers to a ratio of an area of a region through which light is transmitted per pixel; the aperture ratio is decreased, as an area of a region occupied by components that do not transmit light is increased, whereas the aperture ratio is increased as an area of a region occupied by components that transmit light is increased. In a display device, the aperture ratio is increased by reduction in the area occupied by a wiring and a capacitor line that overlap with a pixel electrode and reduction in the size of a thin film transistor.

In particular, in a self-luminous display device, aperture ratio refers to proportion of an emission area of a light-emitting element that can be observed by an observant in front of a display of the display device in an area of pixels.

Note that a thin film transistor is an element having at least three terminals of a gate, a drain, and a source. The thin film transistor has a channel region between a drain region and a source region, and current can flow through the drain region, the channel region, and the source region. Here, since the source and drain of the transistor might be changed depending on the structure, the operating condition, and the like of the transistor, it is difficult to define which is a source or a drain. Therefore, a region functioning as source and drain is not called the source or the drain in some cases. In such a case, for example, one of the source and the drain may be referred to as a first terminal and the other thereof may be referred to as a second terminal. Alternatively, one of the source and the drain may be referred to as a first electrode and the other thereof may be referred to as a second electrode. Further alternatively, one of the source and the drain may be referred to as a first region and the other thereof may be called a second region.

Next, the oxide semiconductor layer 103 will be described. Hydrogen or OH groups are removed from an oxide semiconductor used in this embodiment, and the concentration of hydrogen contained in the oxide semiconductor is $5 \times 10^{19}/cm^3$ or lower, preferably $5 \times 10^{18}/cm^3$ or lower, more preferably $5 \times 10^{17}/cm^3$ or lower. A channel formation region is formed in an oxide semiconductor film the carrier concentration of which is lower than $1 \times 10^{14}/cm^3$, preferably $1 \times 10^{12}/cm^3$ or lower so that a thin film transistor is formed. The concentration of hydrogen in the oxide semiconductor film may be measured by secondary ion mass spectrometry (SIMS).

The energy gap of the oxide semiconductor is 2 eV or more, preferably 2.5 eV or more, more preferably 3 eV or more, impurities such as hydrogen that forms a donor are reduced as much as possible so that the carrier concentration is lower than $1 \times 10^{14}/cm^3$, preferably $1 \times 10^{12}/cm^3$ or lower. In other words, the carrier concentration of the oxide semiconductor layer is reduced to a level as close to zero as possible.

The oxide semiconductor layer which is highly-purified by drastically removing hydrogen contained in the oxide semiconductor layer as described above is used in a channel formation region of a thin film transistor, whereby a thin film transistor with an extremely small amount of off-state current can be provided.

For example, even in the case where a thin film transistor in which the highly-purified oxide semiconductor layer is used has a channel length of 3 μm and a channel width of 10 mm, the thin film transistor functions so that the drain current is $1 \times 10^{-13}$ A or less in a range of a gate voltage of −5 V to −20 V (the thin film transistor is off), when the drain voltage is 1 V and 10 V.

Figure 21:
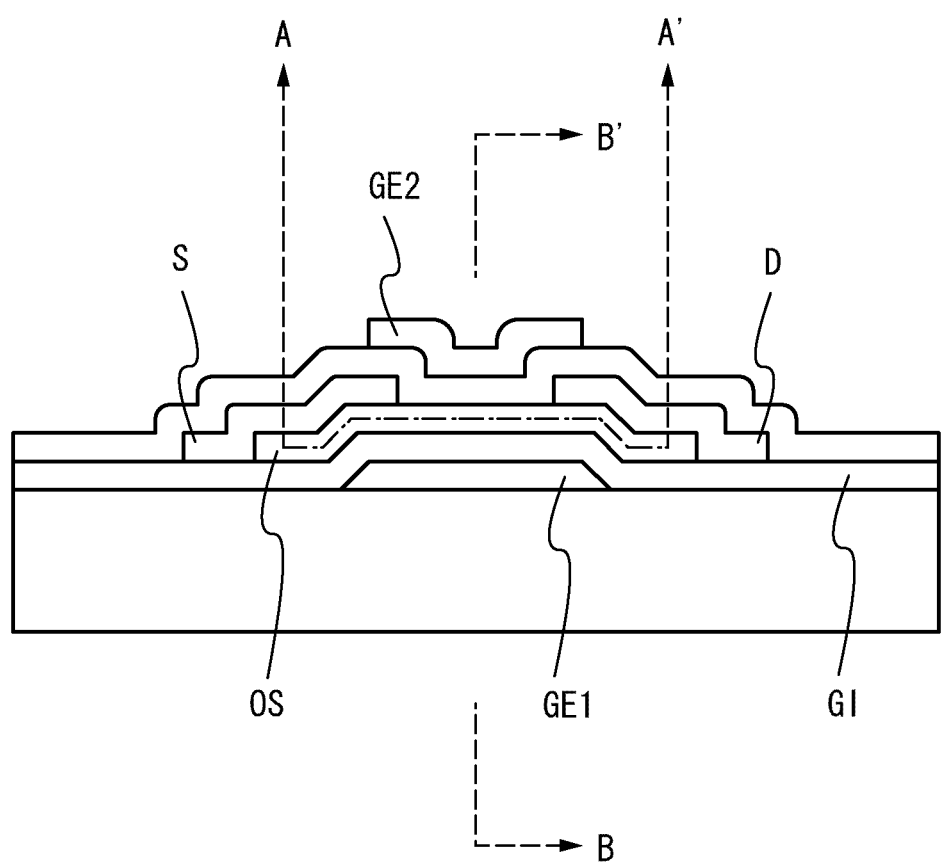
FIG. 21 is a longitudinal sectional view of an inverted staggered thin film transistor in which an oxide semiconductor is used.

Characteristics of a thin film transistor in which a highly-purified oxide semiconductor layer is used are described with reference to FIG. 21, FIGS. 22A and 22B, FIGS. 23A and 23B, and FIG. 24. FIG. 21 is a longitudinal sectional view of an inverted staggered thin film transistor in which an oxide semiconductor is used. An oxide semiconductor layer (OS) is provided over a gate electrode (GE1) with a gate insulating film (GI) therebetween, and a source electrode (S) and a drain electrode (D) are provided thereover.

Figure 22A:
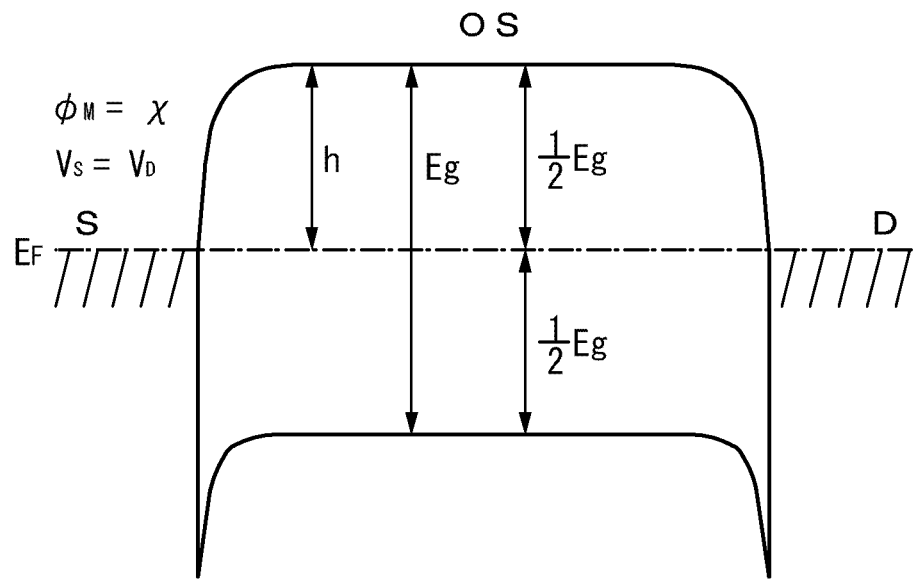
FIGS. 22A and 22B are energy band diagrams (schematic views) in a cross section taken along line A-A' in FIG. 21
Figure 22B:
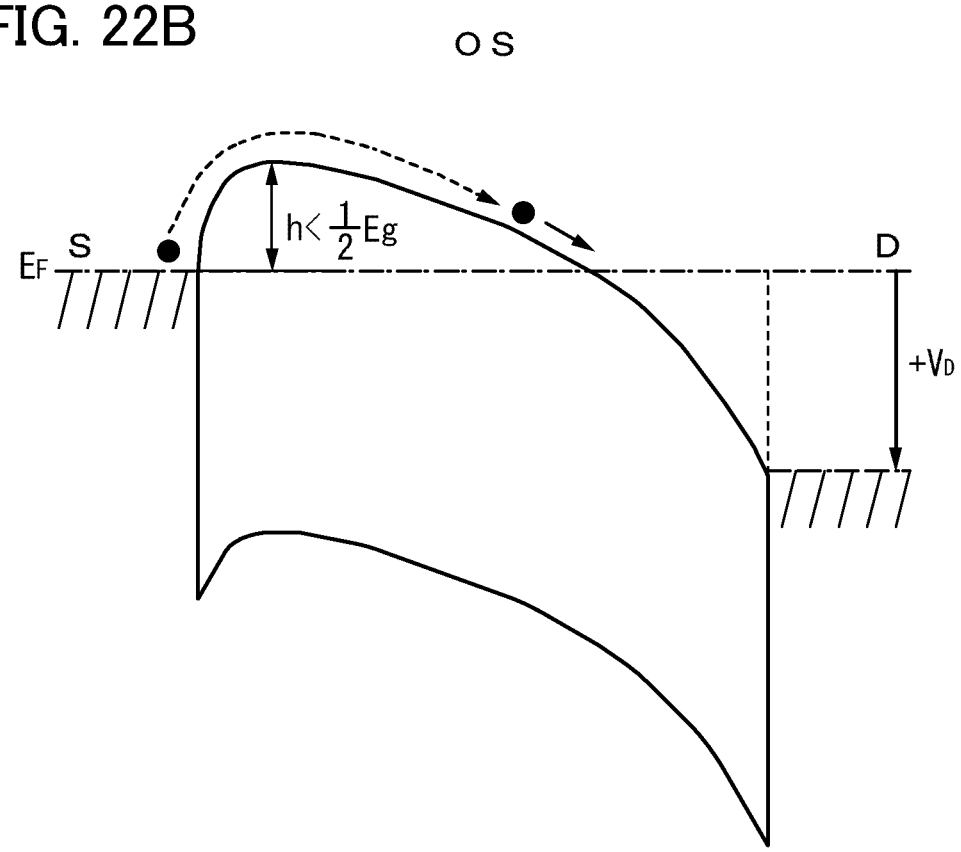

FIGS. 22A and 22B are energy band diagrams (schematic diagrams) of the thin film transistor in cross section along line A-A' in FIG. 21. FIG. 22A shows a case where the source and the drain have voltage of the same potential ($V_D$=0 V). FIG. 22B shows a case where positive potential is applied to the drain ($V_D$>0 V) whereas positive potential is not applied to the source.

Figure 23A:
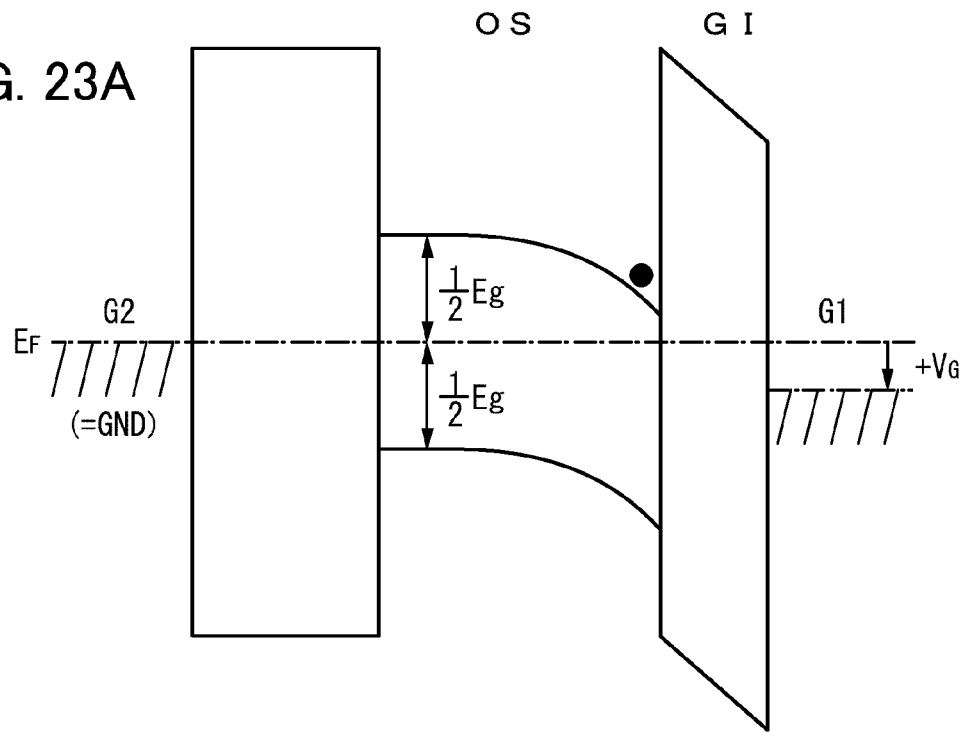
FIG. 23A shows a state in which positive potential ($+V_G$) is applied to a gate (G1) and FIG. 23B shows a state in which negative potential ($-V_G$) is applied to a gate (G1)
Figure 23B:
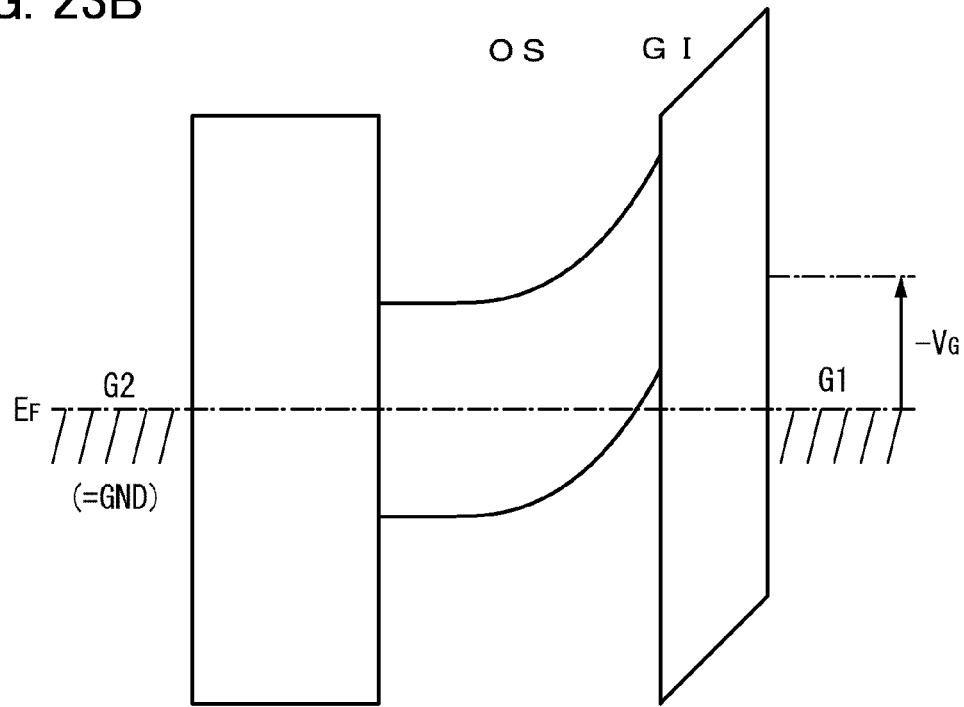

FIGS. 23A and 23B are energy band diagrams (schematic diagrams) of the thin film transistor in cross section along line B-B' in FIG. 21. FIG. 23A shows a state where positive potential (+$V_G$) is applied to a gate (G1), that is, a case where the thin film transistor is in an on state where carriers (electrons) flow between the source and the drain. FIG. 23B shows a state where negative potential (−$V_G$) is applied to the gate (G1), that is, a case where the thin film transistor is in an off state (where minority carriers do not flow).

Figure 24:
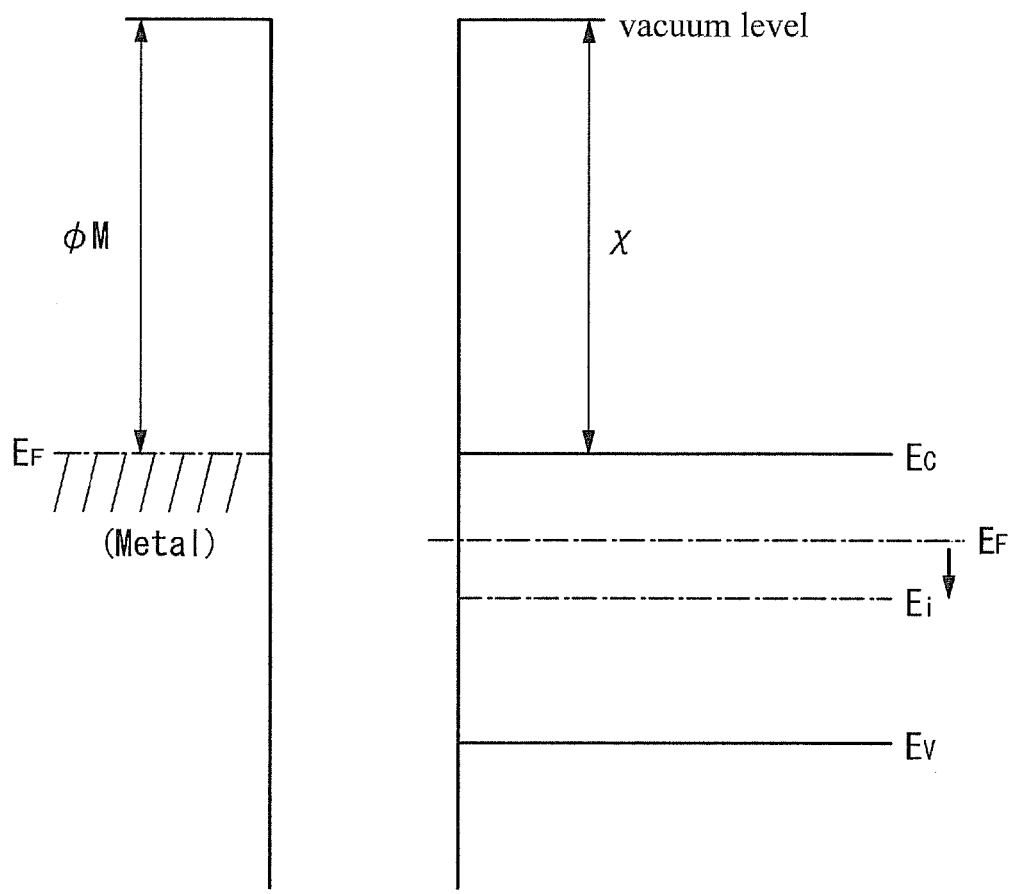
FIG. 24 shows a relation between a vacuum level and a work function ($\phi_M$) of a metal and a relation between a vacuum level and an electron affinity ($\chi$) of an oxide semiconductor.

FIG. 24 shows relation between the vacuum level and the work function ($\phi_M$) of a metal and relation between the vacuum level and the electron affinity ($\chi$) of an oxide semiconductor.

A conventional oxide semiconductor is generally of n-type, and the Fermi level ($E_F$) in that case is positioned closer to the conduction band and is away from the intrinsic Fermi level ($E_i$) that is located in the middle of the band gap. Note that it is known that some hydrogen in the oxide semiconductor form a donor and might be a factor that causes an oxide semiconductor to be an n-type oxide semiconductor.

In contrast, the oxide semiconductor according to the present invention is an oxide semiconductor that is made to be an intrinsic (i-type) semiconductor or made to be as close to an intrinsic semiconductor as possible by being highly purified by removal of hydrogen that is an n-type impurity so that as few impurities, which are not main components of the oxide semiconductor, as possible are contained. In other words, the oxide semiconductor according to the present invention has a feature in that it is made to be an i-type (intrinsic) oxide semiconductor or made to be close thereto by being highly purified by removal of impurities such as hydrogen or water as much as possible. As a result, the Fermi level ($E_F$) can be at substantially the same level as the intrinsic Fermi level ($E_i$).

It is said that the electron affinity ($\chi$) of an oxide semiconductor is 4.3 eV in the case where the band gap (Eg) thereof is 3.15 eV. The work function of titanium (Ti) used for forming the source and drain electrodes is substantially equal to the electron affinity ($\chi$) of the oxide semiconductor. In the case where titanium is used for the source and drain electrodes, the Schottky electron barrier is not formed at an interface between the metal and the oxide semiconductor.

In other words, an energy band diagram (a schematic diagram) like FIG. 22A is obtained in the case where a metal and an oxide semiconductor are in contact with each other when the work function ($\phi_M$) of the metal and the electron affinity ($\chi$) of the oxide semiconductor are substantially equal.

In FIG. 22B, a black circle (●) represents an electron. When positive potential is applied to the drain, the electrons cross a barrier (h) to be injected into the oxide semiconductor and flow toward the drain. In that case, the height of the barrier (h) changes depending on the gate voltage and the drain voltage. In the case where positive drain voltage is applied, the height of the barrier (h) is smaller than the height of the barrier (h) in FIG. 22A of the case where no voltage is applied; that is, the height of the barrier (h) is smaller than half of the band gap (Eg).

In this case, as shown in FIG. 23A, the electron moves along the lowest part of the oxide semiconductor, which is energetically stable, at an interface between the gate insulating film and the highly-purified oxide semiconductor.

In FIG. 23B, when negative potential is applied to the gate (G1), the number of holes that are minority carriers is substantially zero; thus, the current value becomes a value as close to zero as possible.

For example, even when the thin film transistor has a channel width of 1×10$^4$ μm and a channel length of 3 μm, an off-state current of 10$^{-13}$ A or lower and a subthreshold value (S value) of 0.1 V/dec. (the thickness of the gate insulating film: 100 nm) can be obtained.

As described above, the oxide semiconductor is highly purified so that the amount of impurities that are not main components of the oxide semiconductor are minimized, whereby favorable operation of the thin film transistor can be obtained.

A memory circuit (a memory element) or the like that is manufactured using such a thin film transistor that has an extremely small current value (an extremely small off-state current value) at the time when the thin film transistor is off has a small off-state current value and little leakage current. Thus, the length of a period for holding an electric signal such as a video signal can be increased.

Specifically, the thin film transistor including the above oxide semiconductor layer can have an off-state current per a channel width of 1 μm of 1×10$^{-16}$ A/μm or lower, furthermore 1 aA/μm (1×10$^{-18}$ A/μm) or lower.

Figure 15:
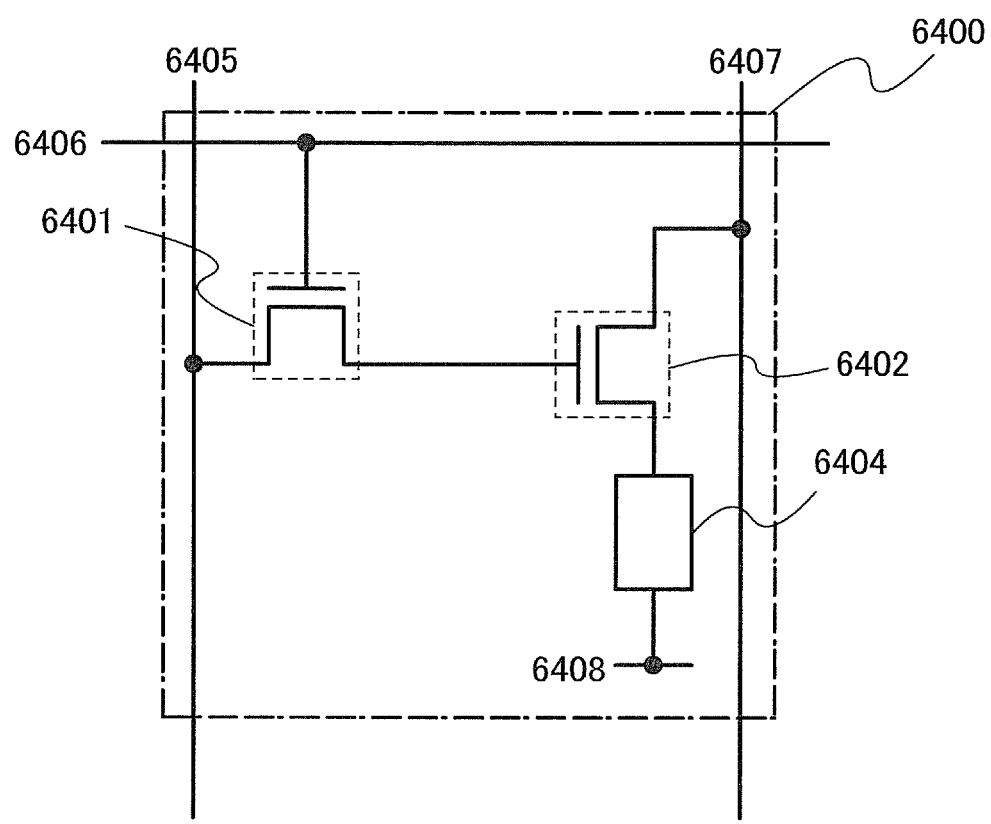
FIG. 15 is a diagram illustrating an equivalent circuit of a pixel according to Embodiment.

The length of the period for holding an electric signal such as a video signal can be increased by using a transistor that has an extremely small current value (an off-state current value) at the time when the transistor is off as a switching transistor in a pixel portion (e.g., a switching transistor 6401 in FIG. 15). Since the length of the holding period can be increased, for example, a writing interval can be longer than or equal to 10 seconds, preferably longer than or equal to 30 seconds, more preferably longer than or equal to 1 minute and shorter than 10 minutes. Increase in the writing interval makes it possible to increase an effect of suppressing power consumption.

Note that the suppression of off-state current in the transistor can be referred as off resistivity. The off resistivity refers to resistivity of a channel formation region at the time when the transistor is off, and the off resistivity can be calculated from off-state current.

Specifically, when the values of off-state current and drain voltage are known, it is possible to obtain resistivity (off resistivity R) at the time when the transistor is off in accordance with Ohm's law. In addition, off resistivity ρ can be obtained in accordance with the formula ρ=RA/L (R: off resistivity), if a cross-section area A of a channel formation region and length L of the channel formation region (the length corresponds to a distance between the source and drain electrodes) are known.

Here, the cross-section area A can be obtained in accordance with the formula A=dW (d: the thickness of the channel formation region, W: the channel width). In addition, the length L of the channel formation region is a channel length L. In such a manner, off resistivity can be calculated from off-state current.

The off resistivity of the transistor including the oxide semiconductor layer of this embodiment is preferably greater than or equal to $1\times10^9$ Ω·m, more preferably greater than or equal to $1\times10^{10}$ Ω·m.

The pixel configuration illustrated in FIG. 15 is one embodiment of this embodiment. For example, a storage capacitor can be provided between a gate of a driving transistor 6402 and a power supply line 6407. The storage capacitor may be constituted by a pair of electrodes and an insulating layer as a dielectric interposed between the pair of electrodes. The size of the storage capacitor is set so that a charge can be stored for a predetermined period in consideration of off-state current of the switching transistor 6401 or the like.

For example, design or the like is performed while estimating the amount of the off-state current of a thin film transistor including low-temperature polysilicon at around $1\times10^{-12}$ A. Thus, the voltage holding period of a thin film transistor including an oxide semiconductor can be approximately $10^5$ times as long as the voltage holding period of the thin film transistor including low-temperature polysilicon, when the holding capacitance is equal (approximately 0.1 pF). Further, a transistor including amorphous silicon has an off-state current per a channel width of 1 μm of greater than or equal to $1\times10^{-13}$ A/μm. Thus, the voltage holding period of a thin film transistor including a highly-purified oxide semiconductor can be approximately $10^4$ times as long as the voltage holding period of the thin film transistor including amorphous silicon, when the holding capacitance is equal (approximately 0.1 pF).

For example, in general, display is performed at 60 frames per second (16 msec per one frame) in a pixel including a transistor in which low-temperature polysilicon is used. The same can be said for a case of a still image for the reason that decrease in rate (increase in writing interval) causes decrease in voltage of a pixel and a defect of display. In contrast, in the case where the transistor including the above-described oxide semiconductor layer is used, the amount of off-state current is small; thus, the holding period of one signal writing can be approximately 1600 seconds, that is, $10^5$ times as long as that of the transistor including low-temperature polysilicon.

As described above, the display device of this embodiment is capable of performing display of a still image with a small number of times image signals are written. A long holding period allows the frequency of signal writing to be reduced especially in the case of performing display of a still image. Thus, a reduction in power consumption can be achieved. For example, the number of times of writing into a pixel during one still-image display period can be one or n. Note that n is greater than or equal to 2 and less than or equal to $10^3$. Thus, a reduction in power consumption of the display device can be achieved.

Moreover, in this embodiment, a driver circuit portion is operated so that output of a signal supplied to a signal line or a scan line is stopped in performing display of a still image, whereby power consumed by the driver circuit as well as the pixel portion can be suppressed.

Figure 3:
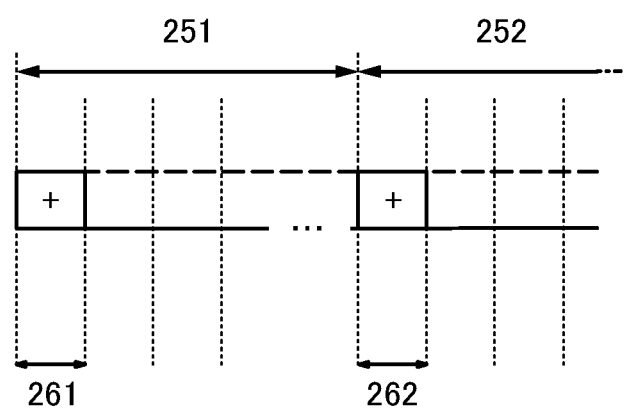
FIG. 3 shows a period of writing to a pixel and a retention period according to Embodiment.

FIG. 3 shows relation between a writing period and a holding period (also referred to as one frame period). In FIG. 3, periods 251 and 252 correspond to holding periods and periods 261 and 262 correspond to writing periods. The thin film transistor including the above highly-purified oxide semiconductor layer can have a long holding period (the period 251 and the period 252); thus, the frequency of signal writing can be significantly decreased especially in the case of performing display of a still image. Thus, in display of a still image, which needs a small number of display switching, the number of writing of a signal to a pixel can be reduced, which results in a reduction in power consumption.

Note that voltage applied to a gate of a driving transistor connected to an EL element attenuates while a still image is displayed; thus, refresh operation may be performed as appropriate in consideration of the proportion of stored voltage applied to the gate of the driving transistor. For example, refresh operation may be performed when voltage is dropped to a predetermined level from the value (the initial value) of voltage immediately after a signal is written to the gate of the driving transistor. The predetermined level of voltage is preferably set to a level at which flicker is not detected from the initial value. Specifically, in the case of an image is an object to be displayed, refresh operation (rewriting) is preferably performed every time the voltage reaches a value lower than the initial value by 1.0%, preferably 0.3%. In the case of characters are objects to be displayed, refresh operation (rewriting) is preferably performed every time the voltage reaches a value lower than the initial value by 10%, preferably 3%.

Figure 4A:
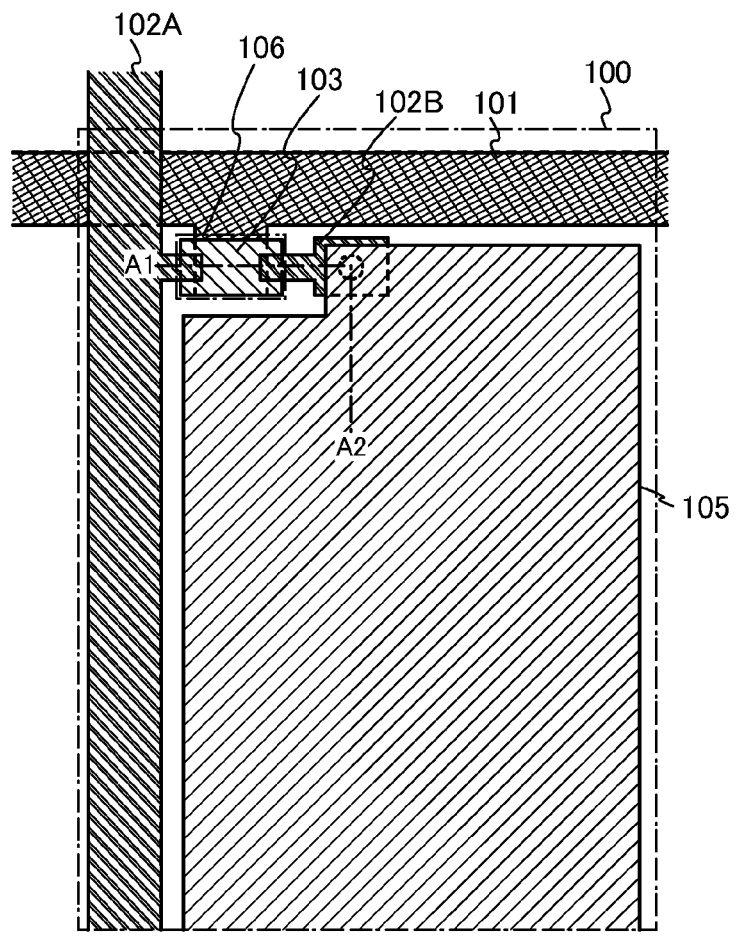
FIG. 4A is a top view of a pixel according to Embodiment and FIG. 4B is a cross-sectional view thereof.
Figure 4B:
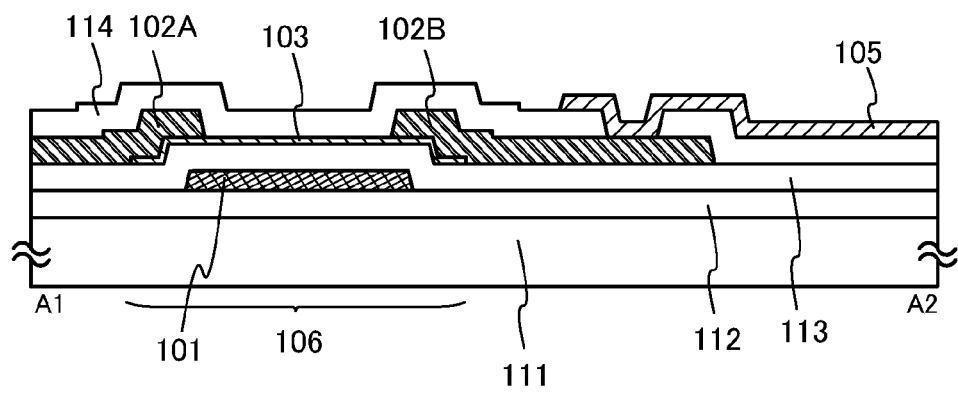

FIG. 4A is a top view of a configuration of a pixel in the case where a storage capacitor is not formed and FIG. 4B is a cross-sectional view thereof. The configuration illustrated in FIGS. 4A and 4B correspond to views in which the capacitor line in FIGS. 1A and 1B is omitted. As is clear from the top view of FIG. 4A and the cross-sectional view of FIG. 4B, an area occupied by the pixel electrode 105 can be increased, that is, the aperture ratio can be increased by using a thin film transistor including an oxide semiconductor layer. In addition, as is clear from the cross-sectional view of FIG. 4B, by using the thin film transistor including an oxide semiconductor layer, the capacitor lines can be reduced, which leads to an increase in the area occupied by the pixel electrode 105, that is, an increase in aperture ratio.

As in this embodiment, a thin film transistor in which a highly-purified oxide semiconductor layer is used and which has an extremely small off-state current value is used in a pixel portion, whereby a display device that is capable of displaying an image (especially a moving image) even without provision of a storage capacitor in the pixel portion. In addition, even in the case of providing a storage capacitor, a period for holding voltage in the storage capacitor can be increased; thus, a display device the power consumption of which in displaying a still image or the like is reduced can be provided. Furthermore, by an increase in aperture ratio, a display device including a high-resolution display portion can be provided.

This embodiment can be implemented in combination with any of the structures of the other embodiments as appropriate.

Embodiment 2

In this embodiment, an example of a thin film transistor that can be applied to the display device disclosed in this specification will be described. A thin film transistor 410 described in this embodiment can be used as the thin film transistor 106 in Embodiment 1.

An embodiment of a thin film transistor of this embodiment and an embodiment of a method for manufacturing the thin film transistor will be described with reference to FIGS. 5A and 5B and FIGS. 6A to 6E.

Figure 5A:
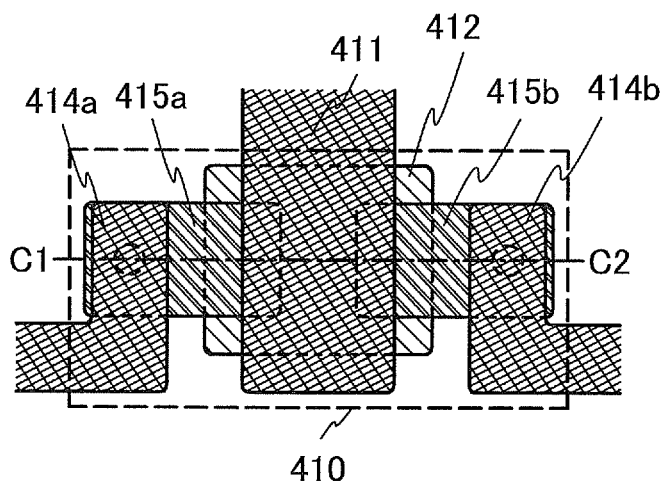
FIG. 5A is a top view of a thin film transistor according to Embodiment and FIG. 5B is a cross-sectional view thereof.
Figure 5B:
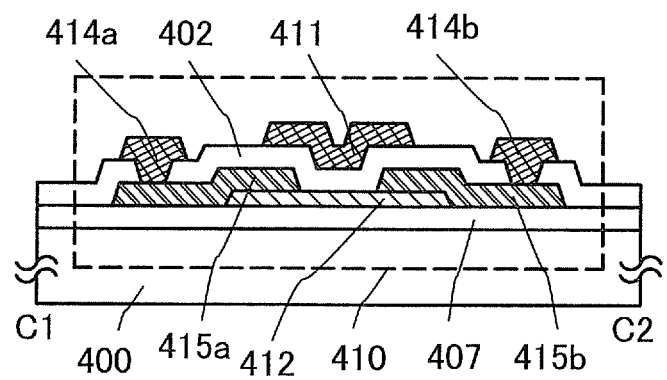

FIG. 5A illustrates an example of a top surface structure of a thin film transistor and FIG. 5B illustrates an example of a cross-sectional structure thereof. The thin film transistor 410 illustrated in FIGS. 5A and 5B is a top-gate thin film transistor.

FIG. 5A is a top view of the top-gate thin film transistor 410 and FIG. 5B is a cross-sectional view taken along line C1-C2 in FIG. 5A.

The thin film transistor 410 includes, over a substrate 400 having an insulating surface, an insulating layer 407, an oxide semiconductor layer 412, a source or drain electrode layer 415a, a source or drain electrode layer 415b, a gate insulating layer 402, and a gate electrode layer 411. A wiring layer 414a and a wiring layer 414b are provided in contact with the source or drain electrode layer 415a and the source or drain electrode layer 415b, respectively, so that they are electrically connected to each other.

Although the thin film transistor 410 is described as a single-gate thin film transistor, a multi-gate thin film transistor including a plurality of channel formation regions can be formed when needed.

A process of manufacturing the thin film transistor 410 over the substrate 400 will be described below with reference to FIGS. 6A to 6E.

Although there is no particular limitation on a substrate which can be used as the substrate 400 having an insulating surface, it is necessary that the substrate at least have heat resistance high enough to withstand heat treatment performed later. A glass substrate formed of barium borosilicate glass, alumino-borosilicate glass, or the like can be used In the case where a glass substrate is used and the temperature of heat treatment performed later is high, a glass substrate whose strain point is higher than or equal to 730° C. is preferably used as the glass substrate. As a glass substrate, a glass material such as aluminosilicate glass, aluminoborosilicate glass, or barium borosilicate glass is used, for example. Note that in the case where a larger amount of barium oxide (BaO) than boron oxide is contained, a more practical heat-resistant glass substrate can be obtained. Thus, a glass substrate containing a larger amount of BaO than $B_2O_3$ is preferably used.

Note that a substrate formed of an insulator such as a ceramic substrate, a quartz substrate, or a sapphire substrate may be used instead of the above glass substrate. Crystallized glass or the like may be used. A plastic substrate or the like can be used as appropriate.

First, the insulating layer 407 which serves as a base film is formed over the substrate 400 having an insulating surface. As the insulating layer 407 which is to be in contact with the oxide semiconductor layer, an oxide insulating layer such as a silicon oxide layer, a silicon oxynitride layer, an aluminum oxide layer, or an aluminum oxynitride layer is preferably used. Although a plasma CVD method, a sputtering method, or the like can be used as a formation method of the insulating layer 407, a sputtering method is preferably used so that a large amount of hydrogen is prevented from being contained in the insulating layer 407.

In this embodiment, as the insulating layer 407, a silicon oxide layer is formed over the substrate 400 by a sputtering method in such a manner that the substrate 400 is transferred to a treatment chamber, a sputtering gas from which hydrogen and moisture are removed and which contains high-purity oxygen is introduced thereto, and a silicon semiconductor target is used. The temperature of the substrate 400 may be room temperature or the substrate 400 may be heated.

For example, the silicon oxide film is formed by an RF sputtering method in an atmosphere containing oxygen and argon (flow rate of oxygen of 25 sccm:flow rate of argon of 25 sccm=1:1) under the following conditions: the substrate temperature is 108° C., the distance between the substrate and the target (T-S distance) is 60 mm, the pressure is 0.4 Pa, and the high-frequency power is 1.5 kW. The thickness is 100 nm. Note that as a target for forming the silicon oxide film, a silicon target can be used instead of quartz (preferably synthetic quartz). Note that oxygen or a mixed gas of oxygen and argon is used as a sputtering gas.

In that case, the insulating layer 407 is preferably formed while moisture remaining in the treatment chamber is removed so that hydrogen, a hydroxyl group, or moisture is prevented from being contained in the insulating layer 407.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$), a compound containing a carbon atom, and the like are removed, whereby the concentration of an impurity in the insulating layer 407 formed in the treatment chamber can be reduced.

As a sputtering gas used for forming the insulating layer 407, a high-purity gas is preferably used in which impurities such as hydrogen, water, a hydroxyl group, or hydride are reduced to such a level that the impurity concentration is represented by the unit "ppm" or "ppb".

Examples of a sputtering method include an RF sputtering method in which a high-frequency power source is used for a sputtering power supply, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, or a sputtering apparatus used for an ECR sputtering method in which plasma generated with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

The insulating layer 407 may have a stacked-layer structure. For example, the insulating layer 407 may have a structure in which a nitride insulating layer such as a silicon nitride layer, a silicon nitride oxide layer, an aluminum nitride layer, or an aluminum nitride oxide layer and the above oxide insulating layer are stacked over the substrate 400.

For example, a silicon nitride layer is formed in such a manner that a sputtering gas from which hydrogen and moisture are removed and which contains high-purity nitrogen is introduced between the silicon oxide layer and the substrate and a silicon target is used. Also in that case, in a manner similar to that of the silicon oxide layer, the silicon nitride layer is preferably formed while moisture remaining in a treatment chamber is removed.

Also in the case of forming the silicon nitride layer, the substrate may be heated at the time of film formation.

In the case where the silicon nitride layer and the silicon oxide layer are stacked as the insulating layer 407, the silicon nitride layer and the silicon oxide layer can be formed in the same treatment chamber using the same silicon target. First, the silicon nitride layer is formed in such a manner that a gas containing nitrogen is introduced and a silicon target provided in the treatment chamber is used. Then, the silicon oxide layer is formed in such a manner that the gas is switched to a gas containing oxygen and the silicon target used for the silicon nitride layer is used. The silicon nitride layer and the silicon oxide layer can be formed successively without being exposed to air; thus, impurities such as hydrogen or moisture can be prevented from being attached to the surface of the silicon nitride layer.

Then, an oxide semiconductor film is formed to a thickness of greater than or equal to 2 nm and less than or equal to 200 nm over the insulating layer 407.

In order to prevent hydrogen, a hydroxyl group, and moisture from being contained in the oxide semiconductor film as much as possible, it is preferable that as pretreatment of the film formation, the substrate 400 over which the insulating layer 407 is formed is preheated in a preheating chamber of a sputtering apparatus so that impurities such as hydrogen and moisture attached to the substrate 400 can be eliminated and removed. As an evacuation unit provided for the preheating chamber, a cryopump is preferably used. This preheating step can be omitted. This preheating step may be performed on the substrate 400 over which the gate insulating layer 402 has not been formed yet. This preheating step may be performed in a similar manner on the substrate 400 over which components up to and including the source or drain electrode layer 415*a* and the source or drain electrode layer 415*b* are formed.

Note that before the oxide semiconductor film is formed by a sputtering method, dust attached to the surface of the insulating layer 407 is preferably removed by reverse sputtering in which plasma is generated by introduction of an argon gas. The reverse sputtering is a method in which voltage is applied to a substrate side, not to a target side, using a high-frequency power source in an argon atmosphere and plasma is generated in the vicinity of the substrate so that a substrate surface is modified. Note that a nitrogen atmosphere, a helium atmosphere, an oxygen atmosphere, or the like may be used instead of an argon atmosphere.

The oxide semiconductor film is formed by a sputtering method. The following can be used as the oxide semiconductor film: an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, an In—Sn—O-based oxide semiconductor film, an Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film is formed using an In—Ga—Zn—O-based oxide semiconductor target for film formation by a sputtering method. The oxide semiconductor film can be formed by a sputtering method in a rare gas (typically, argon) atmosphere, an oxygen atmosphere, or an atmosphere including a rare gas (typically, argon) and oxygen. In the case of using a sputtering method, the oxide semiconductor film may be formed using a target containing $SiO_2$ at greater than or equal to 2 wt % and less than or equal to 10 wt %.

As the sputtering gas used for forming the oxide semiconductor film, a high-purity gas is preferably used in which impurities such as hydrogen, water, a hydroxyl group, or hydride are reduced to such a level that the impurity concentration is represented by the unit "ppm" or "ppb".

As the target for forming the oxide semiconductor film by a sputtering method, a metal oxide target containing zinc oxide as a main component can be used. As another example of the metal oxide target, an oxide semiconductor target for film formation containing In, Ga, and Zn (the composition ratio: $In_2O_3:Ga_2O_3:ZnO=1:1:1$ (mol ratio), In:Ga:Zn=1:1:0.5 (atomic ratio)) can be used. As the oxide semiconductor target for film formation containing In, Ga, and Zn, a target having a composition ratio of In:Ga:Zn=1:1:1 (atomic ratio) or In:Ga:Zn=1:1:2 (atomic ratio) can be used. In addition, the filling factor of the oxide semiconductor target for film formation is greater than or equal to 90% and less than or equal to 100%, preferably greater than or equal to 95% and less than or equal to 99.9%. An oxide semiconductor film which is formed using an oxide semiconductor target for film formation of, which has a high filling factor, is dense.

The oxide semiconductor film is formed over the substrate 400 in such a manner that the substrate is held in a treatment chamber maintained at reduced pressure, a sputtering gas from which hydrogen and moisture are removed is introduced while moisture remaining in the treatment chamber is removed, and metal oxide is used as a target. In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$) (preferably also a compound containing a carbon atom), and the like are removed, whereby the concentration of an impurity in the oxide semiconductor film formed in the treatment chamber can be reduced. The substrate may be heated at the time of the formation of the oxide semiconductor film.

As an example of the deposition condition, the substrate temperature is room temperature, the distance between the substrate and the target is 110 mm, the pressure is 0.4 Pa, the direct-current (DC) power is 0.5 kW, and the atmosphere is an atmosphere containing oxygen and argon (flow rate of oxygen of 15 sccm: flow rate of argon of 30 sccm). Note that a pulsed direct-current (DC) power source is preferably used, in which case powder substances (also referred to as particles or dust) that are formed in deposition can be reduced and the film thickness can be uniform. The oxide semiconductor film preferably has a thickness of greater than or equal to 5 nm and less than or equal to 30 nm. Note that the appropriate thickness differs depending on an oxide semiconductor material, and the thickness may be set as appropriate depending on the material.

Figure 6A:
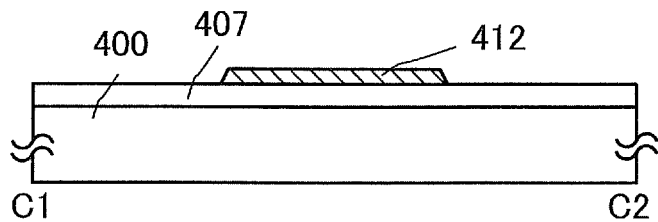
FIGS. 6A to 6E illustrate manufacturing steps of a thin film transistor according to Embodiment.

Next, the oxide semiconductor film is processed into an island-shaped oxide semiconductor layer 412 in a first photolithography step (see FIG. 6A). Further, a resist mask for forming the island-shaped oxide semiconductor layer 412 may be formed by an ink jet method. Formation of the resist mask by an inkjet method needs no photomask, which results in a reduction in manufacturing costs.

Note that the etching of the oxide semiconductor film here may be performed by dry etching, wet etching, or both wet etching and dry etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride (NF$_3$), or trifluoromethane (CHF$_3$)); hydrogen bromide (HBr); oxygen (O$_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, an ammonia hydrogen peroxide mixture (hydrogen peroxide solution of 31 weight %:ammonia solution of 28 weight %:water=5:2:2), or the like can be used. Alternatively, ITO07N (produced by KANTO CHEMICAL CO., INC.) may be used.

The etchant after the wet etching is removed together with the etched materials by cleaning. The waste liquid containing the etchant and the material etched off may be purified and the material may be reused. When a material such as indium contained in the oxide semiconductor layer is collected from the waste liquid after the etching and reused, the resources can be efficiently used and the cost can be reduced.

The etching conditions (such as an etchant, etching time, and temperature) are adjusted as appropriate depending on the material so that the oxide semiconductor film can be etched into a desired shape.

In this embodiment, the oxide semiconductor film is processed into the island-shaped oxide semiconductor layer 412 by wet etching using a mixed solution of phosphoric acid, acetic acid, and nitric acid as an etchant.

In this embodiment, first heat treatment is performed on the oxide semiconductor layer 412. The temperature of the first heat treatment is higher than or equal to 400° C. and lower than or equal to 750° C., preferably higher than or equal to 400° C. and lower than the strain point of the substrate. Here, the substrate is put in an electric furnace that is a kind of heat treatment apparatus and heat treatment is performed on the oxide semiconductor layer in a nitrogen atmosphere at 450° C. for one hour, and then water and hydrogen are prevented from entering the oxide semiconductor layer with the oxide semiconductor layer not exposed to air. In the above manner, the oxide semiconductor layer is obtained. This first heat treatment makes it possible to dehydrate or dehydrogenate the oxide semiconductor layer 412.

The heat treatment apparatus is not limited to an electric furnace and may be provided with a device that heats an object to be processed by thermal conduction or thermal radiation from a heater such as a resistance heater or the like. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with a process object by heat treatment, such as nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment in a short time.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Further, the oxide semiconductor layer may be crystallized to be a microcrystalline film or a polycrystalline film depending on a condition of the first heat treatment or a material of the oxide semiconductor layer. For example, the oxide semiconductor layer may be crystallized to be a microcrystalline semiconductor film having a degree of crystallization of 90% or more, or 80% or more. Further, depending on the condition of the first heat treatment and the material of the oxide semiconductor layer, the oxide semiconductor layer may be an amorphous oxide semiconductor film containing no crystalline component. The oxide semiconductor layer may become an oxide semiconductor film in which a microcrystalline portion (with a grain diameter greater than or equal to 1 nm and greater than or less than 20 nm, typically greater than or equal to 2 nm and greater than or less than 4 nm) is mixed into an amorphous oxide semiconductor.

The first heat treatment for the oxide semiconductor layer can be performed before the oxide semiconductor film is processed into the island-shaped oxide semiconductor layers. In that case, the substrate is taken out from the heat apparatus after the first heat treatment, and then a photolithography step is performed.

The heat treatment which has an effect of dehydrating or dehydrogenating the oxide semiconductor layer may be performed at any of the following timings: after the oxide semiconductor layer is formed; after the source electrode and the drain electrode are formed over the oxide semiconductor layer; and after the gate insulating film is formed over the source electrode and the drain electrode.

Next, a conductive film is formed over the insulating layer 407 and the oxide semiconductor layer 412. The conductive film may be formed by a sputtering method or a vacuum evaporation method. As examples of a material of the metal conductive film, an element selected from Al, Cr, Cu, Ta, Ti, Mo, or W; an alloy containing any of these elements as a component; an alloy film containing any of these elements in combination; and the like can be given. Alternatively, one or more materials selected from manganese, magnesium, zirconium, beryllium, and thorium may be used. Further, the conductive film may have a single-layer structure or a stacked-layer structure including two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

Figure 6B:
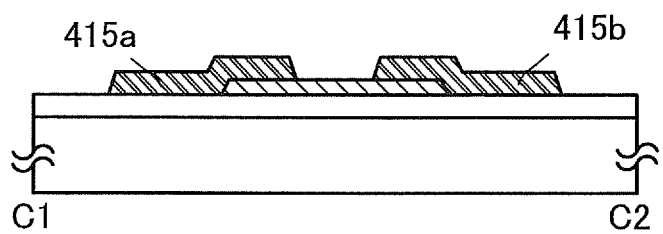

In a second photolithography step, a resist mask is formed over the conductive film and the conductive film is selectively etched so that the source or drain electrode layer 415a and the source or drain electrode layer 415b are formed, and then the resist mask is removed (see FIG. 6B). Note that edges of the formed source electrode layer and the drain electrode layer are preferably in a tapered shape, in which case a gate insulating layer which is to be stacked over the source and drain electrode layers can cover the source and drain electrode layers more adequately.

In this embodiment, as the source or drain electrode layer 415a and the source or drain electrode layer 415b, a titanium film with a thickness of 150 nm is formed by a sputtering method.

Note that in order to prevent the oxide semiconductor layer 412 from being removed and the insulating layer 407 thereunder from being exposed in the etching of the conductive film, materials and etching conditions of the conductive film and the oxide semiconductor layer 412 are adjusted as appropriate.

In this embodiment, a Ti film is used as the conductive film, an In—Ga—Zn—O-based oxide semiconductor is used for the oxide semiconductor layer 412, and an ammonia hydrogen peroxide solution (a mixture of ammonia, water, and a hydrogen peroxide solution) is used as an etchant.

Note that, in the second photolithography step, only part of the oxide semiconductor layer 412 is etched to form an oxide semiconductor layer having a groove (a depressed portion) in some cases. In addition, the resist mask for forming the source or drain electrode layer 415a and the source or drain electrode layer 415b may be formed by an ink-jet method. Formation of the resist mask by an inkjet method needs no photomask, which results in a reduction in manufacturing costs.

Ultraviolet light, KrF laser light, or ArF laser light is used for light exposure for forming the resist mask in the second photolithography step. Channel length L of a thin film transistor to be completed later is determined by a distance between bottom ends of the source electrode layer and the drain electrode layer, which are adjacent to each other over the oxide semiconductor layer 412. Note that in the case where light exposure is performed so that the channel length L becomes less than 25 nm, light exposure for forming the resist mask in the second photolithography step is performed using extreme ultraviolet with an extremely short wavelength of several nanometers to several tens of nanometers. Light exposure using extreme ultraviolet enables high resolution and deep depth of focus. Thus, the channel length L of the thin film transistor to be completed later can be greater than or equal to 10 nm and less than or equal to 1000 nm and the operation speed of a circuit can be increased, and furthermore the value of off-state current is extremely small, which leads to lower power consumption.

Figure 6C:
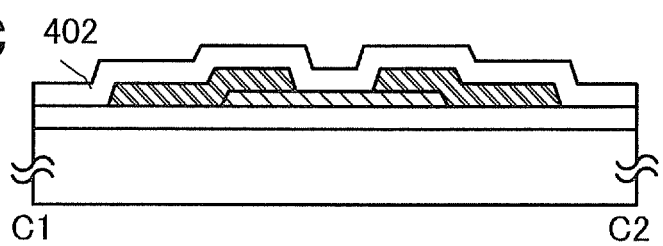

Next, the gate insulating layer 402 is formed over the insulating layer 407, the oxide semiconductor layer 412, the source or drain electrode layer 415a, the source or drain electrode layer 415b (see FIG. 6C).

Here, the oxide semiconductor that is made to be an intrinsic oxide semiconductor or a substantially intrinsic oxide semiconductor (the oxide semiconductor that is highly purified) by removal of impurities is extremely sensitive to an interface state and an interface electric charge; thus, an interface between the oxide semiconductor and the gate insulating film is important. Therefore, the gate insulating film (GI) that is in contact with the highly-purified oxide semiconductor needs to have higher quality.

For example, a high-density plasma CVD using a microwave (2.45 GHz) is preferably used, in which case an insulating film which is dense, has high withstand voltage, and has high quality can be formed. The highly-purified oxide semiconductor and the high-quality gate insulating film are in close contact with each other, whereby the interface state density can be reduced to obtain favorable interface characteristics.

In addition, since the insulating film formed using the high-density plasma CVD apparatus can have a uniform thickness, the insulating film has excellent step coverage. In addition, as for the insulating film formed using the high-density plasma CVD apparatus, the thickness of a thin film can be controlled precisely.

Needless to say, another film formation method such as a sputtering method or a plasma CVD method can be employed as long as the method enables formation of a good-quality insulating film as a gate insulating film. Further, an insulating film whose film quality and characteristic of an interface between the insulating film and an oxide semiconductor are improved by heat treatment which is performed after formation of the insulating film may be formed as a gate insulating film. In any case, any insulating film may be used as long as the insulating film has characteristics of enabling reduction in interface state density of an interface between the insulating film and an oxide semiconductor and formation of a favorable interface as well as having favorable film quality as a gate insulating film.

Further, when an oxide semiconductor containing impurities is subjected to a gate bias-temperature stress test (BT test) for 12 hours under conditions that the temperature is 85° C. and the voltage applied to the gate is $2 \times 10^6$ V/cm, a bond between the impurity and a main component of the oxide semiconductor is cleaved by a high electric field (B: bias) and a high temperature (T: temperature), and a generated dangling bond induces drift of threshold voltage ($V_{th}$). In contrast, the present invention makes it possible to obtain a thin film transistor which is stable to a BT test by removal of impurities in an oxide semiconductor, especially hydrogen, water, and the like as much as possible to obtain a favorable characteristic of an interface between the oxide semiconductor film and a gate insulating film as described above.

The gate insulating layer can be formed to have a single-layer structure or a stacked-layer structure including a silicon oxide layer, a silicon nitride layer, a silicon oxynitride layer, a silicon nitride oxide layer, and/or an aluminum oxide layer.

The gate insulating layer is formed with a high-density plasma CVD apparatus. Here, a high-density plasma CVD apparatus refers to an apparatus which can realize a plasma density higher than or equal to $1 \times 10^{11}$/cm$^3$. For example, plasma is generated by applying a microwave power higher than or equal to 3 kW and lower than or equal to 6 kW so that the insulating film is formed.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that an insulating film is formed over a substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure has small thickness and corresponds to an insulating film whose reliability can be ensured even though it has a thickness less than 100 nm, for example.

The flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

The insulating film formed through the above process procedure is greatly different from the insulating film formed using a conventional parallel plate plasma CVD apparatus. The etching rate of the insulating film formed through the above process procedure is lower than that of the insulating film formed using the conventional parallel plate plasma CVD apparatus by 10% or more or 20% or more in the case where the etching rates with the same etchant are compared to each other. Thus, it can be said that the insulating film formed using the high-density plasma CVD apparatus is a dense film.

In this embodiment, a silicon oxynitride film (also referred to as $SiO_xN_y$, where x>y>0) with a thickness of 100 nm is used as the gate insulating layer 402. The gate insulating layer 402 is formed in such a manner that monosilane ($SiH_4$), nitrous oxide ($N_2O$), and argon (Ar) are used as film formation gases at flow rate of $SiH_4/N_2O/Ar=250/2500/2500$ (sccm) in a high-density plasma CVD apparatus, and plasma is generated by applying a microwave power of 5 kW at a film formation pressure of 30 Pa and a film formation temperature of 325° C.

Alternatively, the gate insulating layer 402 may be formed by a sputtering method. In the case where a silicon oxide film is formed by a sputtering method, a silicon target or a quartz target is used as a target, and oxygen or a mixed gas of oxygen and argon is used as a sputtering gas. The use of a sputtering method makes it possible to prevent a large amount of hydrogen from being contained in the gate insulating layer 402.

The gate insulating layer 402 can have a structure in which a silicon oxide layer and a silicon nitride layer are stacked over the source or drain electrode layer 415a and the source or drain electrode layer 415b. For example, a silicon oxide layer ($SiO_x$ (x>j)) with a thickness of greater than or equal to 5 nm and less than or equal to 300 nm may be formed as a first gate insulating layer, and a silicon nitride layer ($SiN_y$ (y>0) with a thickness of greater than or equal to 50 nm and less than or equal to 200 nm may be stacked as a second gate insulating layer over the first gate insulating layer by a sputtering method. For example, the silicon oxide layer with a thickness of 100 nm can be formed by an RF sputtering method in an atmosphere containing oxygen and argon (flow rate of oxygen of 25 sccm: flow rate of argon of 25 sccm=1:1) under conditions that the pressure is 0.4 Pa and the high-frequency power is 1.5 kW.

Figure 6D:
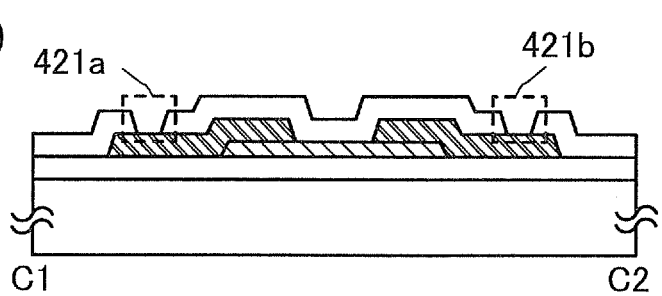

Next, a resist mask is formed in a third photolithography step, the gate insulating layer 402 is selectively etched so that parts of the gate insulating layer 402 are removed, whereby openings 421a and 421b reaching the source or drain electrode layer 415a and the source or drain electrode layer 415b, respectively, are formed (see FIG. 6D).

Next, a conductive film is formed over the gate insulating layer 402 and in and over the openings 421a and 421b, and then the gate electrode layer 411 and the wirings layers 414a and 414b are formed in a fourth photolithography step. Note that a resist mask may be formed by an inkjet method. Formation of the resist mask by an inkjet method needs no photomask, which results in a reduction in manufacturing costs.

The gate electrode layer 411 and the wiring layers 414a and 414b can be formed to have a single-layer or stacked-layer structure including a metal material such as molybdenum, titanium, chromium, tantalum, tungsten, aluminum, copper, neodymium, or scandium, or an alloy material which contains any of these materials as its main component.

For example, as a two-layer structure of the gate electrode layer 411, and the wiring layers 414a and 414b, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer is preferable. Note that the gate electrode layer can also be formed using a light-transmitting conductive film. As an example of a material of the light-transmitting conductive film, a light-transmitting conductive oxide or the like can be given.

In this embodiment, a titanium film with a thickness of 150 nm is formed by a sputtering method as the gate electrode layer 411 and the wiring layers 414a and 414b.

Next, second heat treatment (preferably at higher than or equal to 200° C. and lower than or equal to 400° C., for example higher than or equal to 250° C. and lower than or equal to 350° C.) is performed in an inert gas atmosphere or an oxygen gas atmosphere. In this embodiment, the second heat treatment is performed at 250° C. in a nitrogen atmosphere for one hour. Alternatively, the second heat treatment may be performed after a protective insulating layer or a planarization insulating layer is formed over the thin film transistor 410.

Furthermore, heat treatment may be performed at 100° C. to 200° C. for 1 hour to 30 hours in an air atmosphere. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Alternatively, this heat treatment may be performed before formation of the oxide insulating layer under reduced pressure. When the heat treatment is performed under reduced pressure, the heat treatment time can be shortened.

Figure 6E:
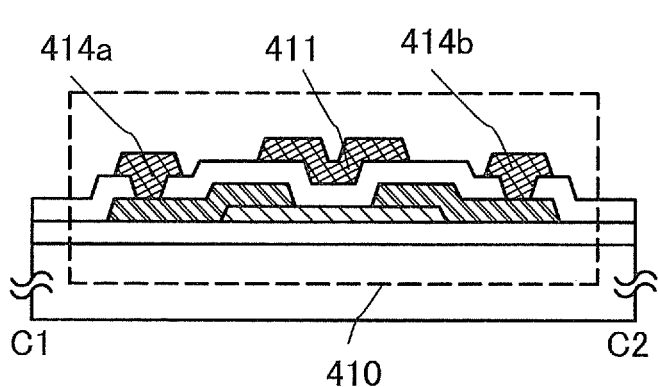

Through the above-described steps, the thin film transistor 410 including the oxide semiconductor layer 412 in which the concentration of hydrogen, moisture, hydride, and hydroxide are reduced can be manufactured (see FIG. 6E). The thin film transistor 410 can be used as the thin film transistor 106 in Embodiment 1.

Further, a protective insulating layer or a planarization insulating layer for planarization may be provided over the thin film transistor 410. For example, the protective insulating layer can be formed to have a single-layer structure or a stacked-layer structure including a silicon oxide layer, a silicon nitride layer, a silicon oxynitride layer, a silicon nitride oxide layer, and/or an aluminum oxide layer.

The planarization insulating layer can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The planarization insulating layer may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarization insulating layer. The planarization insulating layer can be formed, depending on the material, by a method such as a sputtering method, an SOG method, spin coating, dip coating, spray coating, or a droplet discharge method (such as an inkjet method, screen printing, offset printing, or the like), or a tool (equipment) such as a doctor knife, a roll coater, a curtain coater, or a knife coater.

As described above, in forming the oxide semiconductor film, moisture remaining in the reaction atmosphere is removed, whereby the concentration of hydrogen and hydride in the oxide semiconductor film can be reduced. Thus, stabilization of the oxide semiconductor film can be achieved.

As described above, the highly-purified oxide semiconductor layer is used in the thin film transistor, whereby the thin film transistor with reduced off-state current can be provided. In addition, the thin film transistor with reduced off-state current which is described in this embodiment is applied to a pixel in a display device, whereby a period in which a storage capacitor provided in the pixel can hold voltage can be increased. Thus, a display device which consumes less power in displaying a still image or the like can be provided.

This embodiment can be implemented in combination with any of the structures of the other embodiments as appropriate.

Embodiment 3

In this embodiment, an example of a thin film transistor that can be applied to the display device disclosed in this specification will be described. Note that for portions that are the same as those in Embodiment 2 and portions and steps that are similar to those in Embodiment 2, Embodiment 2 can be referred to, and description thereof is not repeated. In addition, detailed description of the same parts is omitted. A thin film transistor 460 described in this embodiment can be used as the thin film transistor 106 in Embodiment 1.

An embodiment of a thin film transistor of this embodiment and an embodiment of a method for manufacturing the thin film transistor will be described with reference to FIGS. 7A and 7B and FIGS. 8A to 8E.

Figure 7A:
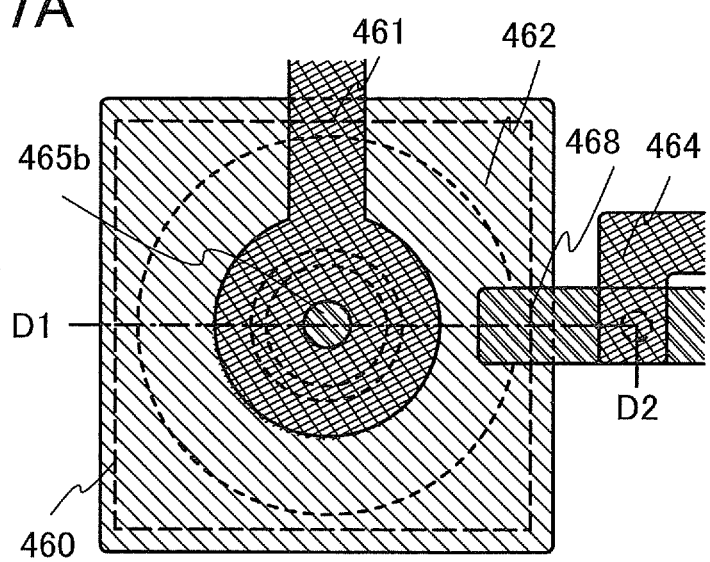
FIG. 7A is a top view of a thin film transistor according to Embodiment and FIG. 7B is a cross-sectional view thereof.
Figure 7B:
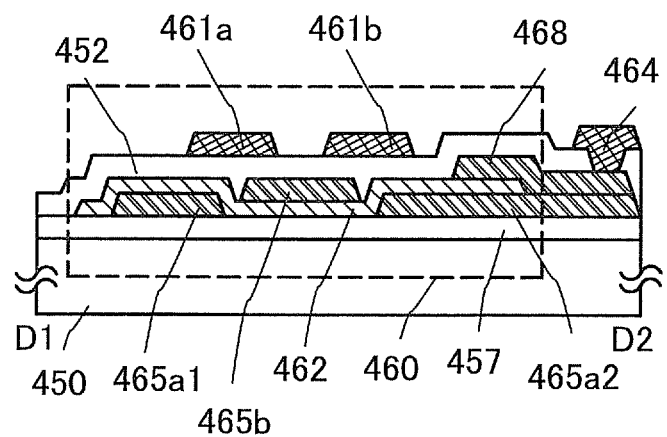

FIG. 7A illustrates an example of a top surface structure of a thin film transistor and FIG. 7B illustrates an example of a cross-sectional structure thereof. The thin film transistor 460 illustrated in FIGS. 7A and 7B is a top-gate thin film transistor.

FIG. 7A is a top view of the top-gate thin film transistor 460 and FIG. 7B is a cross-sectional view taken along line D1-D2 in FIG. 7A.

The thin film transistor 460 includes, over a substrate 450 having an insulating surface, an insulating layer 457, a source or drain electrode layer 465a (465a1 and 465a2), an oxide semiconductor layer 462, a source or drain electrode layer 465b, a wiring layer 468, a gate insulating layer 452, and a gate electrode layer 461 (461a and 461b). The source or drain electrode layer 465a (465a1 and 465a2) is electrically connected to a wiring layer 464 through the wiring layer 468. In addition, although not illustrated, the source or drain electrode layer 465b is also electrically connected to the wiring layer through an opening provided in the gate insulating layer 452.

A process of manufacturing the thin film transistor 460 over the substrate 450 will be described with reference to FIGS. 8A to 8E.

First, the insulating layer 457 which serves as a base film is formed over the substrate 450 having an insulating surface.

In this embodiment, as the insulating layer 457, a silicon oxide layer is formed by a sputtering method. The silicon oxide layer is formed over the substrate 450 in such a manner that the substrate 450 is transferred to a treatment chamber, a sputtering gas from which hydrogen and moisture are removed and which contains high-purity oxygen is introduced thereto, and a silicon target or quartz (preferably synthetic quartz) is used. Note that oxygen or a mixed gas of oxygen and argon is used as a sputtering gas.

For example, the silicon oxide film is formed by an RF sputtering method in an atmosphere containing oxygen and argon (flow rate of oxygen of 25 sccm: flow rate of argon of 25 sccm=1:1) under the following conditions: quartz (preferably synthetic quartz) whose purity is 6N is used, the substrate temperature is 108° C., the distance between the substrate and the target (T-S distance) is 60 mm, the pressure is 0.4 Pa, and the high-frequency power is 1.5 kW. The thickness is 100 nm Note that as a target for forming the silicon oxide film, a silicon target can be used instead of quartz (preferably synthetic quartz).

In that case, the insulating layer 457 is preferably formed while moisture remaining in the treatment chamber is removed so that hydrogen, a hydroxyl group, or moisture is prevented from being contained in the insulating layer 457. In the treatment chamber which is evacuated with the cryopump, a hydrogen atom, a compound containing a hydrogen atom such as water ($H_2O$), a compound containing a carbon atom, and the like are removed, whereby the concentration of an impurity in the insulating layer 457 formed in the treatment chamber can be reduced.

As a sputtering gas used for forming the insulating layer 457, a high-purity gas is preferably used in which impurities such as hydrogen, water, a hydroxyl group, or hydride are reduced to such a level that the impurity concentration is represented by the unit "ppm" or "ppb".

The insulating layer 457 may have a stacked-layer structure. For example, the insulating layer 457 may have a structure in which a nitride insulating layer such as a silicon nitride layer, a silicon nitride oxide layer, an aluminum nitride layer, or an aluminum nitride oxide layer and the above oxide insulating layer are stacked over the substrate 400.

For example, a silicon nitride layer is formed in such a manner that a sputtering gas from which hydrogen and moisture are removed and which contains high-purity nitrogen is introduced between the silicon oxide layer and the substrate and a silicon target is used. Also in that case, in a manner similar to that of the silicon oxide layer, the silicon nitride layer is preferably formed while moisture remaining in the treatment chamber is removed.

Figure 8A:
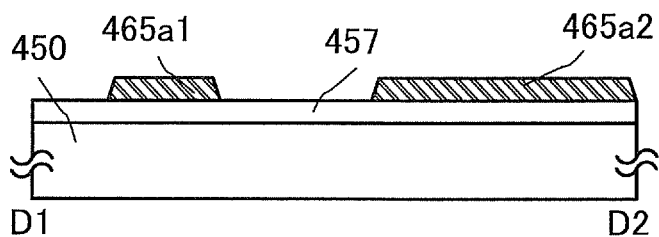
FIGS. 8A to 8E illustrate manufacturing steps of a thin film transistor according to Embodiment.

Next, a conductive film is formed over the insulating layer 457, and in a first photolithography step, a resist mask is formed over the conductive film and the conductive film is selectively etched so that the source and drain electrode layers 465a1 and 465a2 are formed, and then the resist mask is removed (see FIG. 8A). Although the source and drain electrode layers 465a1 and 465a2 are separated in the cross-sectional view, they are a continuous film. Note that edges of the formed source electrode layer and the drain electrode layer are preferably in a tapered shape, in which case a gate insulating layer which is to be stacked over the source and drain electrode layers can cover the source and drain electrode layers more adequately.

As a material of the source and drain electrode layers 465a1 and 465a2, an element selected from Al, Cr, Cu, Ta, Ti, Mo, or W; an alloy containing any of these elements as a component; an alloy film containing any of these elements in combination; and the like can be given. Alternatively, one or more materials selected from manganese, magnesium, zirconium, beryllium, and thorium may be used. Further, the conductive film may have a single-layer structure or a stacked-layer structure including two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

In this embodiment, as the source and drain electrode layers 465a1 and 465a2, a titanium film with a thickness of 150 nm is formed by a sputtering method.

Next, the oxide semiconductor layer 462 with a thickness of greater than or equal to 2 nm and less than or equal to 200 nm is formed.

Figure 8B:
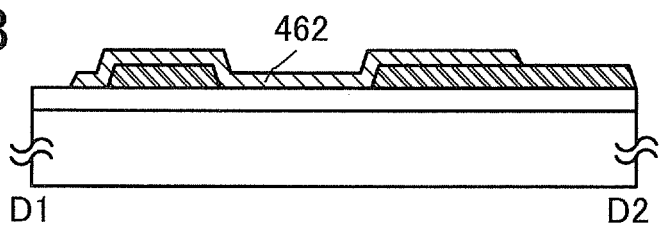

In a second photolithography step, the formed oxide semiconductor film is processed into the island-shaped oxide semiconductor layer 462 (see FIG. 8B). In this embodiment, the oxide semiconductor film is formed by a sputtering method using an In—Ga—Zn—O-based oxide semiconductor target for film formation.

The oxide semiconductor film is formed over the substrate 450 in such a manner that the substrate is held in a treatment chamber maintained at reduced pressure, a sputtering gas from which hydrogen and moisture are removed is introduced while moisture remaining in the treatment chamber is removed, and metal oxide is used as a target. In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as $H_2O$ (preferably also a compound containing a carbon atom), and the like are removed, whereby the concentration of an impurity in the oxide semiconductor film formed in the treatment chamber can be reduced. The substrate may be heated at the time of the formation of the oxide semiconductor film.

As a sputtering gas used for forming the oxide semiconductor film, a high-purity gas is preferably used in which impurities such as hydrogen, water, a hydroxyl group, or hydride are reduced to such a level that the impurity concentration is represented by the unit "ppm" or "ppb".

As an example of the deposition condition, the substrate temperature is room temperature, the distance between the substrate and the target is 110 mm, the pressure is 0.4 Pa, the direct-current (DC) power is 0.5 kW, and the atmosphere is an atmosphere containing oxygen and argon (flow rate of oxygen of 15 sccm: flow rate of argon of 30 sccm). Note that a pulsed direct-current (DC) power source is preferably used, in which case powder substances (also referred to as particles or dust) generated in film formation can be reduced and the film thickness can be uniform. The oxide semiconductor film preferably has a thickness of greater than or equal to 5 nm and less than or equal to 30 nm. Note that the appropriate thickness differs depending on an oxide semiconductor material, and the thickness may be set as appropriate depending on the material.

In this embodiment, the oxide semiconductor film is processed into the island-shaped oxide semiconductor layer 462 by wet etching using a mixed solution of phosphoric acid, acetic acid, and nitric acid as an etchant.

In this embodiment, first heat treatment is performed on the oxide semiconductor layer 462. The temperature of the first heat treatment is higher than or equal to 400° C. and lower than or equal to 750° C., preferably higher than or equal to 400° C. and lower than the strain point of the substrate. Here, the substrate is put in an electric furnace that is a kind of heat treatment apparatus and heat treatment is performed on the oxide semiconductor layer in a nitrogen atmosphere at 450° C. for one hour, and then water and hydrogen are prevented from entering the oxide semiconductor layer with the oxide semiconductor layer not exposed to air. In the above manner, the oxide semiconductor layer is obtained. This first heat treatment makes it possible to dehydrate or dehydrogenate the oxide semiconductor layer 462.

The heat treatment apparatus is not limited to an electric furnace and may be provided with a device that heats an object to be processed by thermal conduction or thermal radiation from a heater such as a resistance heater or the like. For example, an RTA (rapid thermal anneal) apparatus such as a GRTA (gas rapid thermal anneal) apparatus or an LRTA (lamp rapid thermal anneal) apparatus can be used. For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment in a short time.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Further, the oxide semiconductor layer may be crystallized to be a microcrystalline film or a polycrystalline film depending on a condition of the first heat treatment or a material of the oxide semiconductor layer.

The first heat treatment for the oxide semiconductor layer can be performed before the oxide semiconductor film is processed into the island-shaped oxide semiconductor layers. In that case, the substrate is taken out from the heat apparatus after the first heat treatment, and then a photolithography step is performed.

The heat treatment which has an effect of dehydrating or dehydrogenating the oxide semiconductor layer may be performed at any of the following timings: after the oxide semiconductor layer is formed; after the source electrode and the drain electrode are further formed over the oxide semiconductor layer; and after the gate insulating film is formed over the source electrode and the drain electrode.

Figure 8C:
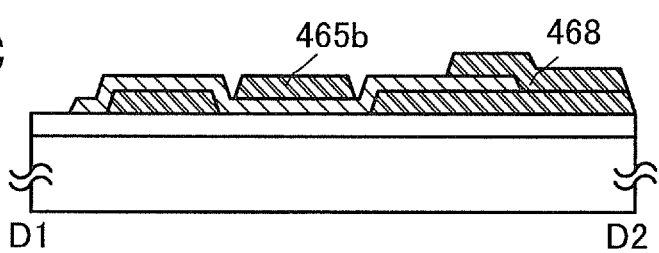

Next, a conductive film is formed over the insulating layer 457 and the oxide semiconductor layer 462, and in a third photolithography step, a resist mask is formed over the conductive film and the conductive film is selectively etched so that the source or drain electrode layer 465b and the wiring layer 468 are formed, and then the resist mask is removed (see FIG. 8C). The source or drain electrode layer 465b and the wiring layer 468 may be formed using a material and in a step which are similar to those of the source and drain electrode layers 465a1 and 465a2.

In this embodiment, as the source or drain electrode layer 465b and the wiring layer 468, a titanium film with a thickness of 150 nm is formed by a sputtering method. In this embodiment, since the example in which the same titanium films are used for the source and drain electrode layers 465a1 and 465a2 and the source or drain electrode layer 465b is described, etching selectivity of the source or drain electrode layer 465a1 or 465a2 with respect to the source or drain electrode layer 465b is not obtained. For that reason, the wiring layer 468 is provided over a part of the source or drain electrode layer 465a2 which is not covered with the oxide semiconductor layer 462 so that the source and drain electrode layers 465a1 and 465a2 are not etched at the time of etching of the source or drain electrode layer 465b. In the case where different materials which have high selectivity in etching steps are used for the source or drain electrode layers 465a1 and 465a2 and the source or drain electrode layer 465b, the wiring layer 468 which protects the source or drain electrode layer 465a2 at the time of etching is not necessarily provided.

Note that in order to prevent the oxide semiconductor layer 462 from being removed at the time of the etching of the conductive film, materials and etching conditions of the conductive film and the oxide semiconductor layer 462 are adjusted as appropriate.

In this embodiment, a Ti film is used as the conductive film, an In—Ga—Zn—O-based oxide semiconductor is used for the oxide semiconductor layer 462, and an ammonia hydrogen peroxide solution (a mixture of ammonia, water, and a hydrogen peroxide solution) is used as an etchant.

In the third photolithography step, only part of the oxide semiconductor layer 462 is etched, whereby an oxide semiconductor layer having a groove (a depressed portion) is formed in some cases. A resist mask used for forming the source or drain electrode layer 465b and the wiring layer 468 may be formed by an inkjet method. Formation of the resist mask by an inkjet method needs no photomask, which results in a reduction in manufacturing costs.

Next, the gate insulating layer 452 is formed over the insulating layer 457, the oxide semiconductor layer 462, the source and drain electrode layers 465a1 and 465a2, and the source or drain electrode layer 465b.

The gate insulating layer 452 can be formed to have a single-layer structure or a stacked-layer structure including a silicon oxide layer, a silicon nitride layer, a silicon oxynitride layer, a silicon nitride oxide layer, and/or an aluminum oxide layer by a plasma CVD method, a sputtering method, or the like. The gate insulating layer 452 is preferably formed by a sputtering method so that a large amount of hydrogen is prevented from being contained in the gate insulating layer 452. In the case where a silicon oxide film is formed by a sputtering method, a silicon target or a quartz target is used as a target, and oxygen or a mixed gas of oxygen and argon is used as a sputtering gas.

The gate insulating layer 452 can have a structure in which a silicon oxide layer and a silicon nitride layer are stacked over the source and drain electrode layers 465a1 and 465a2 and the source or drain electrode layer 465b. In this embodiment, the silicon oxide layer with a thickness of 100 nm is formed by an RF sputtering method in an atmosphere containing oxygen and argon (flow rate of oxygen of 25 sccm: flow rate of argon of 25 sccm=1:1) under conditions that the pressure is 0.4 Pa and the high-frequency power is 1.5 kW.

Figure 8D:
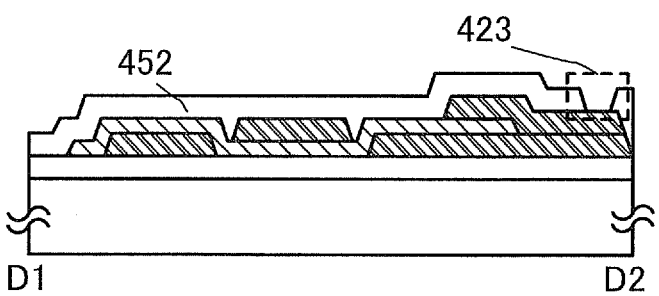

Next, a resist mask is formed in a fourth photolithography step, and the gate insulating layer 452 is selectively etched so that part of the gate insulating layer 452 is removed, whereby an opening 423 reaching the wiring layer 468 is formed (see FIG. 8D). Although not illustrated, an opening reaching the source or drain electrode layer 465b may be formed at the time of the formation of the opening 423. In this embodiment, an example is described in which the opening reaching the source or drain electrode layer 465b is formed after an interlayer insulating layer is further stacked and a wiring layer for electrical connection is formed in the opening.

Next, a conductive film is formed over the gate insulating layer 452 and in and over the opening 423. Then, in a fifth photolithography, the gate electrode layer 461 (461a and 461b) and the wiring layer 464 are formed. Note that a resist mask may be formed by an inkjet method. Formation of the resist mask by an inkjet method needs no photomask, which results in a reduction in manufacturing costs.

The gate electrode layer 461 (461a and 461b) and the wiring layer 464 can be formed to have a single-layer or stacked-layer structure including a metal material such as molybdenum, titanium, chromium, tantalum, tungsten, aluminum, copper, neodymium, or scandium, or an alloy material which contains any of these materials as its main component.

In this embodiment, as the gate electrode layer 461 (461a and 461b) and the wiring layer 464, a titanium film with a thickness of 150 nm is formed by a sputtering method.

Next, second heat treatment (preferably at higher than or equal to 200° C. and lower than or equal to 400° C., for example higher than or equal to 250° C. and lower than or equal to 350° C.) is performed in an inert gas atmosphere or an oxygen gas atmosphere. In this embodiment, the second heat treatment is performed at 250° C. in a nitrogen atmosphere for one hour. Alternatively, the second heat treatment may be performed after a protective insulating layer or a planarization insulating layer is formed over the thin film transistor 410.

Furthermore, heat treatment may be performed at 100° C. to 200° C. for 1 hour to 30 hours in an air atmosphere. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Alternatively, this heat treatment may be performed before formation of the oxide insulating layer under reduced pressure. When the heat treatment is performed under reduced pressure, the heat treatment time can be shortened.

Figure 8E:
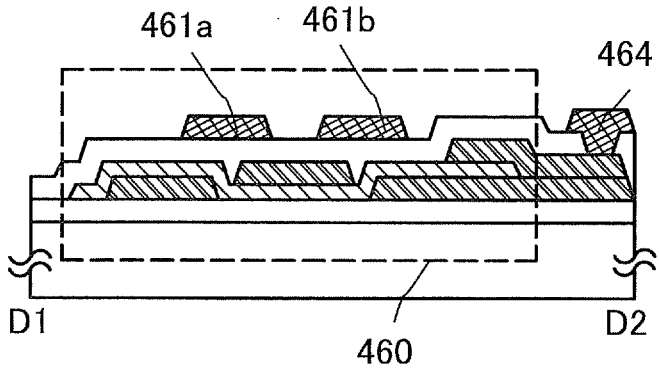

Through the above-described steps, the thin film transistor 460 including the oxide semiconductor layer 462 in which the concentration of hydrogen, moisture, hydride, and hydroxide are reduced can be manufactured (see FIG. 8E). The thin film transistor 460 can be used as a thin film transistor used in each pixel in the pixel portion 202 of Embodiment 1.

A protective insulating layer or a planarization insulating layer for planarization may be provided over the thin film transistor 460. Note that although not illustrated, an opening reaching the source or drain electrode layer 465b is formed in the gate insulating layer 452, the protective insulating layer, or the planarization insulating layer, and a wiring layer which is to be electrically connected to the source or drain electrode layer 465b is formed in the opening.

As described above, in forming the oxide semiconductor film, moisture remaining in the reaction atmosphere is removed, whereby the concentration of hydrogen and hydride in the oxide semiconductor film can be reduced. Thus, stabilization of the oxide semiconductor film can be achieved.

As described above, the highly-purified oxide semiconductor layer is used in the thin film transistor, whereby the thin film transistor with reduced off-state current can be provided. In addition, the thin film transistor with reduced off-state current which is described in this embodiment is applied to a pixel in a display device, whereby a period in which a storage capacitor provided in the pixel can hold voltage can be increased. Thus, a display device which consumes less power in displaying a still image or the like can be provided.

This embodiment can be implemented in combination with any of the structures of the other embodiments as appropriate.

Embodiment 4

In this embodiment, another example of a thin film transistor that can be applied to the display device disclosed in this specification will be described. Note that Embodiment 2 may be referred to for descriptions of portions that are the same as those in Embodiment 2 and portions and steps that are similar to those in Embodiment 2, and description thereof is not repeated. In addition, detailed description of the same parts is omitted. Thin film transistors 425 and 426 described in this embodiment can be used as the thin film transistor 106 in Embodiment 1.

The thin film transistors of this embodiment will be described with reference to FIGS. 9A and 9B.

Figure 9A:
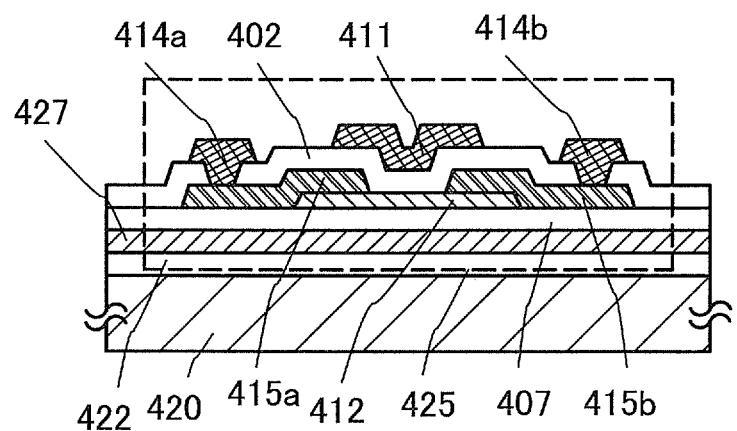
FIGS. 9A and 9B are cross-sectional views of thin film transistors according to Embodiment.
Figure 9B:
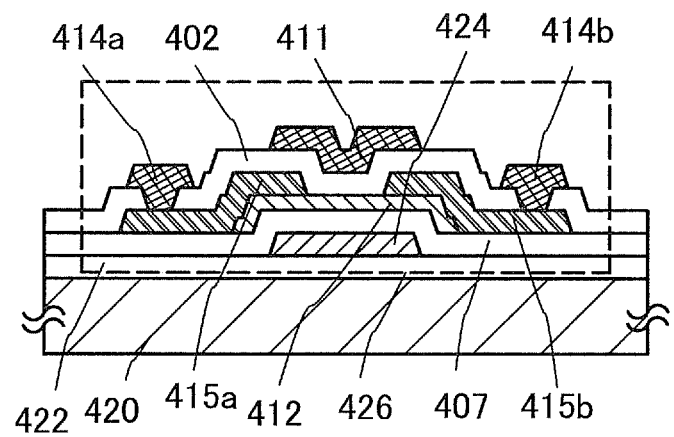

FIGS. 9A and 9B illustrate examples of cross-sectional structures of the thin film transistors. Each of the thin film transistors 425 and 426 illustrated in FIGS. 9A and 9B is a thin film transistor with a structure in which an oxide semiconductor layer is interposed between a conductive layer and a gate electrode layer.

In FIGS. 9A and 9B, a silicon substrate is used as a substrate, and the thin film transistors 425 and 426 are each provided over an insulating layer 422 provided over a silicon substrate 420.

In FIG. 9A, a conductive layer 427 is provided between the insulating layer 422 provided over the silicon substrate 420 and an insulating layer 407 so as to overlap with at least the entire oxide semiconductor layer 412.

Note that FIG. 9B illustrates an example in which a conductive layer between the insulating layer 422 and the insulating layer 407 is processed into a conductive layer 424 by etching and overlaps with part of the oxide semiconductor layer 412, which includes at least a channel region.

The conductive layers 427 and 424 may be formed of a metal material which can withstand the temperature of heat treatment performed later; as such a metal material, an element selected from titanium (Ti), tantalum (Ta), tungsten (W), molybdenum (Mo), chromium (Cr), neodymium (Nd), and scandium (Sc), an alloy containing any of the above elements as a component, an alloy film containing a combination of any of these elements, a nitride containing any of the above elements as its component, or the like can be used. In addition, the conductive layers 427 and 424 may each have a single-layer structure or a stacked-layer structure. For example, a single-layer structure of a tungsten layer, a stacked-layer structure including a tungsten nitride layer and a tungsten layer, or the like can be used.

Further, the potential of the conductive layers 427 and 424 may be the same as or different from that of a gate electrode layer 411 of the thin film transistors 425 and 426. The conductive layers 427 and 424 can also function as a second gate electrode layer. In addition, the potential of the conductive layers 427 and 424 may be fixed potential such as GND or 0 V.

The conductive layers 427 and 424 makes it possible to control the electric characteristics of the thin film transistors 425 and 426, respectively.

As described above, the highly-purified oxide semiconductor layer is used in the thin film transistor, whereby the thin film transistor with reduced off-state current can be provided. In addition, the thin film transistor with reduced off-state current which is described in this embodiment is applied to a pixel in a display device, whereby a period in which a storage capacitor provided in the pixel can hold voltage can be increased. Thus, a display device which consumes less power in displaying a still image or the like can be provided.

This embodiment can be implemented in combination with any of the structures of the other embodiments as appropriate.

Embodiment 5

In this embodiment, another example of a thin film transistor that can be applied to the display device disclosed in this specification will be described. A thin film transistor 390 described in this embodiment can be used as the thin film transistor 106 in Embodiment 1.

FIGS. 10A to 10E illustrate an example of a cross-sectional structure of the thin film transistor of this embodiment. The thin film transistor 390 illustrated in FIGS. 10A to 10E has a bottom-gate structure and is called an inverted staggered thin film transistor.

Although the thin film transistor 390 is described as a single-gate thin film transistor, a multi-gate thin film transistor including a plurality of channel formation regions can be manufactured when needed.

A process of manufacturing the thin film transistor 390 over a substrate 394 will be described below with reference to FIGS. 10A to 10E.

First, a conductive film is formed over the substrate 394 having an insulating surface, and then in a first photolithography step, a gate electrode layer 391 is formed. Edges of the formed gate electrode layer are preferably in a tapered shape, in which case a gate insulating layer which is to be stacked over the source and drain electrode layers can cover the source and drain electrode layers more adequately. Note that a resist mask may be formed by an inkjet method. Formation of the resist mask by an inkjet method needs no photomask, which results in a reduction in manufacturing costs.

Although there is no particular limitation on a substrate which can be used as the substrate 394 having an insulating surface, the substrate needs to have heat resistance high enough to withstand at least heat treatment to be performed later. A glass substrate made of barium borosilicate glass, aluminoborosilicate glass, or the like can be used.

In the case where a glass substrate is used and the temperature of the heat treatment performed later is high, a glass substrate whose strain point is higher than or equal to 730° C. is preferably used. For a glass substrate, a glass material such as aluminosilicate glass, aluminoborosilicate glass, or barium borosilicate glass is used, for example. Note that in the case where a larger amount of barium oxide (BaO) than boron oxide is contained, a more practical heat-resistant glass substrate can be obtained. Thus, a glass substrate containing a larger amount of BaO than $B_2O_3$ is preferably used.

Note that a substrate formed of an insulator such as a ceramic substrate, a quartz substrate, or a sapphire substrate may be used instead of the above glass substrate. Alternatively, crystallized glass or the like may be used. Alternatively, a plastic substrate or the like can be used as appropriate.

An insulating film serving as a base film may be provided between the substrate 394 and the gate electrode layer 391. The base film has a function of preventing diffusion of an impurity element from the substrate 394, and can be formed to have a single-layer structure or a stacked-layer structure including one or more of a silicon nitride film, a silicon oxide film, a silicon nitride oxide film, and a silicon oxynitride film.

The gate electrode layer 391 can be formed to have a single-layer or stacked-layer structure including a metal material such as molybdenum, titanium, chromium, tantalum, tungsten, aluminum, copper, neodymium, or scandium, or an alloy material containing any of these materials as a main component.

For example, as a two-layer structure of the gate electrode layer 391, the following structure is preferable: a structure in which a molybdenum layer is stacked over an aluminum layer, a structure in which a molybdenum layer is stacked over a copper layer, a structure in which a titanium nitride layer or a tantalum nitride layer is stacked over a copper layer, a structure in which a titanium nitride layer and a molybdenum layer are stacked, or a structure in which a tungsten nitride layer and a tungsten layer are stacked. As a three-layer structure, a structure in which a tungsten layer or a tungsten nitride layer, a layer of an alloy of aluminum and silicon or an alloy of aluminum and titanium, and a titanium nitride layer or a titanium layer are stacked is preferable. Note that the gate electrode layer can also be formed using a light-transmitting conductive film. As an example of the light-transmitting conductive film, a light-transmitting conductive oxide or the like can be given.

Next, a gate insulating layer 397 is formed over the gate electrode layer 391.

The gate insulating layer 397 can be formed to have a single-layer structure or a stacked-layer structure including a silicon oxide layer, a silicon nitride layer, a silicon oxynitride layer, a silicon nitride oxide layer, and/or an aluminum oxide layer by a plasma CVD method, a sputtering method, or the like. The gate insulating layer 397 is preferably formed by a sputtering method so that a large amount of hydrogen is prevented from being contained in the insulating layer 397. In the case where a silicon oxide film is formed by a sputtering method, a silicon target or a quartz target is used as a target, and oxygen or a mixed gas of oxygen and argon is used as a sputtering gas.

The gate insulating layer 397 can have a structure in which a silicon nitride layer and a silicon oxide layer are stacked over the gate electrode layer 391. For example, a silicon nitride layer ($SiN_y$ (y>0)) with a thickness of greater than or equal to 50 nm and less than or equal to 200 nm is formed as a first gate insulating layer by a sputtering method and a silicon oxide layer ($SiO_x$ (x>0)) with a thickness of greater than or equal to 5 nm and less than or equal to 300 nm is stacked as a second gate insulating layer over the first gate insulating layer to form a gate insulating layer with a thickness of 100 nm.

In order to prevent hydrogen, a hydroxyl group, and moisture from being contained in the gate insulating layer 397 and an oxide semiconductor film 393 as much as possible, it is preferable that as pretreatment of the film formation, the substrate 394 over which the gate electrode layer 391 is formed is preheated in a preheating chamber of a sputtering apparatus, or the substrate 394 over which components up to and including the gate insulating layer 397 are formed is preheated so that impurities such as hydrogen and moisture attached to the substrate 394 can be eliminated and removed. The temperature of the preheating is higher than or equal to 100° C. and lower than or equal to 400° C., preferably higher than or equal to 150° C. and lower than or equal to 300° C. As an evacuation unit provided for the preheating chamber, a cryopump is preferably used. This preheating step can be omitted. This preheating step may be similarly performed on the substrate 394 over which components up to and including a source electrode layer 395*a* and a drain electrode layer 395*b* are formed before formation of an oxide insulating layer 396.

Figure 10A:
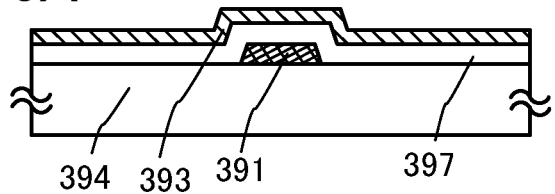
FIGS. 10A to 10E illustrate manufacturing steps of a thin film transistor according to Embodiment.

Next, an oxide semiconductor film 393 is formed to a thickness of greater than or equal to 2 nm and less than or equal to 200 nm over the gate insulating layer 397 (see FIG. 10A).

Note that before the oxide semiconductor film 393 is formed by a sputtering method, dust attached to the surface of the insulating layer 397 is preferably removed by reverse sputtering in which plasma is generated by introduction of an argon gas. The reverse sputtering is a method in which voltage is applied to a substrate side, not to a target side, using an RF power source in an argon atmosphere and plasma is generated in the vicinity of the substrate so that a substrate surface is modified. Note that a nitrogen atmosphere, a helium atmosphere, an oxygen atmosphere, or the like may be used instead of an argon atmosphere.

The oxide semiconductor film 393 is formed by a sputtering method. The following can be used as the oxide semiconductor film 393: an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Sn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 393 is formed using an In—Ga—Zn—O-based oxide semiconductor target for film formation by a sputtering method. The oxide semiconductor film 393 can be formed by a sputtering method in a rare gas (typically, argon) atmosphere, an oxygen atmosphere, or an atmosphere including a rare gas (typically, argon) and oxygen. In the case of using a sputtering method, the oxide semiconductor film may be formed using a target containing $SiO_2$ at greater than or equal to 2 wt % and less than or equal to 10 wt %.

As the target for forming the oxide semiconductor film 393 by a sputtering method, a metal oxide target containing zinc oxide as a main component can be used. As another example of the metal oxide target, an oxide semiconductor target for film formation containing In, Ga, and Zn (the composition ratio: $In_2O_3$:$Ga_2O_3$:ZnO=1:1:1 (mol ratio), In:Ga:Zn=1:1:0.5 (atomic %)) can be used. As the oxide semiconductor target for film formation containing In, Ga, and Zn, a target having a composition ratio of In:Ga:Zn=1:1:1 (atomic ratio) or In:Ga:Zn=1:1:2 (atomic ratio) can be used. In addition, the filling factor of the oxide semiconductor target for film formation is greater than or equal to 90% and less than or equal to 100%, preferably greater than or equal to 95% and less than or equal to 99.9%. An oxide semiconductor film which is formed using an oxide semiconductor target for film formation, which has a high filling factor, is dense.

The oxide semiconductor film 393 is formed over the substrate 394 in such a manner that the substrate is held in a treatment chamber maintained at reduced pressure and is heated to room temperature or lower than 400° C., then a sputtering gas from which hydrogen and moisture are removed is introduced while moisture remaining in the treatment chamber is removed and metal oxide is used as a target. In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as $H_2O$ (preferably also a compound containing a carbon atom), and the like are removed, whereby the concentration of an impurity in the oxide semiconductor film formed in the treatment chamber can be reduced. Sputtering film formation is performed while moisture remaining in the treatment chamber is removed using a cryopump, whereby the substrate temperature in forming the oxide semiconductor film 393 can be room temperature or a temperature of lower than 400° C.

As an example of the deposition condition, the distance between the substrate and the target is 100 mm, the pressure is 0.6 Pa, the direct-current (DC) power is 0.5 kW, and the atmosphere is an oxygen atmosphere (the proportion of oxygen flow: 100%). Note that a pulsed direct-current (DC) power source is preferably used, in which case powder substances (also referred to as particles or dust) generated in film formation can be reduced and the film thickness can be uniform. The oxide semiconductor film preferably has a thickness of greater than or equal to 5 nm and less than or equal to 30 nm Note that the appropriate thickness differs depending on an oxide semiconductor material, and the thickness may be set as appropriate depending on the material.

Examples of a sputtering method include an RF sputtering method in which a high-frequency power source is used for a sputtering power supply, a DC sputtering method in which a DC power source is used, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, or a sputtering apparatus used for an ECR sputtering method in which plasma generated with the use of microwaves is used without using glow discharge.

Furthermore, as a deposition method using a sputtering method, there are also a reactive sputtering method in which a target substance and a sputtering gas component are chemically reacted with each other during deposition to form a thin compound film thereof, and a bias sputtering method in which voltage is also applied to a substrate during deposition.

Figure 10B:
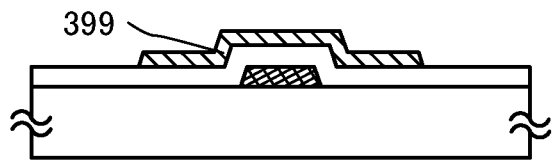

Next, in a second photolithography step, the oxide semiconductor film is processed into an island-shaped oxide semiconductor layer 399 (see FIG. 10B). Note that a resist mask for forming the island-shaped oxide semiconductor layer 399 may be formed by an inkjet method. Formation of the resist mask by an inkjet method needs no photomask, which results in a reduction in manufacturing costs.

In the case where a contact hole is formed in the gate insulating layer 397, the contact hole can be formed at the time of the formation of the oxide semiconductor layer 399.

Note that the etching of the oxide semiconductor film 393 here may be performed by dry etching, wet etching, or both wet etching and dry etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a mixed solution of phosphoric acid, acetic acid, and nitric acid, an ammonia hydrogen peroxide mixture (hydrogen peroxide solution of 31 weight %: ammonia solution of 28 weight %:water=5:2: 2), or the like can be used. Alternatively, ITO07N (produced by KANTO CHEMICAL CO., INC.) may be used.

The etchant after the wet etching is removed together with the etched materials by cleaning. The waste liquid containing the etchant and the material etched off may be purified and the material may be reused. When a material such as indium contained in the oxide semiconductor layer is collected from the waste liquid after the etching and reused, the resources can be efficiently used and the cost can be reduced.

The etching conditions (such as an etchant, etching time, and temperature) are adjusted as appropriate depending on the material so that the oxide semiconductor film can be etched into a desired shape.

Note that before formation of a conductive film in the subsequent step, reverse sputtering is preferably performed so that a resist residue or the like attached to surfaces of the oxide semiconductor layer 399 and the gate insulating layer 397 is removed.

Next, a conductive film is formed over the gate insulating layer 397 and the oxide semiconductor layer 399. The conductive film may be formed by a sputtering method or a vacuum evaporation method. As examples of a material of the metal conductive film, an element selected from Al, Cr, Cu, Ta, Ti, Mo, or W; an alloy containing any of these elements as a component; an alloy film containing any of these elements in combination; and the like can be given. Alternatively, one or more materials selected from manganese, magnesium, zirconium, beryllium, and thorium may be used. Further, the conductive film may have a single-layer structure or a stacked-layer structure including two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

Figure 10C:
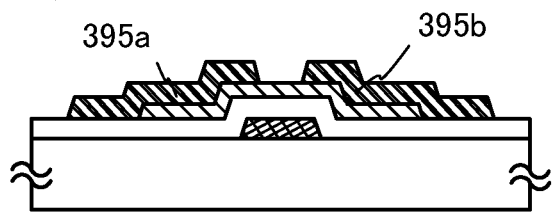
Figure 10D:
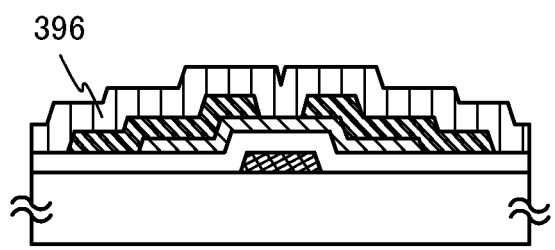

In a third photolithography step, a resist mask is formed over the conductive film and the conductive film is selectively etched so that the source electrode layer 395a and the drain electrode layer 395b are formed, and then the resist mask is removed (see FIG. 10C).

Ultraviolet light, KrF laser light, or ArF laser light is used for light exposure for forming the resist mask in the third photolithography step. Channel length L of a thin film transistor to be completed later is determined by a distance between bottom ends of the source electrode layer and the drain electrode layer, which are adjacent to each other over the oxide semiconductor layer 399. Note that in the case where light exposure is performed so that the channel length L becomes less than 25 nm, light exposure for forming the resist mask in the third photolithography step is performed using extreme ultraviolet with an extremely short wavelength of several nanometers to several tens of nanometers. Light exposure using extreme ultraviolet enables high resolution and deep depth of focus. Thus, the channel length L of the thin film transistor to be completed later can be greater than or equal to 10 nm and less than or equal to 1000 nm and the operation speed of a circuit can be increased, and furthermore the value of off-state current is extremely small, which leads to lower power consumption can be achieved.

Note that in order to prevent the oxide semiconductor layer 399 from being removed at the time of the etching of the conductive film, materials and etching conditions of the conductive film and the oxide semiconductor layer 399 are adjusted as appropriate.

In this embodiment, a Ti film is used as the conductive film, an In—Ga—Zn—O-based oxide semiconductor is used for the oxide semiconductor layer 399, and an ammonia hydrogen peroxide solution (a mixture of ammonia, water, and a hydrogen peroxide solution) is used as an etchant.

Note that, in the third photolithography step, only part of the oxide semiconductor layer 399 is etched to form an oxide semiconductor layer having a groove (a depressed portion) in some cases. In addition, the resist mask for forming the source electrode layer 395a and the s drain electrode layer 395b may be formed by an ink-jet method. Formation of the resist mask by an inkjet method needs no photomask, which results in a reduction in manufacturing costs.

In order to reduce the number of photomasks and the number of steps in a photolithography process, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using a multi-tone mask. Thus, the number of light-exposure masks can be reduced and the number of corresponding photolithography steps can be also reduced, whereby simplification of a process can be realized.

Water or the like attached to a surface of the exposed oxide semiconductor layer may be removed by plasma treatment using a gas such as $N_2O$, $N_2$, or Ar. The plasma treatment may be performed using a mixed gas of oxygen and argon.

In the case where the plasma treatment is performed, an oxide insulating layer 396 is formed as an oxide insulating layer serving as a protective insulating film in contact with part of the oxide semiconductor layer without being exposed to air (see FIG. 10C). In this embodiment, the oxide insulating layer 396 is formed so as to be in contact with the oxide semiconductor layer 399 in a region where the oxide semiconductor layer 399 does not overlap with the source electrode layer 395a and the drain electrode layer 395b.

In this embodiment, a silicon oxide layer containing a defect is formed as the oxide insulating layer 396 in such a manner that the substrate 394 over which components up to and including the island-shaped oxide semiconductor layer 399, the source electrode layer 395a, and the drain electrode layer 395b are formed is heated to room temperature or lower than 100° C., a sputtering gas containing high-purity oxygen from which hydrogen and moisture are removed is introduced, and a silicon semiconductor target is used.

For example, the silicon oxide film is formed by a pulsed DC sputtering method using a boron-doped silicon target which has a purity of 6N (the resistivity is 0.01 Ω·cm) in an atmosphere of oxygen (the proportion of oxygen flow rate is 100%) under the following conditions: the distance between the substrate and the target (T-S distance) is 89 mm, the pressure is 0.4 Pa, and the direct-current (DC) power is 6 kW. The film thickness is 300 nm. Note that as the target for forming the silicon oxide film, quartz (preferably synthetic quartz) can be used instead of the silicon target. Note that oxygen or a mixed gas of oxygen and argon is used as a sputtering gas.

In that case, the oxide insulating layer 396 is preferably formed while moisture remaining in the treatment chamber is removed so that hydrogen, a hydroxyl group, or moisture is prevented from being contained in the oxide semiconductor layer 399 and the oxide insulating layer 396.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$), a compound containing a carbon atom, and the like are removed, whereby the concentration of an impurity in the oxide insulating layer 396 formed in the treatment chamber can be reduced.

Note that as the oxide insulating layer 396, a silicon oxynitride layer, an aluminum oxide layer, an aluminum oxynitride layer, or the like can be used instead of the silicon oxide layer.

Furthermore, heat treatment may be performed at 100° C. to 400° C. with the oxide insulating layer 396 and the oxide semiconductor layer 399 being in contact with each other. The oxide insulating layer 396 in this embodiment contains a large number of defects; thus, impurities such as hydrogen, moisture, a hydroxyl group, or hydride contained in the oxide semiconductor layer 399 can be diffused into the oxide insulating layer 396 by this heat treatment so that the impurities contained in the oxide semiconductor layer 399 are reduced.

Figure 10E:
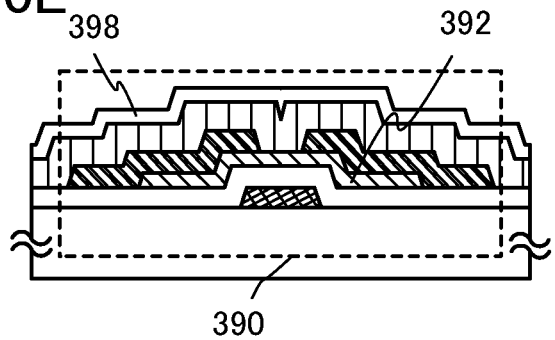

Through the above-described steps, the thin film transistor 390 including the oxide semiconductor layer 392 in which the concentration of hydrogen, moisture, a hydroxyl group, or hydride is reduced can be manufactured (see FIG. 10E).

As described above, in forming the oxide semiconductor film, moisture remaining in the reaction atmosphere is removed, whereby the concentration of hydrogen and hydride in the oxide semiconductor film can be reduced. Thus, stabilization of the oxide semiconductor film can be achieved.

A protective insulating layer may be provided over the oxide insulating layer. In this embodiment, a protective insulating layer 398 is formed over the oxide insulating layer 396. A silicon nitride film, a silicon nitride oxide film, an aluminum nitride film, an aluminum nitride oxide film, or the like is used as the protective insulating layer 398.

As the protective insulating layer 398, a silicon nitride film is formed using a silicon semiconductor target in such a manner that the substrate 394 over which components up to and including the oxide insulating layer 396 are formed is heated to a temperature of 100° C. to 400° C. and a sputtering gas from which hydrogen and moisture are removed and which contains high-purity nitrogen is introduced. Also in that case, in a manner similar to that of the oxide insulating layer 396, the protective insulating layer 398 is preferably formed while moisture remaining in the treatment chamber is removed.

In the case where the protective insulating layer 398 is formed, the substrate 394 is heated to 100° C. to 400° C. at the time of the formation of the protective insulating layer 398, whereby hydrogen or moisture contained in the oxide semiconductor layer can be diffused into the oxide insulating layer. In that case, heat treatment does not have to be performed after the formation of the oxide insulating layer 396.

In the case where the silicon oxide layer is formed as the oxide insulating layer 396 and the silicon nitride layer as the protective insulating layer 398 is stacked thereover, the silicon oxide layer and the silicon nitride layer can be formed in the same treatment chamber using the same silicon target. First, the silicon oxide layer is formed in such a manner that a gas containing oxygen is introduced and a silicon target provided in the treatment chamber is used. Then, the silicon nitride layer is formed in such a manner that the gas is switched to a gas containing nitrogen and the silicon target used for the silicon nitride layer is used. The silicon oxide layer and the silicon nitride layer can be formed successively without being exposed to air; thus, impurities such as hydrogen or moisture can be prevented from being attached to the surface of the silicon oxide layer. In that case, heat treatment (at a temperature of 100° C. to 400° C.) is preferably performed so that hydrogen or moisture contained in the oxide semiconductor layer is diffused into the oxide insulating layer after the silicon oxide layer is formed as the oxide insulating layer 396 and the silicon nitride layer as the protective insulating layer 398 is stacked thereover.

Furthermore, heat treatment may be performed at 100° C. to 200° C. for 1 hour to 30 hours in an air atmosphere after the formation of the protective insulating layer. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Alternatively, this heat treatment may be performed before formation of the oxide insulating layer under reduced pressure. When the heat treatment is performed under reduced pressure, the heat treatment time can be shortened. This heat treatment enables a normally-off thin film transistor to be obtained. Thus, the reliability of a display device can be increased.

Further, moisture remaining in the reaction atmosphere is removed at the time of forming the oxide semiconductor layer serving as a channel formation region over the gate insulating layer, whereby the concentration of hydrogen and hydride in the oxide semiconductor layer can be reduced.

Since the above-described steps are performed at a temperature of 400° C. or lower, the process can be applied to a manufacturing process using a glass substrate having a side longer than or equal to 1 meter and a thickness less than or equal to 1 millimeter. In addition, since all of the above steps can be performed at a treatment temperature of 400° C. or lower, a display panel can be manufactured without consuming too much energy.

As described above, the highly-purified oxide semiconductor layer is used in the thin film transistor, whereby the thin film transistor with reduced off-state current can be provided. In addition, the thin film transistor with reduced off-state current which is described in this embodiment is applied to a pixel in a display device, whereby a period in which a storage capacitor provided in the pixel can hold voltage can be increased. Thus, a display device which consumes less power in displaying a still image or the like can be provided.

This embodiment can be implemented in combination with any of the structures of the other embodiments as appropriate.

Embodiment 6

In this embodiment, another example of a thin film transistor that can be applied to the display device disclosed in this specification will be described. A thin film transistor 310 described in this embodiment can be used as the thin film transistor 106 in Embodiment 1.

FIGS. 11A to 11E illustrate an example of a cross-sectional structure of the thin film transistor of this embodiment. The thin film transistor 310 illustrated in FIGS. 11A to 11E has a bottom-gate structure and is also called an inverted staggered thin film transistor.

Although the thin film transistor 310 is described as a single-gate thin film transistor, a multi-gate thin film transistor including a plurality of channel formation regions can be manufactured when needed.

A process of manufacturing the thin film transistor 310 over a substrate 300 will be described below with reference to FIGS. 11A to 11E. FIG. 11E illustrates a structure in which a protective insulating layer is formed over the thin film transistor 310.

First, a conductive film is formed over the substrate 300 having an insulating surface, and then a first photolithography step is performed thereon to form a gate electrode layer 311. Note that a resist mask may be formed by an inkjet method. Formation of the resist mask by an inkjet method needs no photomask, which results in a reduction in manufacturing costs.

Although there is no particular limitation on a substrate which can be used as the substrate 300 having an insulating surface, the substrate needs to have heat resistance high enough to withstand at least heat treatment to be performed later. A glass substrate made of barium borosilicate glass, aluminoborosilicate glass, or the like can be used.

In the case where a glass substrate is used and the temperature of the heat treatment performed later is high, a glass substrate whose strain point is higher than or equal to 730° C. is preferably used. For a glass substrate, a glass material such as aluminosilicate glass, aluminoborosilicate glass, or barium borosilicate glass is used, for example. Note that in the case where a larger amount of barium oxide (BaO) than boron oxide is contained, a more practical heat-resistant glass substrate can be obtained. Thus, a glass substrate containing a larger amount of BaO than $B_2O_3$ is preferably used.

Note that a substrate formed of an insulator such as a ceramic substrate, a quartz substrate, or a sapphire substrate may be used instead of the above glass substrate. Alternatively, crystallized glass or the like may be used.

An insulating film serving as a base film may be provided between the substrate 300 and the gate electrode layer 311. The base film has a function of preventing diffusion of an impurity element from the substrate 300, and can be formed to have a single-layer structure or a stacked-layer structure including one or more of a silicon nitride film, a silicon oxide film, a silicon nitride oxide film, and a silicon oxynitride film.

The gate electrode layer 311 can be formed to have a single-layer or stacked-layer structure including a metal material such as molybdenum, titanium, chromium, tantalum, tungsten, aluminum, copper, neodymium, or scandium, or an alloy material containing any of these materials as a main component.

For example, as a two-layer structure of the gate electrode layer 311, the following structure is preferable: a structure in which a molybdenum layer is stacked over an aluminum layer, a structure in which a molybdenum layer is stacked over a copper layer, a structure in which a titanium nitride layer or a tantalum nitride layer is stacked over a copper layer, a structure in which a titanium nitride layer and a molybdenum layer are stacked, or a structure in which a tungsten nitride layer and a tungsten layer are stacked. As a three-layer structure, a structure in which a tungsten layer or a tungsten nitride layer, a layer of an alloy of aluminum and silicon or an alloy of aluminum and titanium, and a titanium nitride layer or a titanium layer are stacked is preferable.

Next, a gate insulating layer 302 is formed over the gate electrode layer 311.

The gate insulating layer 302 can be formed to have a single-layer structure or a stacked-layer structure including a silicon oxide layer, a silicon nitride layer, a silicon oxynitride layer, a silicon nitride oxide layer, and/or an aluminum oxide layer by a plasma CVD method, a sputtering method, or the like. For example, a silicon oxynitride layer can be formed using a deposition gas containing $SiH_4$, oxygen, and nitrogen by plasma CVD. The thickness of the gate insulating layer 302 is greater than or equal to 100 nm and less than or equal to 500 nm In the case of a stacked-layer structure, for example, a first gate insulating layer with a thickness of greater than or equal to 50 nm and less than or equal to 200 nm and a second gate insulating layer with a thickness of greater than or equal to 5 nm and less than or equal to 300 nm are stacked in this order.

In this embodiment, as the gate insulating layer 302, a silicon oxynitride layer with a thickness of less than or equal to 200 nm is formed by a plasma CVD method.

Next, an oxide semiconductor film 330 is formed to a thickness greater than or equal to 2 nm and less than or equal to 200 nm over the gate insulating layer 302.

Note that before the oxide semiconductor film 330 is formed by a sputtering method, dust on a surface of the second gate insulating layer 302 is preferably removed by reverse sputtering in which plasma is generated by introduction of an argon gas. Note that a nitrogen atmosphere, a helium atmosphere, an oxygen atmosphere, or the like may be used instead of an argon atmosphere.

The oxide semiconductor film 330 is formed using an In—Ga—Zn—O-based non-single-crystal film; or an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Sn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 330 is formed by a sputtering method using an In—Ga—Zn—O-based oxide semiconductor target for film formation. A cross-sectional view at this stage corresponds to FIG. 11A. In addition, the oxide semiconductor film 330 can be formed by a sputtering method in a rare gas (typically, argon) atmosphere, an oxygen atmosphere, or an atmosphere containing a rare gas (typically, argon) and oxygen. In the case where the oxide semiconductor film 330 is formed by a sputtering method, it may be formed using a target containing $SiO_2$ at 2 wt % to 10 wt %.

As the target for forming the oxide semiconductor film 330 by a sputtering method, a metal oxide target containing zinc oxide as a main component can be used. As another example of the metal oxide target, an oxide semiconductor target for film formation containing In, Ga, and Zn (the composition ratio: $In_2O_3:Ga_2O_3:ZnO$=1:1:1 (mol ratio), In:Ga:Zn=1:1: 0.5 (atomic %)) can be used. As the oxide semiconductor target for film formation containing In, Ga, and Zn, a target having a composition ratio of In:Ga:Zn=1:1:1 (atomic ratio) or In:Ga:Zn=1:1:2 (atomic ratio) can be used. In addition, the filling factor of the oxide semiconductor target for film formation is greater than or equal to 90% and less than or equal to 100%, preferably greater than or equal to 95% and less than or equal to 99.9%. An oxide semiconductor film which is formed using an oxide semiconductor target for film formation, which has a high filling factor, is dense.

As a sputtering gas used for forming the oxide semiconductor film 330, a high-purity gas is preferably used in which impurities such as hydrogen, water, a hydroxyl group, or hydride are reduced to such a level that the impurity concentration is represented by the unit "ppm" or "ppb".

The substrate is held in a treatment chamber maintained at reduced pressure and is heated to higher than or equal to 100° C. and lower than or equal to 600° C., preferably higher than or equal to 200° C. and lower than or equal to 400° C. Film formation is performed while the substrate is heated, whereby the concentration of impurities contained in the formed oxide semiconductor film can be reduced. Then, a sputtering gas from which hydrogen and moisture are removed is introduced while moisture remaining in the treatment chamber is removed, and the oxide semiconductor film 330 is formed over the gate insulating layer 302 using metal oxide as a target. In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as $H_2O$ (preferably also a compound containing a carbon atom), and the like are removed, whereby the concentration of an impurity in the oxide semiconductor film formed in the treatment chamber can be reduced.

As an example of the deposition condition, the distance between the substrate and the target is 100 mm, the pressure is 0.6 Pa, the direct-current (DC) power is 0.5 kW, and the atmosphere is an oxygen atmosphere (the proportion of oxygen flow: 100%). Note that a pulsed direct-current (DC) power source is preferably used, in which case powder substances (also referred to as particles or dust) generated in film formation can be reduced and the film thickness can be uniform. The oxide semiconductor film preferably has a thickness of greater than or equal to 5 nm and less than or equal to 30 nm Note that the appropriate thickness differs depending on an oxide semiconductor material, and the thickness may be set as appropriate depending on the material.

Next, the oxide semiconductor film 330 is processed into an island-shaped oxide semiconductor layer in a second photolithography step. A resist mask for forming the island-shaped oxide semiconductor layer may be formed by an inkjet method. Formation of the resist mask by an inkjet method needs no photomask, which results in a reduction in manufacturing costs.

Next, first heat treatment is performed on the oxide semiconductor layer. The oxide semiconductor layer can be dehydrated or dehydrogenated by this first heat treatment. The temperature of the first heat treatment is higher than or equal to 400° C. and lower than or equal to 750° C., preferably higher than or equal to 400° C. and lower than the strain point of the substrate. Here, the substrate is put in an electric furnace that is a kind of heat treatment apparatus and heat treatment is performed on the oxide semiconductor layer in a nitrogen atmosphere at 450° C. for one hour, and then water and hydrogen are prevented from entering the oxide semiconductor layer with the oxide semiconductor layer not exposed to air. In the above manner, the oxide semiconductor layer 331 is obtained (see FIG. 11B).

The heat treatment apparatus is not limited to an electric furnace and may be provided with a device that heats an object to be processed by thermal conduction or thermal radiation from a heater such as a resistance heater or the like. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with a process object by heat treatment, such as nitrogen or a rare gas such as argon is used.

For example, as the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment in a short time.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Further, the oxide semiconductor layer may be crystallized to be a microcrystalline film or a polycrystalline film depending on a condition of the first heat treatment or a material of the oxide semiconductor layer. For example, the oxide semiconductor layer may be crystallized to be a microcrystalline semiconductor film having a degree of crystallization of 90% or more, or 80% or more. Further, depending on the condition of the first heat treatment and the material of the oxide semiconductor layer, the oxide semiconductor layer may be an amorphous oxide semiconductor film containing no crystalline component. The oxide semiconductor layer may become an oxide semiconductor film in which a microcrystalline portion (with a grain diameter greater than or equal to 1 nm and greater than or less than 20 nm, typically greater than or equal to 2 nm and greater than or less than 4 nm) is mixed into an amorphous oxide semiconductor.

The first heat treatment for the oxide semiconductor layer can be performed before the oxide semiconductor film 330 is processed into the island-shaped oxide semiconductor layers. In that case, the substrate is taken out from the heat apparatus after the first heat treatment, and then a photolithography step is performed.

The heat treatment which has an effect of dehydrating or dehydrogenating the oxide semiconductor layer may be performed at any of the following timings: after the oxide semiconductor layer is formed; after the source electrode and the drain electrode are formed over the oxide semiconductor layer; and after the protective insulating film is formed over the source electrode and the drain electrode.

In the case where a contact hole is formed in the gate insulating layer 302, the formation of the contact hole may be performed before or after the dehydration or dehydrogenation of the oxide semiconductor film 330.

Note that the etching of the oxide semiconductor film may be dry etching, without limitation to wet etching.

The etching conditions (such as an etchant, etching time, and temperature) are adjusted as appropriate depending on the material so that the oxide semiconductor film can be etched into a desired shape.

Next, a conductive film is formed over the gate insulating layer 302 and the oxide semiconductor layer 331. The conductive film may be formed by a sputtering method or a vacuum evaporation method. As examples of a material of the metal conductive film, an element selected from Al, Cr, Cu, Ta, Ti, Mo, or W; an alloy containing any of these elements as a component; an alloy film containing any of these elements in combination; and the like can be given. Alternatively, one or more materials selected from manganese, magnesium, zirconium, beryllium, and thorium may be used. Further, the metal conductive film may have a single-layer structure or a stacked-layer structure including two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film which contains aluminum (Al) and one or a plurality of elements selected from titanium (Ti), tantalum (Ta), tungsten (W), molybdenum (Mo), chromium (Cr), neodymium (Nd), and scandium (Sc) may be used.

In the case where heat treatment is performed after the formation of the conductive film, it is preferable that the conductive film have heat resistance high enough to withstand the heat treatment.

Figure 11A:
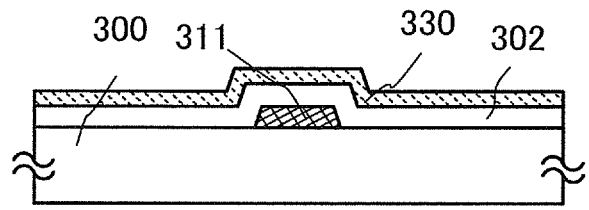
FIGS. 11A to 11E illustrate manufacturing steps of a thin film transistor according to Embodiment.
Figure 11B:
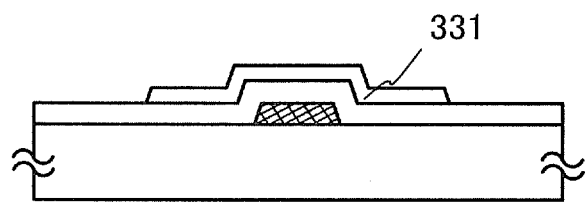
Figure 11C:
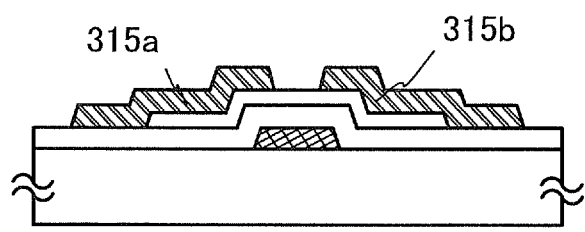
Figure 11D:
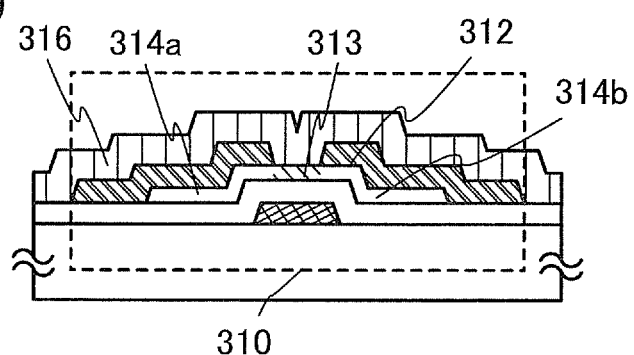
Figure 11E:
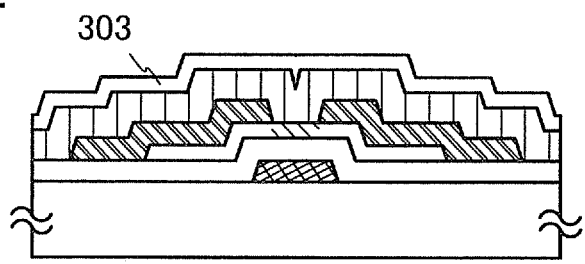
Figure 12A:
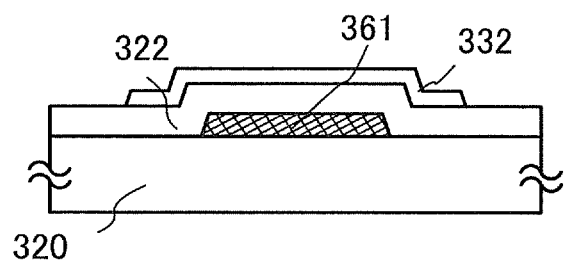
FIGS. 12A to 12D illustrate manufacturing steps of a thin film transistor according to Embodiment.
Figure 12B:
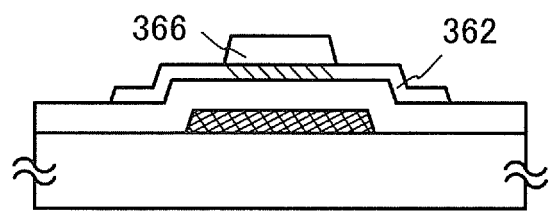
Figure 12C:
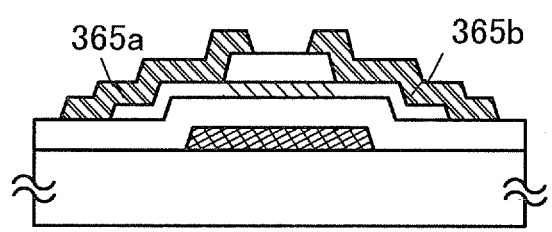
Figure 12D:
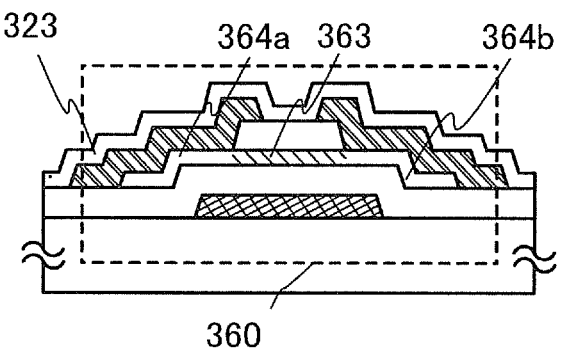

In a third photolithography step, a resist mask is formed over the conductive film, and the conductive film is selectively etched to form a source electrode layer 315a and a drain electrode layer 315b, and then the resist mask is removed (see FIG. 11C).

Ultraviolet light, KrF laser light, or ArF laser light is used for light exposure for forming the resist mask in the third photolithography step. Channel length L of a thin film transistor to be completed later is determined by a distance between bottom ends of the source electrode layer and the drain electrode layer, which are adjacent to each other over the oxide semiconductor layer 331. Note that in the case where light exposure is performed so that the channel length L becomes less than 25 nm, light exposure for forming the resist mask in the third photolithography step is performed using extreme ultraviolet with an extremely short wavelength of several nanometers to several tens of nanometers. Light exposure using extreme ultraviolet enables high resolution and deep depth of focus. Thus, the channel length L of the thin film transistor to be completed later can be greater than or equal to 10 nm and less than or equal to 1000 nm and the operation speed of a circuit can be increased, and furthermore the value of off-state current is extremely small, which leads to lower power consumption can be achieved.

Note that in order to prevent the oxide semiconductor layer 331 from being removed at the time of the etching of the conductive film, materials and etching conditions of the conductive film and the oxide semiconductor layer 331 are adjusted as appropriate.

In this embodiment, a Ti film is used as the conductive film, an In—Ga—Zn—O-based oxide semiconductor is used for the oxide semiconductor layer 331, and an ammonia hydrogen peroxide solution (a mixture of ammonia, water, and a hydrogen peroxide solution) is used as an etchant.

Note that, in the third photolithography step, only part of the oxide semiconductor layer 331 is etched to form an oxide semiconductor layer having a groove (a depressed portion) in some cases. In addition, the resist mask for forming the source electrode layer 315a and the drain electrode layer 315b may be formed by an ink-jet method. Formation of the resist mask by an inkjet method needs no photomask, which results in a reduction in manufacturing costs.

Further, an oxide conductive layer may be formed between the oxide semiconductor layer and the source and drain electrode layers. The oxide conductive layer and the metal layer for forming the source and drain electrode layers can be formed successively. The oxide conductive layer can serve as a source and drain regions.

The provision of the oxide conductive layer as the source and drain regions between the oxide semiconductor layer and the source and drain electrode layers makes it possible to decrease the resistance of the source and drain regions and to operate the transistor at high speed.

In order to reduce the number of photomasks and steps in a photolithography step, etching may be performed with the use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using a multi-tone mask. Thus, the number of light-exposure masks can be reduced and the number of corresponding photolithography steps can be also reduced, whereby simplification of a process can be realized.

Next, plasma treatment using a gas such as $N_2O$, $N_2$, or Ar is performed. This plasma treatment removes water or the like adsorbed on a surface of the oxide semiconductor layer which is exposed. Plasma treatment may be performed using a mixed gas of oxygen and argon.

After the plasma treatment, an oxide insulating layer 316 which serves as a protective insulating film and is in contact with part of the oxide semiconductor layer is formed without exposure to air.

The oxide insulating layer 316 can be formed to a thickness of at least 1 nm by a method by which impurities such as water or hydrogen does not enter the oxide insulating layer 316, such as a sputtering method, as appropriate. When hydrogen is contained in the oxide insulating layer 316, the hydrogen enters the oxide semiconductor layer or oxygen in the oxide semiconductor layer is extracted by the hydrogen, thereby decreasing the resistance of the oxide semiconductor layer on the side opposite to the side where a channel is formed (so-called back channel side) (making the back channel side have n-type conductivity), which might result in formation of a parasitic channel. Therefore, it is preferable that a formation method in which hydrogen is not used is employed in order to form the oxide insulating layer 316 containing as little hydrogen as possible.

In this embodiment, as the oxide insulating layer 316, a silicon oxide film with a thickness of 200 nm is formed by a sputtering method. The substrate temperature in the film formation may be higher than or equal to room temperature and lower than or equal to 300° C., and is 100° C. in this embodiment. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target can be used. For example, silicon oxide can be formed using a silicon target by a sputtering method in an atmosphere of oxygen and nitrogen. As the oxide insulating layer 316 which is formed in contact with the oxide semiconductor layer whose resistance is reduced, an inorganic insulating film which does not include impurities such as moisture, a hydrogen ion, and OH$^-$ and blocks entry of these from the outside is used. Typically, a silicon oxide film, a silicon nitride oxide film, an aluminum oxide film, an aluminum oxynitride film, or the like is used.

In that case, the oxide insulating layer 316 is preferably formed while moisture remaining in the treatment chamber is removed so that hydrogen, a hydroxyl group, or moisture is prevented from being contained in the oxide semiconductor layer 331 and the oxide insulating layer 316.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$), a compound containing a carbon atom, and the like are removed, whereby the concentration of an impurity in the oxide insulating layer 316 formed in the treatment chamber can be reduced.

As a sputtering gas used for forming the oxide insulating layer 316, a high-purity gas is preferably used in which impurities such as hydrogen, water, a hydroxyl group, or hydride are reduced to such a level that the impurity concentration is represented by the unit "ppm" or "ppb".

Next, second heat treatment (preferably at higher than or equal to 200° C. and lower than or equal to 400° C., for example higher than or equal to 250° C. and lower than or equal to 350° C.) is performed in an inert gas atmosphere or an oxygen gas atmosphere. For example, the second heat treatment is performed at 250° C. in a nitrogen atmosphere for one hour. By the second heat treatment, heat is applied while part of the oxide semiconductor layer (the channel formation region) is in contact with the oxide insulating layer 316.

Through the above-described steps, after the heat treatment for dehydration or dehydrogenation is performed on the formed oxide semiconductor film to reduce the resistance, part of the oxide semiconductor film is selectively in an oxygen excess state. As a result, a channel formation region 313 overlapping with the gate electrode layer 311 becomes i-type, and a high-resistance source region 314a which overlaps with the source electrode layer 315a and the high-resistance drain region 314b which overlaps with the drain electrode layer 315b are formed in a self-aligned manner. Through the above-described steps, the thin film transistor 310 is manufactured (see FIG. 11D).

Furthermore, heat treatment may be performed at 100° C. to 200° C. for 1 hour to 30 hours in an air atmosphere. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Alternatively, this heat treatment may be performed before formation of the oxide insulating layer under reduced pressure. When the heat treatment is performed under reduced pressure, the heat treatment time can be shortened. This heat treatment enables a normally-off thin film transistor to be obtained. Thus, the reliability of a display device can be increased.

The high-resistance drain region 314b (or the high-resistance source region 314a) is formed in a portion of the oxide semiconductor layer which overlaps with the drain electrode layer 315b (or the source electrode layer 315a), whereby the reliability of the thin film transistor can be increased. Specifically, the formation of the high-resistance drain region 314b enables a structure in which the conductivity can be gradually varied from the drain electrode layer 315b to the channel formation region 313 via the high-resistance drain region 314b. Thus, in the case where the transistor is operated with the drain electrode layer 315b connected to a wiring for supplying a high power supply potential Vdd, the high-resistance drain region serves as a buffer, and thus local concentration of an electric field is less likely to occur even if high voltage is applied between the gate electrode layer 311 and the drain electrode layer 315b, which leads to an increase in the withstand voltage of the transistor.

Further, the high-resistance source region or the high-resistance drain region in the oxide semiconductor layer is formed in the entire thickness direction in the case where the thickness of the oxide semiconductor layer is 15 nm or smaller. In the case where the thickness of the oxide semiconductor layer is 30 nm to 50 nm, in part of the oxide semiconductor layer, that is, in a region in the oxide semiconductor layer which is in contact with the source electrode layer or the drain electrode layer and the vicinity thereof, resistance is reduced. Then, a high-resistance source region or a high-resistance drain region is formed, while a region in the oxide semiconductor layer, which is close to the gate insulating film, can be made to be an i-type region.

A protective insulating layer may be additionally formed over the oxide insulating layer 316. For example, a silicon nitride film is formed by an RF sputtering method. Since an RF sputtering method has high productivity, it is preferably used as a film formation method of the protective insulating layer. The protective insulating layer is formed using an inorganic insulating film which does not contain impurities such as moisture, a hydrogen ion, and OH⁻ and blocks entry of these from the outside; for example, a silicon nitride film, an aluminum nitride film, a silicon nitride oxide film, an aluminum nitride oxide film, or the like is used. In this embodiment, as the protective insulating layer, a protective insulating layer 303 is formed using a silicon nitride film (see FIG. 11E).

In this embodiment, as the protective insulating layer 303, a silicon nitride film is formed using a silicon semiconductor target in such a manner that the substrate 300 over which components up to and including the oxide insulating layer 316 are formed is heated to a temperature of 100° C. to 400° C. and a sputtering gas from which hydrogen and moisture are removed and which contains high-purity nitrogen is introduced. Also in that case, in a manner similar to that of the oxide insulating layer 316, the protective insulating layer 303 is preferably formed while moisture remaining in the treatment chamber is removed.

A planarization insulating layer for planarization may be provided over the protective insulating layer 303.

As described above, the highly-purified oxide semiconductor layer is used in the thin film transistor, whereby the thin film transistor with reduced off-state current can be provided. In addition, the thin film transistor with reduced off-state current which is described in this embodiment is applied to a pixel in a display device, whereby a period in which a storage capacitor provided in the pixel can hold voltage can be increased. Thus, a display device which consumes less power in displaying a still image or the like can be provided.

This embodiment can be implemented in combination with any of the structures of the other embodiments as appropriate.

Embodiment 7

In this embodiment, another example of a thin film transistor that can be applied to the display device disclosed in this specification will be described. A thin film transistor 360 described in this embodiment can be used as the thin film transistor 106 in Embodiment 1.

FIGS. 12A to 12D illustrate an example of a cross-sectional structure of the thin film transistor of this embodiment. The thin film transistor 360 illustrated in FIGS. 12A to 12D has a bottom-gate structure called a channel-protective type (channel-stop type) and is also called an inverted staggered thin film transistor.

Although the thin film transistor 360 is described as a single-gate thin film transistor, a multi-gate thin film transistor including a plurality of channel formation regions can be manufactured when needed.

A process of manufacturing the thin film transistor 360 over a substrate 320 will be described below with reference to FIGS. 12A to 12D.

First, a conductive film is formed over the substrate 320 having an insulating surface, and then a first photolithography step is performed thereon to form a gate electrode layer 361. Note that a resist mask may be formed by an inkjet method. Formation of the resist mask by an inkjet method needs no photomask, which results in a reduction in manufacturing costs.

The gate electrode layer 361 can be formed to have a single-layer or stacked-layer structure including a metal material such as molybdenum, titanium, chromium, tantalum, tungsten, aluminum, copper, neodymium, or scandium, or an alloy material containing any of these materials as a main component.

Next, a gate insulating layer 322 is formed over the gate electrode layer 361.

In this embodiment, as the gate insulating layer 322, a silicon oxynitride layer with a thickness of less than or equal to 200 nm is formed by a plasma CVD method.

Next, an oxide semiconductor film 332 is formed to a thickness greater than or equal to 2 nm and less than or equal to 200 nm over the gate insulating layer 332, and then the oxide semiconductor film is processed into an island-shaped oxide semiconductor layer in a second photolithography step. In this embodiment, the oxide semiconductor film is formed by a sputtering method using an In—Ga—Zn—O-based oxide semiconductor target for film formation.

In that case, the oxide semiconductor film is preferably formed while moisture remaining in a treatment chamber is removed so that hydrogen, a hydroxyl group, or moisture is prevented from being contained in the oxide semiconductor film.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$), and the like are removed, whereby the concentration of an impurity in the oxide semiconductor film formed in the treatment chamber can be reduced.

As a sputtering gas used for forming the oxide semiconductor film, a high-purity gas is preferably used in which impurities such as hydrogen, water, a hydroxyl group, or hydride are reduced to such a level that the impurity concentration is represented by the unit "ppm" or "ppb".

Next, dehydration or dehydrogenation of the oxide semiconductor layer is performed. The temperature of first heat treatment for dehydration or dehydrogenation is higher than or equal to 400° C. and lower than or equal to 750° C., preferably higher than or equal to 400° C. and lower than the strain point of the substrate. Here, the substrate is put in an electric furnace that is a kind of heat treatment apparatus and heat treatment is performed on the oxide semiconductor layer in a nitrogen atmosphere at 450° C. for one hour, and then water and hydrogen are prevented from entering the oxide semiconductor layer with the oxide semiconductor layer not exposed to air. In the above manner, an oxide semiconductor layer 332 is obtained (see FIG. 12A).

Next, plasma treatment using a gas such as $N_2O$, $N_2$, or Ar is performed. This plasma treatment removes water or the like adsorbed on a surface of the oxide semiconductor layer which is exposed. Plasma treatment may be performed using a mixed gas of oxygen and argon.

Next, an oxide insulating layer is formed over the gate insulating layer 322 and the oxide semiconductor layer 332. After that, in a third photolithography step, a resist mask is formed, and the oxide insulating layer is selectively etched to form an oxide insulating layer 366, and then, the resist mask is removed.

In this embodiment, as the oxide insulating layer 366, a silicon oxide film with a thickness of 200 nm is formed by a sputtering method. The substrate temperature in the film formation may be higher than or equal to room temperature and lower than or equal to 300° C., and is 100° C. in this embodiment. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target can be used. For example, silicon oxide can be formed using a silicon target by a sputtering method in an atmosphere of oxygen and nitrogen. As the oxide insulating layer 366 which is formed in contact with the oxide semiconductor layer whose resistance is reduced, an inorganic insulating film which does not include impurities such as moisture, a hydrogen ion, and OH$^-$ and blocks entry of these from the outside is used. Typically, a silicon oxide film, a silicon nitride oxide film, an aluminum oxide film, an aluminum oxynitride film, or the like is used.

In that case, the oxide insulating layer 366 is preferably formed while moisture remaining in the treatment chamber is removed so that hydrogen, a hydroxyl group, or moisture is prevented from being contained in the oxide semiconductor layer 332 and the oxide insulating layer 366.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$), a compound containing a carbon atom, and the like are removed, whereby the concentration of an impurity in the oxide insulating layer 366 formed in the treatment chamber can be reduced.

As a sputtering gas used for forming the insulating layer 366, a high-purity gas is preferably used in which impurities such as hydrogen, water, a hydroxyl group, or hydride are reduced to such a level that the impurity concentration is represented by the unit "ppm" or "ppb".

Next, second heat treatment (preferably at higher than or equal to 200° C. and lower than or equal to 400° C., for example higher than or equal to 250° C. and lower than or equal to 350° C.) may be performed in an inert gas atmosphere or an oxygen gas atmosphere. For example, the second heat treatment is performed at 250° C. in a nitrogen atmosphere for one hour. By the second heat treatment, heat is applied while part of the oxide semiconductor layer (the channel formation region) is in contact with the oxide insulating layer 366.

In this embodiment, the oxide semiconductor layer 332 which is provided with the oxide insulating layer 366 and is partly exposed is further subjected to heat treatment in a nitrogen atmosphere or an inert gas atmosphere or under reduced pressure. By the heat treatment in a nitrogen atmosphere or an inert gas atmosphere or under reduced pressure, the resistance of the exposed region of the oxide semiconductor layer 441, which is not covered with the oxide insulating layer 366, can be reduced. For example, the heat treatment is performed at 250° C. in a nitrogen atmosphere for one hour.

By the heat treatment performed on the oxide semiconductor layer 332 provided with the oxide insulating layer 366 in a nitrogen atmosphere, the resistance of the exposed region of the oxide semiconductor layer 332 is reduced, whereby an oxide semiconductor layer 362 including regions with different resistances (indicated as a shaded region and a white region in FIG. 12B) is formed.

Next, a conductive film is formed over the gate insulating layer 322, the oxide semiconductor layer 362, and the oxide insulating layer 366. After that, in a fourth photolithography step, the conductive film is selectively etched to form a source electrode layer 365a and a drain electrode layer 365b, and then the resist mask is removed (see FIG. 12C).

As the material of the source electrode layer 365a and the drain electrode layer 365b, there are an element selected from Al, Cr, Cu, Ta, Ti, Mo, and W, an alloy containing any of these elements as its component, an alloy containing a combination of any of these elements, and the like. Further, the conductive film may have a single-layer structure or a stacked-layer structure including two or more layers.

Through the above-described steps, after the heat treatment for dehydration or dehydrogenation is performed on the formed oxide semiconductor film to reduce the resistance, part of the oxide semiconductor film is selectively in an oxygen excess state. As a result, a channel formation region 363 overlapping with the oxide insulating layer 366 becomes i-type, and a high-resistance source region 364a which overlaps with the source electrode layer 365a and the high-resistance drain region 364b which overlaps with the drain electrode layer 365b are formed in a self-aligned manner. Through the above-described steps, the thin film transistor 360 is manufactured.

Furthermore, heat treatment may be performed at 100° C. to 200° C. for 1 hour to 30 hours in an air atmosphere. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Alternatively, this heat treatment may be performed before formation of the oxide insulating layer under reduced pressure. When the heat treatment is performed under reduced pressure, the heat treatment time can be shortened. This heat treatment enables a normally-off thin film transistor. Thus, the reliability can be increased.

The high-resistance drain region 364b (or the high-resistance source region 364a) is formed in a portion of the oxide semiconductor layer which overlaps with the drain electrode layer 365b (or the source electrode layer 365a), whereby the reliability of the thin film transistor can be increased. Specifically, the formation of the high-resistance drain region 364b enables a structure in which the conductivity can be gradually varied from the drain electrode layer 365b to the channel formation region 363 via the high-resistance drain region 364b. Thus, in the case where the transistor is operated with the drain electrode layer 365b connected to a wiring for supplying a high power supply potential Vdd, the high-resistance drain region 364b serves as a buffer, and thus local concentration of an electric field is less likely to occur even if high voltage is applied between the gate electrode layer 361 and the drain electrode layer 365b, which leads to an increase in the withstand voltage of the transistor.

Next, a protective insulating layer 323 is formed over the source electrode layer 365a, the drain electrode layer 365b, and the oxide insulating layer 366. In this embodiment, the protective insulating layer 323 is formed using a silicon nitride film (see FIG. 12D).

Note that an oxide insulating layer may be additionally formed over the source electrode layer 365a, the drain electrode layer 365b, and the oxide insulating layer 366, and a protective insulating layer 323 may be stacked over the oxide insulating layer.

As described above, the highly-purified oxide semiconductor layer is used in the thin film transistor, whereby the thin film transistor with reduced off-state current can be provided. In addition, the thin film transistor with reduced off-state current which is described in this embodiment is applied to a pixel in a display device, whereby a period in which a storage capacitor provided in the pixel can hold voltage can be increased. Thus, a display device which consumes less power in displaying a still image or the like can be provided.

This embodiment can be implemented in combination with any of the structures of the other embodiments as appropriate.

Embodiment 8

In this embodiment, another example of a thin film transistor that can be applied to the display device disclosed in this specification will be described. A thin film transistor 350 described in this embodiment can be used as the thin film transistor 106 in Embodiment 1.

FIGS. 13A to 13D illustrate an example of a cross-sectional structure of the thin film transistor of this embodiment.

Although the thin film transistor 350 is described as a single-gate thin film transistor, a multi-gate thin film transistor including a plurality of channel formation regions can be manufactured when needed.

A process of manufacturing the thin film transistor 350 over a substrate 340 will be described below with reference to FIGS. 13A to 13D.

First, a conductive film is formed over the substrate 340 having an insulating surface, and then a first photolithography step is performed thereon to form a gate electrode layer 351. In this embodiment, as the gate electrode layer 351, a tungsten film with a thickness of 150 nm is formed by a sputtering method.

Next, a gate insulating layer 342 is formed over the gate electrode layer 351. In this embodiment, as the gate insulating layer 342, a silicon oxynitride layer with a thickness of less than or equal to 100 nm is formed by a plasma CVD method.

Next, a conductive film is formed over the gate insulating layer 342. After that, in a second photolithography step, a resist mask is formed over the conductive film, and the conductive film is selectively etched to form a source electrode layer 355a and a drain electrode layer 355b, and then the resist mask is removed (see FIG. 13A).

Figure 13A:
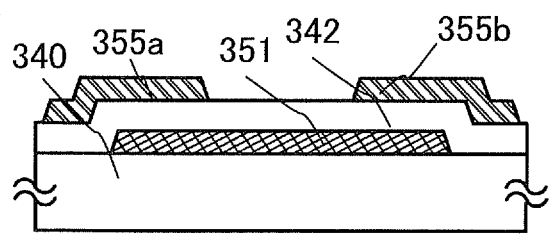
FIGS. 13A to 13D illustrate manufacturing steps of a thin film transistor according to Embodiment.
Figure 13B:
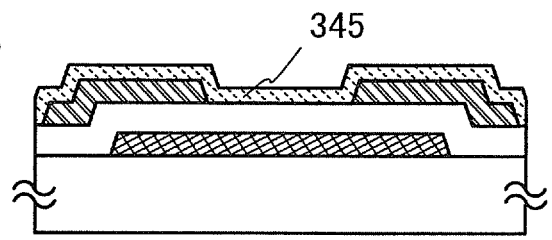
Figure 13C:
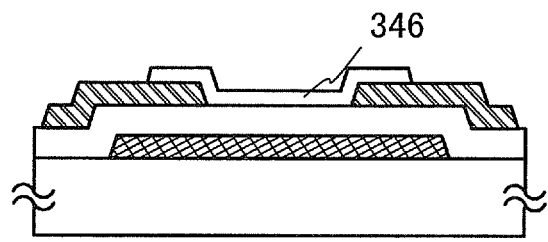
Figure 13D:
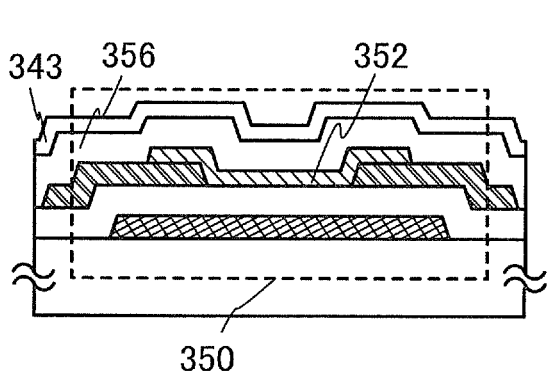

Next, an oxide semiconductor film 345 is formed (see FIG. 13B). In this embodiment, as the oxide semiconductor film 345 is formed using an In—Ga—Zn—O-based oxide semiconductor target for film formation by a sputtering method. In a third photolithography step, the oxide semiconductor film 345 is processed into an island-shaped oxide semiconductor layer.

In that case, the oxide semiconductor film 345 is preferably formed while moisture remaining in a treatment chamber is removed so that hydrogen, a hydroxyl group, or moisture is prevented from being contained in the oxide semiconductor film 345.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$), and the like are removed, whereby the concentration of an impurity in the oxide semiconductor film 345 formed in the treatment chamber can be reduced.

As a sputtering gas used for forming the oxide semiconductor film 345, a high-purity gas is preferably used in which impurities such as hydrogen, water, a hydroxyl group, or hydride are reduced to such a level that the impurity concentration is represented by the unit "ppm" or "ppb".

Next, dehydration or dehydrogenation of the oxide semiconductor layer is performed. The temperature of first heat treatment for dehydration or dehydrogenation is higher than or equal to 400° C. and lower than or equal to 750° C., preferably higher than or equal to 400° C. and lower than the strain point of the substrate. Here, the substrate is put in an electric furnace that is a kind of heat treatment apparatus and heat treatment is performed on the oxide semiconductor layer in a nitrogen atmosphere at 450° C. for one hour, and then water and hydrogen are prevented from entering the oxide semiconductor layer with the oxide semiconductor layer not exposed to air. In the above manner, an oxide semiconductor layer 346 is obtained (see FIG. 13C).

As the first heat treatment, GRTA may be performed as follows. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment in a short time.

Next, an oxide insulating layer 356 serving as a protective insulating film is formed in contact with the oxide semiconductor layer 346.

The oxide insulating layer 356 can be formed to a thickness of at least 1 nm by a method by which impurities such as water or hydrogen does not enter the oxide insulating layer 356, such as a sputtering method, as appropriate. When hydrogen is contained in the oxide insulating layer 356, the hydrogen enters the oxide semiconductor layer or oxygen in the oxide semiconductor layer is extracted by the hydrogen, thereby decreasing the resistance of the oxide semiconductor layer on the side opposite to the side where a channel is formed (the so-called back channel side) (making the back channel side have n-type conductivity), which might result in formation of a parasitic channel. Therefore, it is preferable that a formation method in which hydrogen is not used is employed in order to form the oxide insulating layer 356 containing as little hydrogen as possible.

In this embodiment, as the oxide insulating layer 356, a silicon oxide film with a thickness of 200 nm is formed by a sputtering method. The substrate temperature in the film formation may be higher than or equal to room temperature and lower than or equal to 300° C., and is 100° C. in this embodiment. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target can be used. For example, silicon oxide can be formed using a silicon target by a sputtering method in an atmosphere of oxygen and nitrogen. As the oxide insulating layer 356 which is formed in contact with the oxide semiconductor layer whose resistance is reduced, an inorganic insulating film which does not include impurities such as moisture, a hydrogen ion, and OH− and blocks entry of these from the outside is used. Typically, a silicon oxide film, a silicon nitride oxide film, an aluminum oxide film, an aluminum oxynitride film, or the like is used.

In that case, the oxide insulating layer 356 is preferably formed while moisture remaining in the treatment chamber is removed so that hydrogen, a hydroxyl group, or moisture is prevented from being contained in the oxide semiconductor layer 346 and the oxide insulating layer 356.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$), a compound containing a carbon atom, and the like are removed, whereby the concentration of an impurity in the oxide insulating layer 356 formed in the treatment chamber can be reduced.

As a sputtering gas used for forming the oxide insulating layer 356, a high-purity gas is preferably used in which impurities such as hydrogen, water, a hydroxyl group, or hydride are reduced to such a level that the impurity concentration is represented by the unit "ppm" or "ppb".

Next, second heat treatment (preferably at higher than or equal to 200° C. and lower than or equal to 400° C., for example higher than or equal to 250° C. and lower than or equal to 350° C.) is performed in an inert gas atmosphere or an oxygen gas atmosphere. For example, the second heat treatment is performed at 250° C. in a nitrogen atmosphere for one hour. By the second heat treatment, heat is applied while the oxide semiconductor layer is in contact with the oxide insulating layer 356.

Through the above-described steps, after the heat treatment for dehydration or dehydrogenation is performed on the formed oxide semiconductor film to reduce the resistance, the oxide semiconductor film is in an oxygen excess state. As a result, an i-type oxide semiconductor layer 352 is formed. Through the above-described steps, the thin film transistor 350 is manufactured.

Furthermore, heat treatment may be performed at 100° C. to 200° C. for 1 hour to 30 hours in an air atmosphere. In this embodiment, heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Alternatively, this heat treatment may be performed before formation of the oxide insulating layer under reduced pressure. When the heat treatment is performed under reduced pressure, the heat treatment time can be shortened. This heat treatment enables a normally-off thin film transistor. Thus, the reliability can be increased.

A protective insulating layer may be additionally formed over the oxide insulating layer 356. For example, a silicon nitride film is formed by an RF sputtering method. In this embodiment, as the protective insulating layer, a protective insulating layer 343 is formed using a silicon nitride film (see FIG. 13D).

A planarization insulating layer for planarization may be provided over the protective insulating layer 343.

As described above, the highly-purified oxide semiconductor layer is used in the thin film transistor, whereby the thin film transistor with reduced off-state current can be provided. In addition, the thin film transistor with reduced off-state current which is described in this embodiment is applied to a pixel in a display device, whereby a period in which a storage capacitor provided in the pixel can hold voltage can be increased. Thus, a display device which consumes less power in displaying a still image or the like can be provided.

This embodiment can be implemented in combination with any of the structures of the other embodiments as appropriate.

Embodiment 9

In this embodiment, another example of a thin film transistor that can be applied to the display device disclosed in this specification will be described. A thin film transistor 380 described in this embodiment can be used as the thin film transistor 106 in Embodiment 1.

Figure 14:
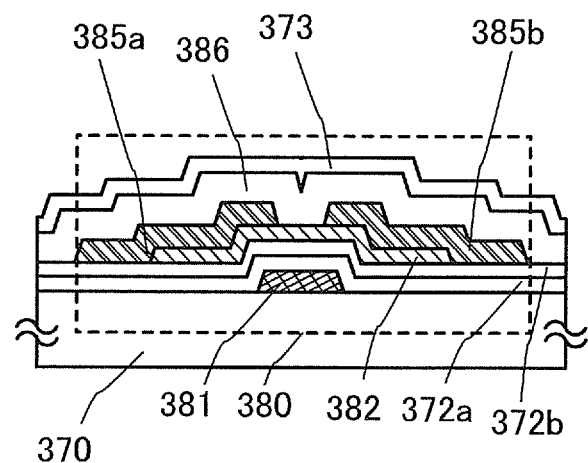
FIG. 14 is a cross-sectional view of a thin film transistor according to Embodiment.

In this embodiment, an example of a manufacturing process of a thin film transistor, which is partly different from that of Embodiment 6, will be described with reference to FIG. 14. Since a manufacturing process of a thin film transistor in FIG. 14 is the same as that of the thin film transistor in FIGS. 11A to 11E except for some steps, the same reference numerals are used for the same portions, and detailed description of the same portions is not repeated.

In accordance with Embodiment 6, a gate electrode layer 381 is formed over a substrate 370, and a first gate insulating layer 372a and a second gate insulating layer 372b are stacked thereover. In this embodiment, the gate insulating layer has a two-layer structure: a nitride insulating layer is used as the first gate insulating layer 372a, and an oxide insulating layer is used as the second gate insulating layer 372b.

As the oxide insulating layer, a silicon oxide layer, a silicon oxynitride layer, an aluminum oxide layer, an aluminum oxynitride layer, or the like can be used. As the nitride insulating layer, a silicon nitride layer, a silicon nitride oxide layer, an aluminum nitride layer, an aluminum nitride oxide layer, or the like can be used.

In this embodiment, the insulating layer has a structure in which a silicon nitride layer and a silicon oxide layer are stacked in this order over the gate electrode layer 381. A silicon nitride layer ($SiN_y$ (y>0)) with a thickness of greater than or equal to 50 nm and less than or equal to 200 nm (50 nm in this embodiment) is formed as the first gate insulating layer 372a by a sputtering method, and a silicon oxide layer ($SiO_x$ (x>0)) with a thickness of greater than or equal to 5 nm and less than or equal to 300 nm (100 nm in this embodiment) is stacked as the second gate insulating layer 372b over the first gate insulating layer 372a, whereby a gate insulating layer with a thickness of 150 nm is formed.

Next, an oxide semiconductor film is formed, and is processed into an island-shape oxide semiconductor layer in a photolithography step. In this embodiment, the oxide semiconductor film is formed using an In—Ga—Zn—O-based oxide semiconductor target for film formation by a sputtering method.

In that case, the oxide semiconductor film is preferably formed while moisture remaining in the treatment chamber is removed so that hydrogen, a hydroxyl group, or moisture is prevented from being contained in the oxide semiconductor film.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$), and the like are removed, whereby the concentration of an impurity in the oxide semiconductor film formed in the treatment chamber can be reduced.

As a sputtering gas used for forming the oxide semiconductor film, a high-purity gas is preferably used in which impurities such as hydrogen, water, a hydroxyl group, or hydride are reduced to such a level that the impurity concentration is represented by the unit "ppm" or "ppb".

Next, dehydration or dehydrogenation of the oxide semiconductor layers is performed. The temperature of the first heat treatment for dehydration or dehydrogenation is higher than or equal to 400° C. and lower than or equal to 750° C., preferably higher than or equal to 425° C. Note that in the case where the temperature is higher than or equal to 425° C., the heat treatment time may be one hour or less, whereas in the case where the temperature is lower than 425° C., the heat treatment time is longer than one hour. Here, the substrate is introduced into an electric furnace, that is a kind of heat treatment apparatus, and heat treatment is performed on the oxide semiconductor layers in a nitrogen atmosphere, and then water and hydrogen are prevented from entering the oxide semiconductor layer with the oxide semiconductor layer not exposed to air. In the above manner, the oxide semiconductor layer is obtained. After that, cooling is performed by introduction of a high-purity oxygen gas, a high-purity $N_2O$ gas, or ultra-dry air (having a dew point of −40° C. or lower, preferably −60° C. or lower) into the same furnace. It is preferable that the oxygen gas and the $N_2O$ gas do not include water, hydrogen, and the like. Alternatively, the purity of an oxygen gas or an $N_2O$ gas which is introduced into the heat treatment apparatus is preferably 6N (99.9999%) or higher, more preferably 7N (99.99999%) or higher (that is, the impurity concentration of the oxygen gas or the $N_2O$ gas is 1 ppm or lower, preferably 0.1 ppm or lower).

The heat treatment apparatus is not limited to the electric furnace, and may be, for example, an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. In addition, the LRTA apparatus may be provided with not only a lamp but also a device which heats an object to be processed by heat conduction or heat radiation from a heater such as a resistance heater. GRTA is a method of heat treatment using a high-temperature gas. As the gas, an inert gas which does not react with a process object by heat treatment, such as nitrogen or a rare gas such as argon is used. The heat treatment may be performed at 600° C. to 750° C. for several minutes using an RTA method.

Further, after the first heat treatment for dehydration or dehydrogenation, heat treatment may be performed at higher than or equal to 200° C. and lower than or equal to 400° C., preferably higher than or equal to 200° C. and lower than or equal to 300° C., in an atmosphere of an oxygen gas or an $N_2O$ gas.

The first heat treatment for the oxide semiconductor layer can be performed before the oxide semiconductor film is processed into the island-shaped oxide semiconductor layer. In that case, the substrate is taken out of the heat apparatus after the first heat treatment, and then a photolithography step is performed.

Through the above-described steps, the entire oxide semiconductor film is in an oxygen-excess state, whereby the oxide semiconductor film has high resistance, that is, the oxide semiconductor film has i-type conductivity. Thus, an oxide semiconductor layer 382 the entire region of which has i-type conductivity is obtained.

Next, a conductive film is formed over the gate insulating layer 372b and the oxide semiconductor layer 382. Furthermore, in a photolithography step, a resist mask is formed over the conductive film, and the conductive film is selectively etched to form a source electrode layer 385a and a drain electrode layer 385b, and then, an oxide insulating layer 386 is formed by a sputtering method.

In that case, the oxide insulating layer 386 is preferably formed while moisture remaining in the treatment chamber is removed so that hydrogen, a hydroxyl group, or moisture is prevented from being contained in the oxide semiconductor layer 382 and the oxide insulating layer 386.

In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, a hydrogen atom, a compound containing a hydrogen atom such as water ($H_2O$), and the like are removed, whereby the concentration of an impurity in the oxide insulating layer 386 formed in the treatment chamber can be reduced.

As a sputtering gas used for forming the oxide insulating layer 386, a high-purity gas is preferably used in which impurities such as hydrogen, water, a hydroxyl group, or hydride are reduced to such a level that the impurity concentration is represented by the unit "ppm" or "ppb".

Through the above-described steps, the thin film transistor 380 can be manufactured.

Next, in order to reduce variation in electric characteristics of the thin film transistor, heat treatment (preferably at higher than or equal to 150° C. and lower than 350° C.) may be performed in an inert gas atmosphere or a nitrogen gas atmosphere. For example, the heat treatment is performed at 250° C. in a nitrogen atmosphere for 1 hour.

The heat treatment may be performed at higher than or equal to 100° C. and lower than or equal to 200° C. in an air atmosphere for 1 hour to 30 hours. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. and then decreased to a room temperature. Alternatively, this heat treatment may be performed before formation of the oxide insulating film under reduced pressure. When the heat treatment is performed under reduced pressure, the heat treatment time can be shortened. This heat treatment enables a normally-off thin film transistor. Thus, the reliability can be increased.

Next, a protective insulating layer 373 is formed over the oxide insulating layer 386. In this embodiment, as the protective insulating layer 373, a silicon nitride film with a thickness of 100 nm is formed by a sputtering method.

The protective insulating layer 373 and the first gate insulating layer 372a which are formed of a nitride insulating layer do not contain impurities such as moisture hydrogen, hydride, and hydroxide and have an effect of blocking entry of the impurities from the outside.

Thus, entry of impurities such as moisture from the outside can be prevented in the manufacturing process after the formation of the protective insulating layer 373. Moreover, entry of moisture from the outside can be prevented in the long term even after a device is completed as a semiconductor device; thus, the long-term reliability of the device can be achieved.

Alternatively, a structure may be employed in which the insulating layers provided between the protective insulating layer 373 and the first gate insulating layer 372a which are formed of a nitride insulating layer are removed so that the protective insulating layer 373 is in contact with the first gate insulating layer 372a.

Thus, impurities such as moisture, hydrogen, hydride, and hydroxide can be reduced to a minimum, reentry of the impurities can be prevented, and the concentration of impurities in the oxide semiconductor layer can be maintained low.

Note that a planarization insulating layer for planarization may be provided over the protective insulating layer 373.

As described above, the highly-purified oxide semiconductor layer is used in the thin film transistor, whereby the thin film transistor with reduced off-state current can be provided. In addition, the thin film transistor with reduced off-state current which is described in this embodiment is applied to a pixel in a display device, whereby a period in which a storage capacitor provided in the pixel can hold voltage can be increased. Thus, a display device which consumes less power in displaying a still image or the like can be provided.

This embodiment can be implemented in combination with any of the structures of the other embodiments as appropriate.

Embodiment 10

In this embodiment, another example of a thin film transistor that can be applied to the display device disclosed in this specification will be described. The thin film transistor described in this embodiment can be used as the thin film transistors in Embodiments 2 to 8.

In this embodiment, an example in which light-transmitting conductive materials are used for a gate electrode layer, a source electrode layer, and a drain electrode layer will be described. Other than the above, the thin film transistor can be manufactured in a manner similar to those of the above embodiments, and description of the same parts or parts having functions and process similar to those in the above embodiments is not repeated. In addition, detailed description of the same parts is omitted.

As materials of the gate electrode layer, the source electrode layer, and the drain electrode layer, a conductive material that transmits visible light can be used. For example, any of the following metal oxides can be used: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof is set in the range of greater than or equal to 50 nm and less than or equal to 300 nm as appropriate. As a deposition method of the metal oxide used for the gate electrode layer, the source electrode layer, and the drain electrode layer, a sputtering method, a vacuum evaporation method (an electron beam evaporation method or the like), an arc discharge ion plating method or a spray method is used. When a sputtering method is employed, it is preferable that deposition be performed using a target containing $SiO_2$ of greater than or equal to 2 wt % and less than or equal to 10 wt % and $SiO_x$ (x>0) which inhibits crystallization be contained in the light-transmitting conductive film so as to prevent crystallization of the oxide conductive film at the time of the heat treatment performed later.

Note that the unit of the percentage of components in the light-transmitting conductive film is atomic percent, and the percentage of components is evaluated by analysis using an electron probe X-ray microanalyzer (EPMA).

In a pixel in which the thin film transistor is provided, when a pixel electrode layer, another electrode layer (such as a capacitor electrode layer), or a wiring layer (such as a capacitor wiring layer) is formed using a conductive film that transmits visible light, a display device having high aperture ratio can be realized. Needless to say, it is preferable that each of a gate insulating layer, an oxide insulating layer, a protective insulating layer, and a planarization insulating layer in the pixel be also formed using a film that transmits visible light.

In this specification, a film that transmits visible light means a film having such a thickness as to have transmittance of visible light of 75% to 100%. In the case where the film has conductivity, the film is also referred to as a transparent conductive film. Further, a conductive film which is semi-transmissive with respect to visible light may be used for metal oxide applied to the gate electrode layer, the source electrode layer, the drain electrode layer, the pixel electrode layer, another electrode layer, or another wiring layer. The conductive film which is semi-transmissive with respect to visible light indicates a film having transmittance of visible light of 50% to 75%.

When a thin film transistor has a light-transmitting property as described above, the aperture ratio can be increased. For small liquid crystal display panels of 10 inches or smaller in particular, high aperture ratio can be achieved even when the size of pixels is decreased in order to realize higher resolution of display images by, for example, increasing the number of gate wirings. Further, by using a light-transmitting film for components in a thin film transistor, even when a group of high-density thin film transistors is provided, high aperture ratio can be obtained and a sufficient area of a display region can be secured. Further, a storage capacitor may be formed using the same material by the same step as the component in the thin film transistor so that the storage capacitor can have light-transmitting properties, by which the aperture ratio can be further improved.

As described above, the highly-purified oxide semiconductor layer is used in the thin film transistor, whereby the thin film transistor with reduced off-state current can be provided. In addition, the thin film transistor with reduced off-state current which is described in this embodiment is applied to a pixel in a display device, whereby a period in which a storage capacitor provided in the pixel can hold voltage can be increased. Thus, a display device which consumes less power in displaying a still image or the like can be provided.

This embodiment can be implemented in combination with any of the structures of the other embodiments as appropriate.

Embodiment 11

In this embodiment, an example of a light-emitting element that can be applied to the display device disclosed in this specification will be described with reference to FIG. 15, FIGS. 16A to 16C, and FIGS. 17A and 17B.

In this embodiment, as a display element included in a pixel of a display device, a light-emitting element utilizing electroluminescence will be described as an example. Light-emitting elements utilizing electroluminescence are classified according to whether a light-emitting material is an organic compound or an inorganic compound. In general, the former is referred to as an organic EL element, and the latter is referred to as an inorganic EL element.

The organic EL element includes an anode, a cathode, and a layer containing an organic compound between the anode and the cathode. The potential of the anode is made to be higher than that of the cathode so that holes are injected from the anode and electrons are injected from the cathode to the layer containing an organic compound. When the electrons and holes (carriers) are recombined in the layer containing an organic compound, energy is generated, the organic compound having light-transmitting properties is excited by the generated energy, and light is emitted when the excited organic compound returns to a ground state. Because of such a mechanism, the organic EL element is an example of a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is made here using an organic EL element as a light-emitting element.

FIG. 15 is an equivalent circuit diagram of an example of a pixel configuration.

The configuration and operation of a pixel will be described. Here, one pixel includes two n-channel transistors in each of which an oxide semiconductor layer is used in a channel formation region.

A pixel 6400 includes a switching transistor 6401, a driving transistor 6402, and a light-emitting element 6404. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. A gate of the driving transistor 6402 is connected to the second electrode (the other of the source electrode and the drain electrode) of the switching transistor 6401, the first electrode is connected to a power supply line 6407, and the second electrode is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is a potential smaller than a high power supply potential when the high power supply potential set to the power supply line 6407 is a reference. As the low power supply potential, GND, 0 V, or the like may be adopted, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher.

Further, DC power is supplied to the power supply line 6407. In particular, pulsed DC power is supplied to the power supply line 6407 so that the light-emitting element 6404 can emit pulsed light. By displaying pulsed images at intervals, a plurality of still images can be switched and displayed in order. Such a display can be used for a display of a clock or a watch that ticks away the seconds. Note that DC power without voltage change may be supplied.

In this embodiment, a thin film transistor in which a highly-purified oxide semiconductor layer is included and off-state current is suppressed is used in the pixel portion; thus, potential which is written to the gate of the driving transistor 6402 is held while the switching transistor 6401 is off. Note that a capacitor may be provided between the gate of the driving transistor 6402 and the power supply line 6407.

As an example of a driving method of the light-emitting element 6404, a method of performing analog gray scale driving will be described. Voltage higher than or equal to voltage which is the sum of the forward voltage of the light-emitting element 6404 and $V_{th}$ of the driving transistor 6402 is applied to the gate of the driving transistor 6402. The forward voltage of the light-emitting element 6404 indicates a voltage at which a desired luminance is obtained, and includes at least forward threshold voltage. By inputting a video signal to enable the driving transistor 6402 to operate in a saturation region, current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog gray-scale driving.

Note that an oxide semiconductor layer provided over a substrate has less variation in its characteristics. Therefore, a plurality of thin film transistors each including the oxide semiconductor layer which are arranged in a display region also have uniform characteristics. The driving transistor 6402 has less variation in the characteristics and can be precisely controlled in accordance with gate voltage to which current flowing to the light-emitting element 6404 is written. As a result, the display device that is one embodiment of the present invention is capable of high-quality display with less display unevenness.

Further, a voltage-input voltage-driving method enables an area grayscale display using a plurality of pixels, color display (e.g., R+G+B, R+B, and R+G+B) by combination of a plurality of pixels (R, G, and B) having different emission colors, and the like. In the case of the voltage-input voltage-driving method, a signal is input to the gate of the driving transistor 6402 so that the driving transistor 6402 is completely turned on or off. In other words, the driving transistor 6402 operates in a linear region. Since the driving transistor 6402 operates in the linear region, voltage higher than the voltage of the power supply line 6407 is applied to the gate of the driving transistor 6402. Note that voltage higher than or equal to voltage which is the sum of the voltage of the power supply line and $V_{th}$ of the driving transistor 6402 is applied to the signal line 6405.

Note that also in the case where the light-emitting element 6404 is driven by an analog grayscale driving method or a voltage-input voltage-driving method, the gate potential of the driving transistor 6402 can be held for a long time because off-state current of the switching transistor 6401 per a channel width of 1 μm is suppressed to, for example, lower than or equal to $1\times10^{-16}$ A/μm. Thus, a still image can be displayed in the display portion even with a small number of writing of image signals. The frequency of writing of signals can be reduced, which leads to a reduction in power consumption. Note that the pixel configuration is not limited to that illustrated in FIG. 15. For example, the pixel illustrated in FIG. 15 can further include a switch, a resistor, a capacitor, a transistor, a logic circuit, or the like.

Next, a cross-sectional structure of the pixel will be described with reference to FIGS. 16A to 16C. Note that a thin film transistor including a highly-purified oxide semiconductor layer may be used as a driving TFTs 7011, 7021, and 7001 illustrated in FIGS. 16A, 16B, and 16C, respectively. For example, any of the thin film transistors described in Embodiments 2 to 10 can be used.

Light-emitting elements illustrated in this embodiment each have a structure in which an EL layer is sandwiched between a first electrode and a second electrode.

As for the first electrode and second electrode of the light-emitting element, as an electrode serving as a cathode, the following material having a low work function is preferable, specific examples of which are a rare earth metal such as Yb or Er as well as an alkali metal such as Li or Cs, an alkaline earth metal such as Mg, Ca, or Sr, and an alloy containing any of the above metals (e.g., Mg:Ag or Al:Li); as an electrode serving as an anode, a material having a high work function is preferable, examples of which are titanium nitride, ZrN, Ti, W, Ni, Pt, Cr, and transparent conductive materials such as ITO, IZO (indium zinc oxide), and ZnO. Note that in the case where an electron injection layer is formed in contact with the anode or the case where a hole injection layer is formed in contact with the anode, an influence of the work function of the electrode material can be reduced. The electron injection layer and the hole injection layer may be formed using, for example, a composite material of an organic compound and metal oxide, metal oxide, or a composite material of an organic compound and an alkali metal, an alkaline earth metal, or a compound thereof. Alternatively, the electron injection layer and the hole injection layer can be formed by combining those materials as appropriate.

The EL layer formed over the first electrode may include a single layer or a plurality of layers. In the case where the EL layer includes a plurality of layers, a structure in which an anode, a hole injection layer, a hole transport layer, a light-emitting layer, an electron transport layer, an electron injection layer, and a cathode are stacked in this order and in contact with one another can be given as an example. Note that not all of these layers are necessarily provided. Alternatively, a structure may be employed in which a plurality of EL layers which are separated by an intermediate layer serving as a charge generation layer are provided between the first electrode and the second electrode.

At least one of the first electrode and the second electrode is formed using a conductive film having light-transmitting properties so that light emission is extracted from the light-emitting element. According to the classification based on the direction in which light emitted from the light-emitting element formed over a substrate is extracted, there are three typical structures of light-emitting elements; a top emission structure in which light is extracted from the side where the light-emitting element is formed, a bottom emission structure in which light is extracted from the substrate side, and a dual emission structure in which light is emitted from both the substrate side and the side where the light-emitting element is formed.

In the case where the EL layer is stacked over the first electrode, a peripheral portion of the first electrode is covered with a partition. The partition is formed using, for example, an organic resin film of polyimide, acrylic, polyamide, or epoxy; an inorganic insulating film, or organic polysiloxane. The partition is preferably formed using a photosensitive material for the following reason: if an opening is formed in the photosensitive resin material which covers the first electrode with the partition left in the peripheral portion of the first electrode, a side surface from the partition to the opening is formed as an inclined surface with continuous curvature and a step of forming a resist mask can be omitted.

Note that a color filter can be formed between the substrate and the light-emitting element. The color filter may be formed by a droplet discharge method such as an inkjet method, a printing method, an etching method using a photolithography technique, or the like.

Further, it is preferable that an overcoat layer be formed over the color filter and a protective insulating layer be additionally formed. The provision of the overcoat layer allows unevenness caused by the color filter to be eliminated. The provision of the protective insulating film can prevent impurities from being dispersed from the color filter to the light-emitting element.

Note that in the case where the light-emitting element is formed over the protective insulating layer, the overcoat layer, and the insulating layer which are formed over the thin film transistor, a contact hole which penetrates the protective insulating layer, the overcoat layer, and the insulating layer and reaches a source electrode layer or a drain electrode layer of the thin film transistor is formed. In particular, the contact hole is preferably formed at a position overlapping with the above-described partition, in which case aperture ratio can be prevented from being reduced.

A structure of the pixel including a light-emitting element having a bottom emission structure will be described. FIG. 16A is a cross-sectional view of the driving TFT 7011 and a light-emitting element 7012 which are provided in the pixel.

In the driving TFT 7011, an insulating layer, an oxide semiconductor layer, a source and drain electrode layers, a gate insulating layer, and a gate electrode layer are provided over a substrate, and a wiring layer is provided so as to be electrically connected to each of the source and drain electrode layers.

An insulating layer 7031 is formed covering the driving TFT 7011, and a color filter 7033 having opening is provided over the insulating layer 7031. A light-transmitting conductive film 7017 is formed over an overcoat layer 7034 and an insulating layer 7035 which are formed covering the color filter 7033. Note that the drain electrode of the driving TFT 7011 and the conductive film 7017 are electrically connected to each other through an opening formed in the overcoat layer 7034, the insulating layer 7035, and the insulating layer 7031. Note that a first electrode 7013 of the light-emitting element 7012 is provided on and in contact with the conductive film 7017.

In the light-emitting element 7012, an EL layer 7014 is sandwiched between the first electrode 7013 and the second electrode 7015.

As the light-transmitting conductive film 7017, a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used.

Here, the case where the first electrode 7013 of the light-emitting element 7012 is used as a cathode will be described. In the case where the first electrode 7013 is used as a cathode, it is preferably formed using a metal having a low work function. In FIG. 16A, the first electrode 7013 is formed to have a thickness that allows light transmission (preferably, approximately 5 nm to 30 nm). For example, an aluminum film or an Mg—Ag alloy film with a thickness of 20 nm is used for the first electrode 7013.

Note that the light-transmitting conductive film 7017 and the first electrode 7013 are preferably formed in such a manner that a light-transmitting conductive film and an aluminum film are stacked and selectively etched, in which case the light-transmitting conductive film 7017 and the first electrode 7013 can be etched using the same mask.

For the second electrode 7015 formed over the EL layer 7014, a material having a high work function is preferably used. Further, a light-blocking film 7016, for example, a metal which blocks light, a metal which reflects light, or the like is provided over the second electrode 7015. In this embodiment, an ITO film is used as the second electrode 7015 and a Ti film is used as the light-blocking film 7016.

The color filter 7033 is covered with the overcoat layer 7034, and is additionally covered with the protective insulating layer 7035. Although the overcoat layer 7034 with a small thickness is illustrated in FIG. 16A, the overcoat layer 7034 has a function to eliminate unevenness caused by the color filter 7033.

Further, the contact hole which is formed in the overcoat layer 7034 and the protective insulating layer 7035 and reaches a drain electrode layer 7030 is located at a position overlapping with a partition 7019.

In the case of the pixel structure illustrated in FIG. 16A, light is emitted from the light-emitting element 7012 to the first electrode 7013 side to pass through the color filter 7033 to the outside of the display device as indicated by arrows.

Note that FIG. 16A illustrates an example in which the driving TFT 7011 includes the gate electrode layer, the source electrode layer, and a light-transmitting conductive film as the drain electrode layer. Thus, part of light emitted from the light-emitting element 7012 passes through the color filter 7033 and the driving TFT 7011 to be extracted.

Next, a structure of the pixel including a light-emitting element having a dual emission structure will be described. FIG. 16B is a cross-sectional view of the driving TFT 7021 and a light-emitting element 7022 which are provided in the pixel.

In the driving TFT 7021, an insulating layer, an oxide semiconductor layer, a source and drain electrode layers, a gate insulating layer, and a gate electrode layer are provided over a substrate, and a wiring layer is provided so as to be electrically connected to each of the source and drain electrode layers.

An insulating layer 7041 is formed covering the driving TFT 7021, and a color filter 7043 having opening is provided over the insulating layer 7041. A light-transmitting conductive film 7027 is formed over an overcoat layer 7044 and an insulating layer 7045 which are formed covering the color filter 7043. Note that the drain electrode of the driving TFT 7021 and the conductive film 7027 are electrically connected to each other through an opening formed in the overcoat layer 7044, the insulating layer 7045, and the insulating layer 7041. Note that a first electrode 7023 of the light-emitting element 7022 is provided on and in contact with the conductive film 7027.

In the light-emitting element 7022, an EL layer 7024 is sandwiched between the first electrode 7023 and the second electrode 7025.

Here, the case where the first electrode 7023 of the light-emitting element 7022 is used as a cathode will be described. The light-transmitting conductive film 7027 may be formed in a manner similar to that of the conductive film illustrated in FIG. 16A. The first electrode 7023 may be formed in a manner similar to that of the first electrode 7013 illustrated in FIG. 16A. The EL layer 7024 may be formed in a manner similar to that of the EL layer 7014 illustrated in FIG. 16A. Therefore, detailed description of those layers is not given here.

The second electrode 7025 formed over the EL layer 7024 functions as an anode here, it is preferably formed using a material having a high work function, such as a transparent conductive material (e.g., ITO, IZO, or ZnO). In this embodiment, ITO is formed as the second electrode 7025.

A color filter 7043, an overcoat layer 7044, and a protective insulating layer 7045 may be formed in manners similar to those of the color filter 7033, the overcoat layer 7034, and the protective insulating layer 7035 included in the pixel illustrated in FIG. 16A.

In the case of the pixel structure illustrated in FIG. 16B, light is emitted from the light-emitting element 7022 to both the first electrode 7023 side and the second electrode 7025 side as indicated by arrows, and the light on the first electrode 7023 side passes through the color filter 7043 to the outside of the display device.

Note that FIG. 16B illustrates an example in which the driving TFT 7021 includes the gate electrode layer, the source electrode layer, and a light-transmitting conductive film as the drain electrode layer. Thus, part of light emitted from the light-emitting element 7022 passes through the color filter 7043 and the driving TFT 7021 to be extracted.

Further, a contact hole which is formed in the overcoat layer 7044 and the insulating layer 7045 and reaches a drain electrode layer 7040 is located at a position overlapping with a partition 7029. The contact hole which reaches the drain electrode layer and the partition 7029 overlap with each other, whereby the aperture ratio on the second electrode 7025 side can be substantially the same as that on the first electrode 7023 side.

Note that in the case where full color display is performed on both display surfaces of the light-emitting element having a dual emission structure, light from the second electrode 7025 side does not pass through the color filter layer 7043; therefore, a sealing substrate provided with another color filter layer is preferably provided on the second electrode 7025.

Next, a structure of the pixel including a light-emitting element having a top emission structure will be described. FIG. 16C is a cross-sectional view of the driving TFT 7001 and a light-emitting element 7002 which are provided in the pixel.

In the driving TFT 7001, an insulating layer, an oxide semiconductor layer, a source and drain electrode layers, a gate insulating layer, and a gate electrode layer are provided over a substrate, and a wiring layer is provided so as to be electrically connected to each of the source and drain electrode layers.

An insulating layer 7051 is formed covering the driving TFT 7001, and an insulating layer 7053 having an opening is provided over the insulating layer 7051. A first electrode 7003 is formed over an insulating layer 7055 which is formed covering the insulating layer 7053. Note that the drain electrode of the driving TFT 7001 and the first electrode 7003 are electrically connected to each other through an opening formed in the insulating layer 7055 and an insulating layer 7051.

Note that the insulating layer 7053 can be formed using a resin material such as polyimide, acrylic, benzocyclobutene, polyamide, or epoxy. In addition to the resin materials given above, it is also possible to use a low-dielectric constant material (a low-k material), a siloxane-based resin, phosphosilicate glass (PSG), borophosphosilicate glass (BPSG), or the like. Note that the insulating layer 7053 may be formed by stacking a plurality of insulating films formed of these materials. There is no particular limitation on the method for forming the insulating layer 7053. The planarization insulating layer can be formed, depending on the material, by a method such as a sputtering method, an SOG method, spin coating, dip coating, spray coating, or a droplet discharge method (such as an inkjet method, screen printing, offset printing, or the like), or a tool (equipment) such as a doctor knife, a roll coater, a curtain coater, or a knife coater. For example, the formation of the insulating layer 7053 allows unevenness caused by the driving TFT to be eliminated.

In the light-emitting element 7002, an EL layer 7004 is sandwiched between the first electrode 7003 and the second electrode 7005. As for the light-emitting element 7002 illustrated in FIG. 16C, the case where the first electrode 7003 is used as a cathode will be described.

A material similar to that of the first electrode 7013 illustrated in FIG. 16A may be used for the first electrode 7003. However, it is preferable that in the light-emitting element having a top emission structure illustrated in FIG. 16C, the first electrode 7003 do not have light-transmitting properties but be an electrode having high reflectance. The use of an electrode having high reflectance makes it possible to increase light extraction efficiency.

As the first electrode 7003, for example, an aluminum film, an alloy film containing aluminum as a main component, or a layer in which a titanium film is stacked over an aluminum film is preferably used. In FIG. 16C, a layer in which a Ti film, an aluminum film, and a Ti film are stacked in this order is used as the first electrode 7003.

The EL layer 7004 may be formed in a manner similar to that of the EL layer 7014 illustrated in FIG. 16A. The second electrode 7005 may be formed in a manner similar to that of the second electrode 7025 illustrated in FIG. 16B. Therefore, detailed description of those layers is not given here.

In the case of the pixel structure illustrated in FIG. 16C, light is emitted from the light-emitting element 7002 to the second electrode 7005 side as indicated by arrows.

In the case where full color display is performed using the structure illustrated in FIG. 16C, for example, the light-emitting element 7002 is used as a green light-emitting element, one of adjacent light-emitting elements is used as a red light-emitting element, and the other of the adjacent light-emitting element is used as a blue light-emitting element. Alternatively, a light-emitting display device capable of full color display may be manufactured using four kinds of light-emitting elements which include a white light-emitting element in addition to three kinds of light-emitting elements.

Alternatively, a light-emitting display device capable of full color display may be manufactured in such a way that all of a plurality of light-emitting elements which are arranged in the structure illustrated in FIG. 16C is white light-emitting elements and a sealing substrate having a color filter or the like is arranged on the light-emitting elements including the light-emitting element 7002. A element which exhibits a monochromatic color such as white is formed and combined with a color filter or a color conversion layer, whereby full color display can be performed.

Needless to say, display of monochromatic light may also be performed. For example, a lighting device may be formed with the use of white light emission, or an area-color light-emitting device may be formed with the use of a monochromatic color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which the thin film transistor (the driving TFT) which controls the driving of the light-emitting element is electrically connected to the light-emitting element; however, a structure may be employed in which a TFT for current control is connected between the driving TFT and the light-emitting element.

Figure 17A:
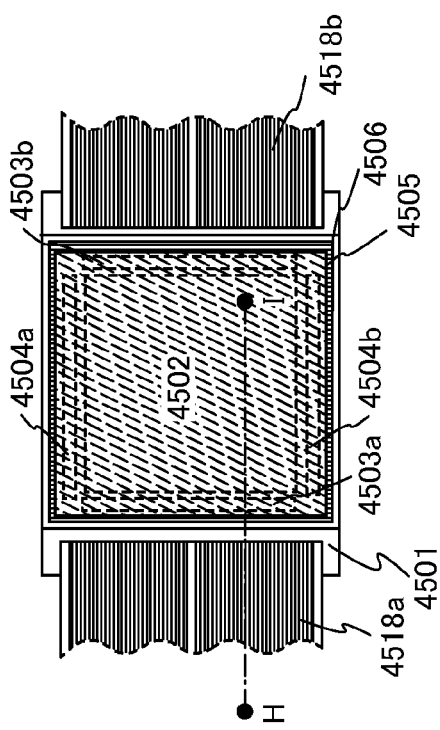
FIG. 17A is a top view of a light-emitting device according to Embodiment.
Figure 17B:
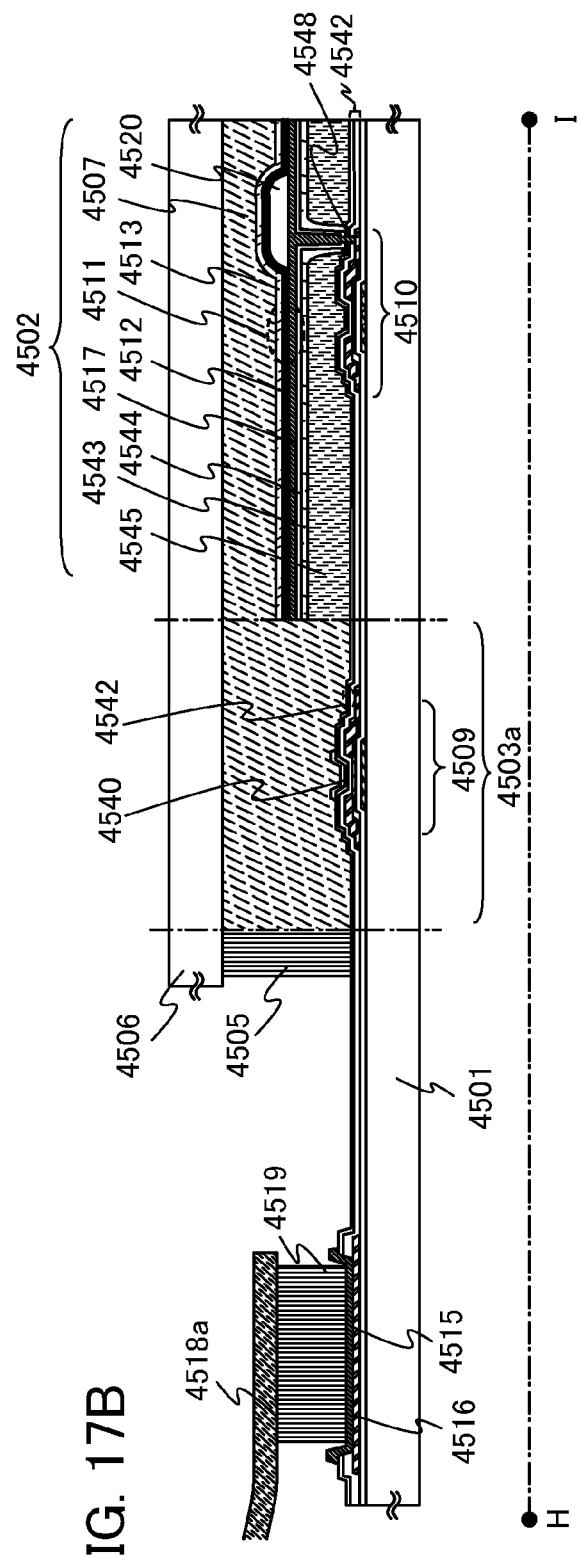
FIG. 17B is a cross-sectional view thereof.

Next, the appearance and cross section of a light-emitting display panel (also referred to as a light-emitting panel) which corresponds to one embodiment of the display device will be described with reference to FIGS. 17A and 17B. FIG. 17A is a top view of a panel in which a thin film transistor and a light-emitting element formed over a first substrate are sealed between the first substrate and a second substrate with a sealant. FIG. 17B is a cross-sectional view taken along line H-I of FIG. 17A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 17B. An insulating layer 4542 is provided over the thin film transistors 4509 and 4510. In addition, a source electrode layer or a drain electrode layer of the thin film transistor 4510 is electrically connected to a first electrode layer 4517 of a light-emitting element 4511 through a contact hole formed in the insulating layer 4542.

Any of the thin film transistors including a highly-purified oxide semiconductor layer which are described in Embodiments 1 to 10 is used as the thin film transistors 4509 and 4510.

A conductive layer 4540 is provided over part of an insulating layer 4542, which overlaps with a channel formation region of an oxide semiconductor layer in the thin film transistor 4509 for a driver circuit. The provision of the conductive layer 4540 in the position overlapping with the channel formation region of the oxide semiconductor layer makes it possible to reduce the amount of change in threshold voltage of the thin film transistor 4509 before and after a BT stress test (a bias-temperature stress test). In this specification, the BT stress test (the bias-temperature stress test) refers to a test in which a high gate voltage is applied to a thin film transistor in a high-temperature atmosphere. Further, the potential of the conductive layer 4540 may be the same as or different from that of a gate electrode layer of the thin film transistor 4509. The conductive layer 4540 can function also as a second gate electrode layer. Alternatively, the potential of the conductive layer 4540 may be GND or 0 V, or the conductive layer 4540 may be in a floating state.

Note that the structure of the light-emitting element 4511 is not limited to a stacked-layer structure of the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed as a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

Further, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

A connection terminal electrode 4515 is formed using the same conductive film as the first electrode layer 4517 included in the light-emitting element 4511. A terminal electrode 4516 is formed using the same conductive film as the source and drain electrode layers included in the thin film transistors 4509 and 4510.

The connection terminal electrode 4515 is electrically connected to a terminal included in the FPC 4518*a* through an anisotropic conductive film 4519.

The substrate located in the direction in which light emitted from the light-emitting element 4511 is extracted needs to have light-transmitting properties. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

Further, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. The polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 17A and 17B.

The above-described structure makes it possible to provide a display device in which the thin film transistor in which the highly-purified oxide semiconductor layer is included and off-state current is reduced is used. Since the thin film transistor in which off-state current is reduced is used in a pixel, a capacitor provided in the pixel can hold voltage for a long time. As a result, a display device whose operation at the time of display of a still image or the like is stabilized and which consumes less power can be provided.

This embodiment can be implemented in combination with any of the structures of the other embodiments as appropriate.

Embodiment 12

In this embodiment, one embodiment of a display device in which a light-storing layer is provided in a pixel portion will be described with reference to FIG. 18.

Figure 18:
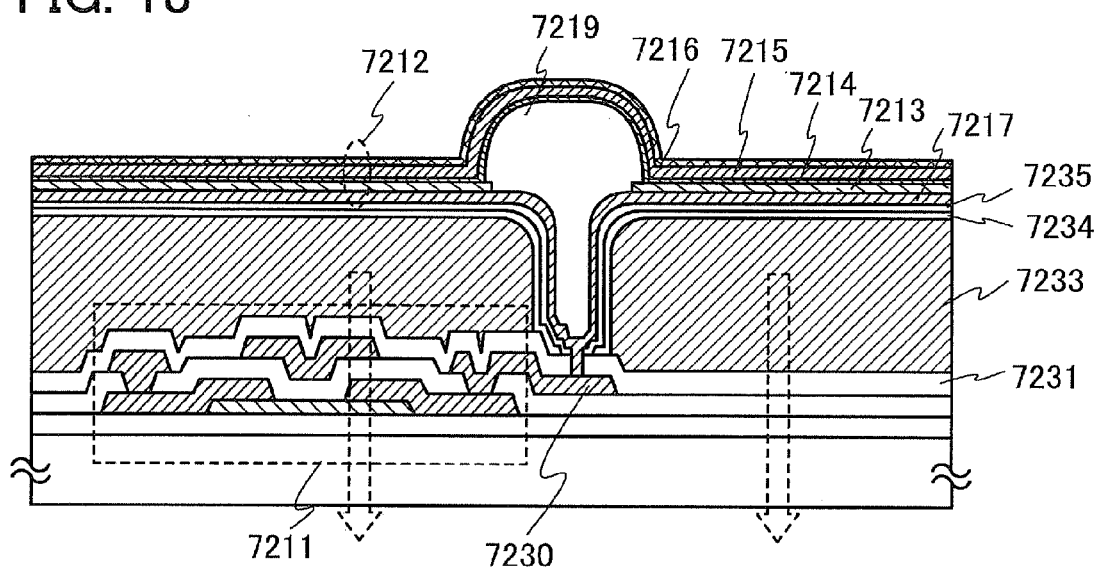
FIG. 18 is a cross-sectional view of a pixel according to Embodiment.

FIG. 18 is a cross-sectional view of a pixel portion having a bottom emission structure and illustrates a driving TFT 7211 and a light-emitting element 7212 which are provided in a pixel.

In the driving TFT 7211, an insulating layer, an oxide semiconductor layer, a source and drain electrode layers, a gate insulating layer, and a gate electrode layer are provided over a substrate, and a wiring layer is provided so as to be electrically connected to each of the source and drain electrode layers.

Further, an insulating layer 7231 is formed covering the driving TFT 7211, and a light-storing layer 7233 having an opening is provided over the insulating layer 7231. A light-transmitting conductive film 7217 is formed over an overcoat layer 7234 and an insulating layer 7235 which are formed covering the light-storing layer 7233. Note that a drain electrode 7230 of the driving TFT 7211 and the conductive film 7217 are electrically connected to each other through an opening formed in the overcoat layer 7234, the insulating layer 7235, and the insulating layer 7231. Note that a first electrode 7213 of the light-emitting element 7212 is provided on and in contact with the conductive film 7217.

The driving TFT 7211 and the light-emitting element 7212 can be formed by the method described in Embodiment 11. Therefore, the detailed description is not given here.

The light-storing layer 7233 contains a light-storing material and stores light emitted from the light-emitting element adjacent thereto. Even after the light-emitting element stops emitting light, the light-storing material contained in the light-storing layer 7233 continues to emit light. In this embodiment, as the light-storing material, copper activated zinc sulfide (ZnS:Cu) is used. Alternatively, a phosphor in which an activator is added using sulfide such as strontium sulfide (SrS) as a base material; alkaline earth aluminate in which a rare earth element is added as an activator, such as $CaAl_2O_4$:Eu, $CaAl_2O_4$:Nd, $Sr_4Al_{14}O_{25}$:Eu, $Sr_4Al_{14}O_{25}$:Dy, $SrAl_2O_4$:Eu, or $ArAl_2O_4$:Dy; or the like may be used.

The period in which the light-storing layer 7233 keeps emitting light can be changed depending on the kind of light-storing material to be used. The period in which the light-storing layer 7233 keeps emitting light, that is, the light-remaining period depends on the kind of light-storing material; therefore, the material is selected in accordance with an intended purpose. For example, for a display device used in the case where displayed contents do not need to be changed frequently, a light-storing material which has long light-remaining time may be selected. In addition, in the case where display is changed relatively frequently, a light-storing material which has short light-remaining time may be selected. Note that in the case where the light-storing material is an inorganic particle, it has a grain diameter of greater than or equal to 1 nm and less than or equal to 10 μm, preferably greater than or equal to 10 nm and less than or equal to 5 μm. The reason for the range of grain diameter given above is as follows: if the grain size is less than or equal to 1 nm, light-storing properties is lost, and if the grain size is greater than or equal to 10 μm, the planarity of the light-storing layer is damaged, which makes it difficult to manufacture a light-emitting element.

In addition, in this embodiment, the light-storing layer 7233 contains a binder polymer and is formed using a dispersion liquid in which light-storing materials are dispersed, by selecting a droplet discharge method such as an ink-jet method, a printing method, a spin coating method, an etching method using a photolithography technique, or the like as appropriate.

Further, the light-storing layer 7233 is covered with the overcoat layer 7234, and the overcoat layer 7234 is covered with the insulating layer 7235. Note that although the overcoat layer 7234 is illustrated to have a small thickness in FIG. 18, the overcoat layer 7234 has a function of eliminating the unevenness of the light-storing layer 7233.

Note that the position where the light-storing layer is provided is not limited to the position between a user of the display device and the light-emitting element. For example, a light-emitting element having a dual emission structure in which an EL layer is sandwiched between a pair of electrodes having light-transmitting properties has light-transmitting properties. In the case where the light-emitting element has light-transmitting properties as described above, the light-storing layer can be arranged on the back surface side of a light-emitting layer from the side of the user of the display device. In other words, the light-emitting element can be provided between the light-storing layer and the user of the display device. When the light-emitting element is provided between the user of the display device and the light-storing layer, the light-storing layer does not necessarily need to have light-transmitting properties. Thus, the light-storing material can be selected from a wide range of materials. Specifically, a light-storing material with a grain size of less than or equal to 100 μm can be used.

The above-described structure makes it possible to provide a display device in which the light-storing layer and the thin film transistor in which a highly-purified oxide semiconductor layer is included are used in the pixel portion. Since the thin film transistor in which off-state current is reduced is used in a pixel of the display device, a capacitor provided in the pixel can hold voltage for a long time. As a result, a display device whose operation at the time of display of a still image or the like is stabilized and which consumes low power can be provided.

Further, according to one embodiment of the present invention, a self-luminous display device that is excellent in visibility and can display images even in an environment in which outside light is weak can be provided. In addition, a display device in which flicker is not noticeable even when an emission interval of the light-emitting element is long can be provided because the light-storing layer in which a light-storing material is used is included in the pixel portion. Moreover, a display device which can be kept using for a long time can be provided because energy can be given to a light-storing material by driving a light-emitting element even in an environment in which outside light is weak.

This embodiment can be implemented in combination with any of the structures of the other embodiments as appropriate.

Embodiment 13

In this embodiment, examples of electronic devices each including the display device described in the above embodiment will be described.

Figure 19A:
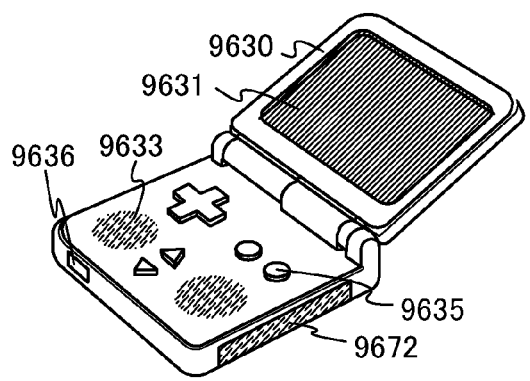
FIGS. 19A to 19C illustrate electronic devices according to Embodiment.

FIG. 19A illustrates a portable game machine, which includes a chassis 9630, a display portion 9631, a speaker 9633, operation keys 9635, a connection terminal 9636, a recording medium reading portion 9672, and the like. The portable game machine illustrated in FIG. 19A can have a function of reading a program or data stored in a recording medium to display on the display portion; a function of sharing information by wireless communication with another portable game machine; and the like. Note that the portable game machine illustrated in FIG. 19A can have a variety of functions without limitation to the above-described functions.

Figure 19B:
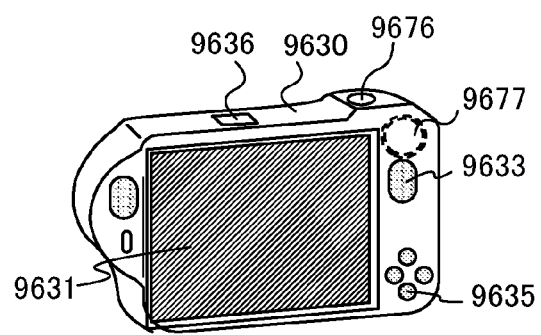

FIG. 19B illustrates a digital camera, which includes a chassis 9630, a display portion 9631, a speaker 9633, operation keys 9635, a connection terminal 9636, a shutter button 9676, an image receiving portion 9677, and the like. The digital camera having the television receiving function, which is illustrated in FIG. 19B, can have a function of photographing a still image; a function of shooting a moving image; a function of automatically or manually correcting the photographed image; a function of obtaining a variety of information from an antenna; a function of holding the photographed image or the information obtained from the antenna; a function of displaying the photographed image or the information obtained from the antenna on the display portion; and the like. Note that the digital camera having the television receiving function illustrated in FIG. 19B can have a variety of functions without limitation to the above-described functions.

Figure 19C:
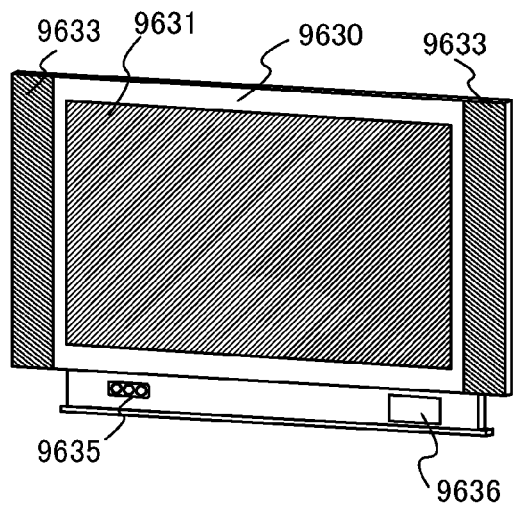

FIG. 19C illustrates a television receiver, which includes a chassis 9630, a display portion 9631, a speaker 9633, operation keys 9635, a connection terminal 9636, and the like. The television receiver illustrated in FIG. 19C can have a function of processing an electric wave for television and converting the electric wave into a pixel signal; a function of processing the pixel signal and converting the pixel signal into a signal suitable for display; a function of converting a frame frequency of the pixel signal; and the like. Note that the television receiver illustrated in FIG. 19C can have a variety of functions without limitation the to the above-described functions.

Figure 20A:
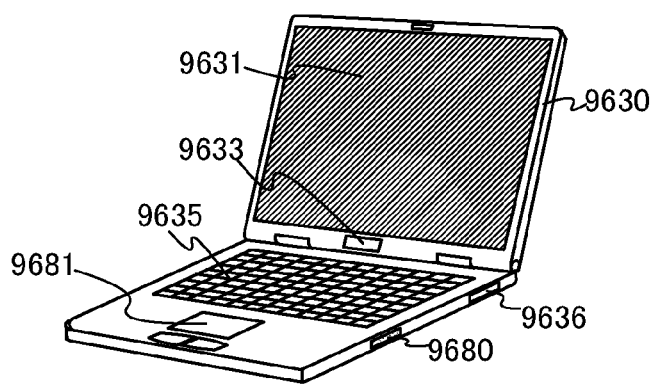
FIGS. 20A to 20C illustrate electronic devices according to Embodiment.

FIG. 20A illustrates a computer, which includes a chassis 9630, a display portion 9631, a speaker 9633, operation keys 9635, a connection terminal 9636, a pointing device 9681, an external connection port 9680, and the like. The computer illustrated in FIG. 20A can have a function of displaying various kinds of information (e.g., a still image, a moving image, and a text image) on the display portion; a function of controlling processing by various kinds of software (programs); a communication function such as wireless communication or wire communication; a function of connecting with various computer networks by using the communication function; a function of transmitting or receiving various kinds of data by using the communication function; and the like. Note that the computer illustrated in FIG. 20A can have a variety of functions without limitation to the above-described functions.

Figure 20B:
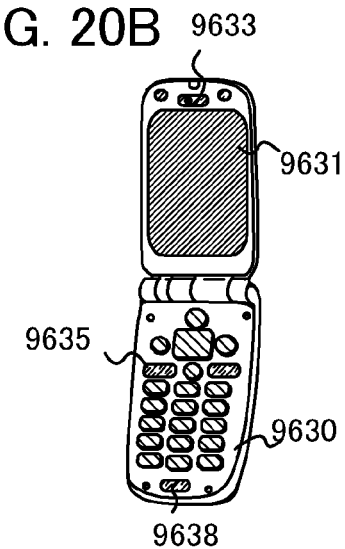

FIG. 20B illustrates a mobile phone, which includes a chassis 9630, a display portion 9631, a speaker 9633, operation keys 9635, a microphone 9638, and the like. The mobile phone illustrated in FIG. 20B can have a function of displaying various kinds of information (e.g., a still image, a moving image, and a text image); a function of displaying a calendar, the date, the time, and the like on the display portion; a function of operating or editing the information displayed on the display portion; a function of controlling processing by various kinds of software (programs); and the like. Note that the mobile phone illustrated in FIG. 20B can have a variety of functions without limitation to the above-described functions.

Figure 20C:
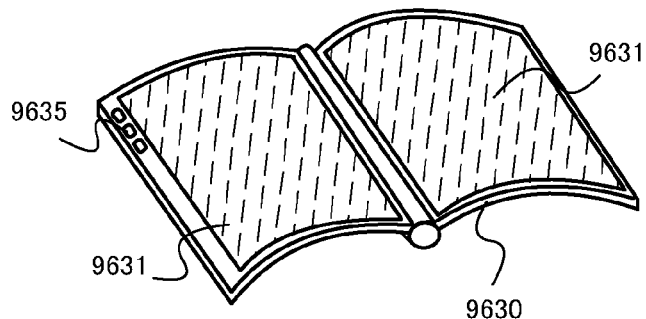

FIG. 20C illustrates an electric device including electronic paper (the electric device is also referred to as an e-book reader), which includes a chassis 9630, a display portion 9631, operation keys 9635, and the like. The electronic paper illustrated in FIG. 20C can have various functions such as a function of displaying various kinds of information (e.g, a still image, a moving image, and a text image); a function of displaying a calendar, the date, the time, and the like on the display portion; a function of operating or editing the information displaying on the display portion; and a function of controlling processing by various kinds of software (programs). Note that the electronic paper illustrated in FIG. 20C can have a variety of functions without limitation to the above-described functions.

As for the electronic devices described in this embodiment, off-state current can be reduced in a plurality of pixels included in the display portion. Thus, voltage can be held in a capacitor for a long time, which results in an electronic device provided with a display device which consumes less power at the time of displaying a still image or the like. In addition, an increase in aperture ratio is achieved, which results in a display device including a high-definition display portion.

Further, according to one embodiment of the present invention, a self-luminous display device that is excellent in visibility and can display images even in an environment in which outside light is weak can be provided. In addition, in the case where the light-storing layer in which a light-storing material is used is included in the pixel portion, a display device in which flicker is not noticeable even when an emission interval of the light-emitting element is long can be provided. Moreover, a display device which can be kept using for a long time can be provided because energy can be given to a light-storing material by driving a light-emitting element even in an environment in which outside light is weak.

This embodiment can be implemented in combination with any of the structures of the other embodiments as appropriate.

Embodiment 14

Figure 25:
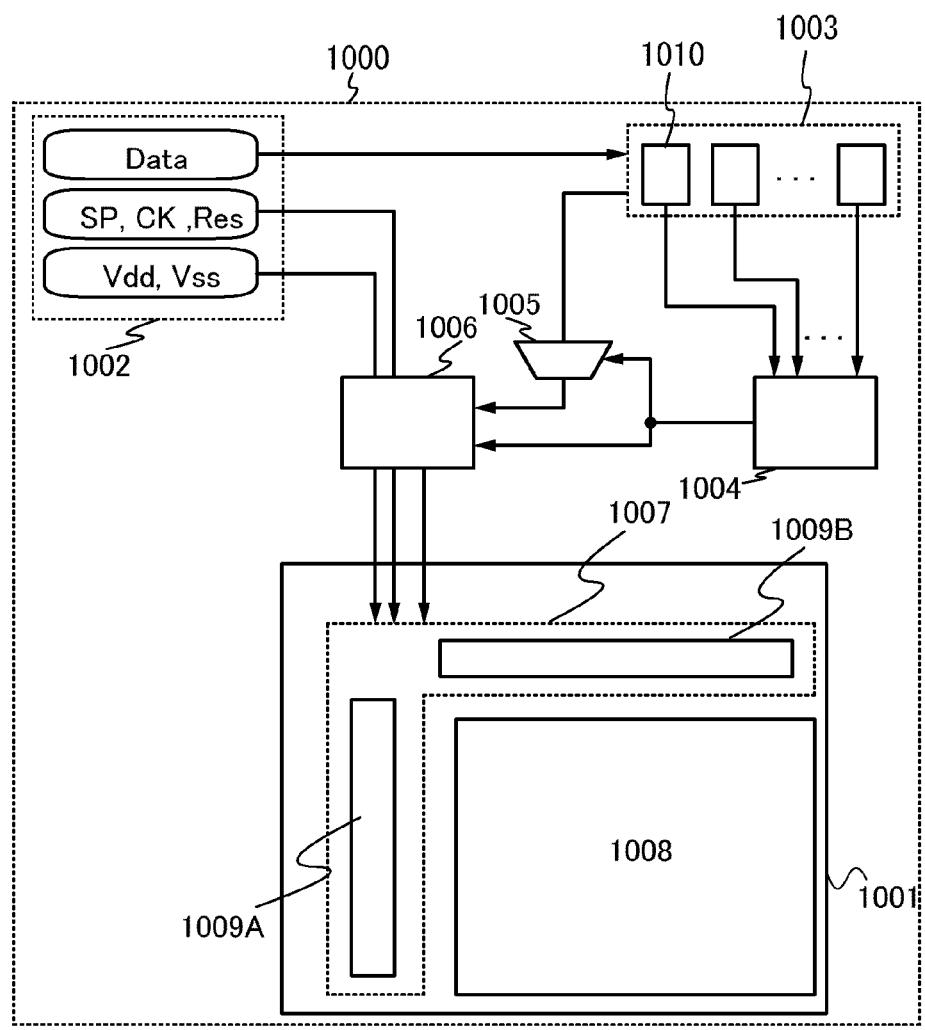
FIG. 25 is a block diagram illustrating a structure of a display device according to Embodiment.

In this embodiment, a block diagram of a display device, and shutdown procedure and startup procedure of operation in a driver circuit will be described. First, a block diagram of the display device will be described with reference to FIG. 25.

A display device 1000 described in this embodiment includes a display panel 1001, a signal generation circuit 1002, a memory circuit 1003, a comparison circuit 1004, a selection circuit 1005, and a display control circuit 1006.

The display panel 1001 includes, for example, a driver circuit portion 1007 and a pixel portion 1008. A gate line driver circuit 1009A and a signal line driver circuit 1009B are included. The gate line driver circuit 1009A and the signal line driver circuit 1009B are driver circuits for driving the pixel portion 1008 including a plurality of pixels. The gate line driver circuit 1009A, the signal line driver circuit 1009B, and the pixel portion 1008 may be formed using thin film transistors formed over one substrate.

Note that an n-channel thin film transistor in which a semiconductor layer is formed of an oxide semiconductor is used as some or all of thin film transistors included in the gate line driver circuit 1009A, the signal line driver circuit 1009B, and the pixel portion 1008. Note that the gate line driver circuit 1009A or the signal line driver circuit 1009B in the driver circuit portion 1007 may be formed over the same substrate or different substrates.

The signal generation circuit 1002 is a circuit which generates a pulse signal for outputting a signal for performing a display in the pixel portion 1008 by the gate line driver circuit 1009A and the signal line driver circuit 1009B. In addition, the signal generation circuit 1002 is a circuit for outputting a signal to the driver circuit portion 1007 through a wiring and a circuit for outputting an image signal (also referred to as video voltage, a video signal, and video data) to the memory circuit 1003 through a wiring. In other words, the signal generation circuit 1002 is a circuit for generating and outputting a control signal for driving the driver circuit portion 1007 and an image signal to be supplied to the pixel portion.

Specifically, the signal generation circuit 1002 supplies, as a control signal, a high power supply potential Vdd that is power supply voltage to the gate line driver circuit 1009A and the signal line driver circuit 1009B. In addition, the signal generation circuit 1002 generates start pulse SP and a clock signal CK for the gate line driver circuit 1009A to output them to the gate line driver circuit 1009A, and generates start pulse SP and a clock signal CK for the signal line driver circuit 1009B to output them to the signal line driver circuit 1009B. Moreover, the signal generation circuit 1002 outputs image signal data for displaying a moving image or a still image to the memory circuit 1003.

Note that a moving image refers to an image which is recognized as a moving image by the human eye by switching a plurality of images at high speed which are time-divided into a plurality of frames. Specifically, a moving image refers to a series of image signals which can be recognized as a moving image with less flicker by the human eye by switching images at least 60 times (60 frames) per second. In contrast, a still image refers to image signals which do not change in a series of frame periods, for example, in the n-th frame and (n+1)th frame, unlike the moving image, a plurality of images which are time-divided into a plurality of frames are switched at high speed.

Note that the signal generation circuit 1002 may generate other signals such as an image signal and a latch signal. The signal generation circuit 1002 may output, to the gate line driver circuit 1009A and/or the signal line driver circuit 1009B, a reset signal Res for stopping output of a pulse signal to each driver circuit. Note that each signal may be composed of a plurality of signals such as a first clock signal and a second clock signal.

Note that high power supply potential Vdd refers to a potential which is higher than a reference potential, and a low power supply potential refers to a potential which is lower than or equal to the reference potential. Note that both the high power supply potential and the low power supply potential are preferably potential such that a transistor can operate.

Note that voltage refers to a potential difference between a given potential and a reference potential (e.g., a ground potential) in many cases. Accordingly, voltage, potential and a potential difference can be referred to as potential, voltage, and a voltage difference, respectively.

Note that in the case where an image signal output from the signal generation circuit 1002 to the memory circuit 1003 is an analog signal, the signal may be switched into a digital signal through an A/D converter or the like to be output to the memory circuit 1003.

The memory circuit 1003 includes a plurality of frame memory 1010 for storing image signals for a plurality of frames. The number of frame memory included in the memory circuit 1003 is not particularly limited and may be an element that can store the image signals on a plurality of frames. Note that the frame memory may be formed using a memory element such as dynamic random access memory (DRAM) or static random access memory (SRAM).

Note that the number of frame memories 1010 is not particularly limited as long as an image signal can be stored for each frame period. In addition, the image signals of the frame memories 1010 are selectively read out by the comparison circuit 1004 and the selection circuit 1005.

The comparison circuit 1004 is a circuit which selectively reads out image signals in a series of frame periods stored in the memory circuit 1003, compares the image signals, and detects a difference thereof. In the case where the difference is detected by the comparison of the image signals by the comparison circuit 1004, a moving image is recognized in the series of frame periods from which the different is detected, whereas, in the case where the difference is not detected by the comparison of the image signals by the comparison circuit 1004, a still image is recognized in the series of frame periods from which the difference is not detected. In other words, the detection of the different by the comparison circuit 1004 determines whether the image signals in the series of frame periods are image signals for displaying a moving image or image signals for displaying a still image. Note that the difference obtained by the comparison may be set to be detected when the difference exceeds a certain level.

The selection circuit 1005 includes a plurality of switches such as thin film transistors, and is a circuit which selects, when image signals for displaying a moving image are determined by the difference detection in the comparison circuit 1004, the image signals from the frame memories 1010 in which the image signals are stored, and outputs to the display control circuit 1006. Note that in the case were a difference of image signals between frames compared by the comparison circuit is not detected, an image displayed in the frames is a still image. In that case, a structure may be employed in which an image signal of the frame period is not output to the display control circuit 1006.

The display control circuit 1006 is a circuit which switches supplying and stop of supplying of the image signal and the control signal such as the high power supply potential Vdd, the low power supply potential Vss, the start pulse SP, the clock pulse CK, and the reset signal Res to the driver circuit portion 1007. Specifically, when an image is determined to be a moving image by the comparison circuit 1004, that is, a difference of image signals in a series of frames is detected, the image signals are supplied from the selection circuit 1005 to the driver circuit portion 1007 through the display control circuit 1006, and the control signals are supplied to the driver circuit portion 1007 through the display control circuit 1006. On the other hand, when an image is determined to be a still image by the comparison circuit 1004, that is, a difference of image signals in a series of frames is not detected, the image signal of the latter frame is not supplied from the selection circuit 1005, so that the image signal is not supplied to the driver circuit portion 1007 through the display control circuit 1006, and the display control circuit 1006 stops supplying the control signals to the driver circuit portion 1007.

Note that in the case where the still image is determined, when the period during which an image is assumed to be a still image is short, stop of supplying of the high power supply potential Vdd and the low power supply potential Vss among the control signals is not necessarily performed. Stop and restart of the high power supply potential Vdd and the low power supply potential Vss are preferably performed frequently, in which case an increase in power consumption can be reduced.

It is preferable that the stop of supplying of the image signals and the control signals is performed entirely in the period for holding an image signal in each pixel in the pixel portion 1008, and the image signals and the control signals which the display control circuit 1005 supplies before are supplied again, such that the image signal is supplied again after the holding period of each pixel.

The supplying of any signal refers to supplying a predetermined potential to a wiring. The stop of supplying of any signal refers to stop of supplying of the predetermined potential to the wiring, and connection to a wiring to which a predetermined fixed potential is supplied, for example, a wiring to which the low power supply potential Vss is supplied. The stop of supplying of any signal also refers to cut of an electrical connection to a wiring to which a predetermined potential is supplied, to make a floating state.

As described above, in the thin film transistor including the oxide semiconductor layer, off-state current per a channel width of 1 μm can be reduced to less than or equal to 1 aA ($1 \times 10^{-18}$ A/μm) (1 aA/μm), whereby the holding period can be extended. Thus, a synergistic effect is expected to be generated in reduction of power consumption when a still image is displayed in this embodiment.

In this manner, image signals are compared to determine whether an image thereof is a moving image or a still image, and supplying or stop of supplying of control signals such as a clock signal or a start pulse is selectively performed, whereby power consumption can be reduced.

Figure 26A:
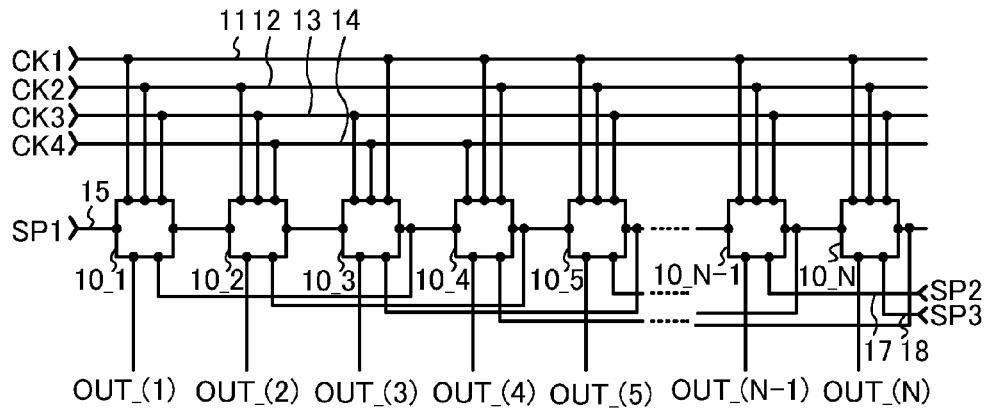
FIGS. 26A to 26C illustrate structures of a driver circuit and a shift register according to Embodiment.
Figure 26B:
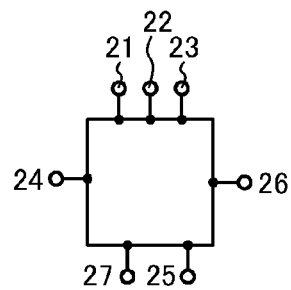
Figure 26C:
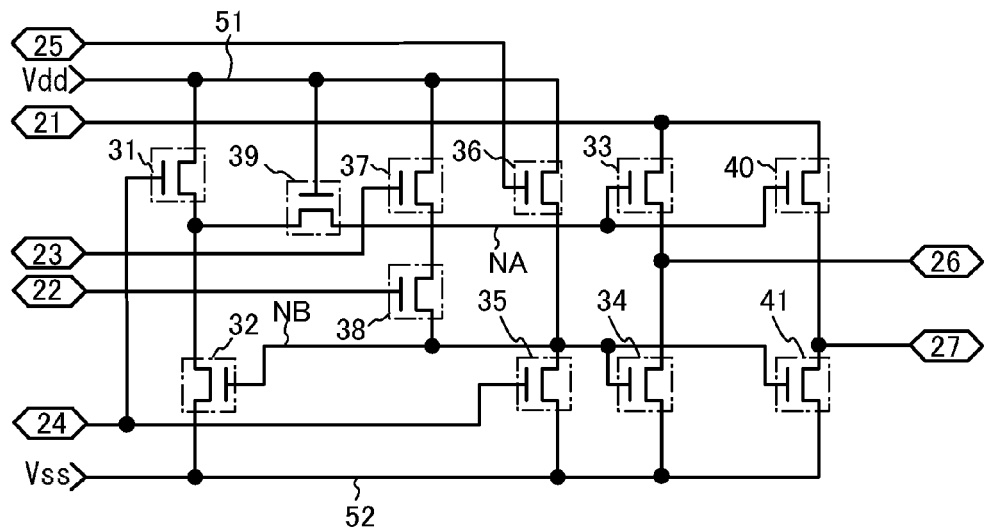

Next, an example of a structure of a shift register included in each of the gate line driver circuit 1009A and the signal line driver circuit 1009B of the driver circuit portion 1007 is described using FIGS. 26A to 26C.

The shift register shown in FIG. 26A includes first to N-th pulse output circuits 10_1 to 10_N (N is a natural number greater than or equal to 3). A first clock signal CK1 from a first wiring 11, a second clock signal CK2 from a second wiring 12, a third clock signal CK3 from a third wiring 13, and a fourth clock signal CK4 from a fourth wiring 14 are supplied to the first to the N-th pulse output circuits 10_1 to 10_N of the shift register shown in FIG. 26A. A start pulse SP1 (a first start pulse) from a fifth wiring 15 is input to the first pulse output circuit 10_1. A signal from the pulse output circuit in the previous stage (the signal is referred to as a previous-stage signal OUT(n−1)) (n is a natural number greater than or equal to 2 and less than or equal to N) is input to the n-th pulse output circuit 10_N in the second or later stage. A signal from the third pulse output circuit 10_3 in the stage that is two stages after the first pulse output circuit 10_1 is input to the first pulse output circuit 10_1. In a similar manner, a signal from the (n+2)-th pulse output circuit 10_(n+2) in the stage two stages after the n-th pulse output circuit 10_n (the signal is referred to as a later-stage signal OUT(n+2)) is input to the n-th pulse output circuit. Thus, the pulse output circuits in the respective stages output first output signals (OUT(1)(SR) to OUT (N)(SR)) to be input to the pulse output circuits in the respective subsequent stages and/or the pulse output circuits in the stages that are two stages before the respective pulse output circuits and second output signals (OUT(1) to OUT (N)) to be input to other circuits or the like. Note that as shown in FIG. 26A, the later-stage signal OUT(n+2) is not input to the pulse output circuits in the last two stages of the shift register; therefore, as an example, a second start pulse SP2 from a sixth wiring 17 may be input to the pulse output circuit in one of the last two stages of the shift register and a third start pulse SP3 from a seventh wiring 18 may be input to the pulse output circuit in the other of the last two stages of the shift register. Alternatively, signals may be generated inside the shift register. For example, an (N+1)-th pulse output circuit 10_(N+1) and an (N+2)-th pulse output circuit 10_(N+2) which do not contribute to pulse output to the pixel portion (such circuits are also referred to as dummy stages) may be provided, and signals corresponding to the second start pulse (SP2) and the third start pulse (SP3) may be generated in the dummy stages.

Note that the first to the fourth clock signals (CK1) to (CK4) each are a signal which oscillates between an H-level signal and an L-level signal at a constant cycle. The first to the fourth clock signals (CK1) to (CK4) are delayed by ¼ period sequentially. In this embodiment, by using the first to fourth clock signals (CK1) to (CK4), control of driving of the pulse output circuit or the like is performed. Note that the clock signal is also called GCK or SCK depending on a driver circuit to which the clock signal is input; however, description is made in this embodiment by using CK as the clock signal.

Note that when it is explicitly described that "A and B are connected," the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer). Therefore, another connection relation shown in drawings and texts is included without being limited to a predetermined connection relation, for example, the connection relation shown in the drawings and the texts.

Each of the first to N-th pulse output circuits 10_1 to 10_N includes a first input terminal 21, a second input terminal 22, a third input terminal 23, a fourth input terminal 24, a fifth input terminal 25, a first output terminal 26, and a second output terminal 27 (see FIG. 26B).

The first input terminal 21, the second input terminal 22, and the third input terminal 23 are electrically connected to any of the first to fourth wirings 11 to 14. For example, in FIGS. 26A and 26B, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

In FIGS. 26A and 26B, in the first pulse output circuit 10_1, the first start pulse SP1 is input to the fourth input terminal 24, the first output signal OUT(1)(SR) is output from the first output terminal 26, and the second output signal OUT(1) is output from the second output terminal 27.

Next, an example of a specific circuit structure of the pulse output circuit is described with reference to FIG. 26C.

In FIG. 26C, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 52, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 52, and a second terminal of the fourth transistor 34 is electrically connected to the first output terminal 26. A first terminal of the fifth transistor 35 is electrically connected to the power supply line 52, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 51, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 51, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and the gate electrode of the tenth transistor 40, and a gate electrode of the ninth transistor 39 is electrically connected to the power supply line 51. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 52, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34.

In FIG. 26C, a connection point of the gate electrode of the third transistor 33, the gate electrode of the tenth transistor 40, and the second terminal of the ninth transistor 39 is referred to as a node NA. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node NB.

In the case where the pulse output circuit in FIG. 26C is the first pulse output circuit 10_1, the first clock signal CK1 is input to the first input terminal 21, the second clock signal CK2 is input to the second input terminal 22, the third clock signal CK3 is input to the third input terminal 23, the start pulse SP is input to the fourth input terminal 24, a subsequent-stage signal OUT(3) is input to the fifth input terminal 25, the first output signal OUT(1)(SR) is output from the first output terminal 26, and the second output signal OUT(1) is output from the second output terminal 27.

Figure 27:
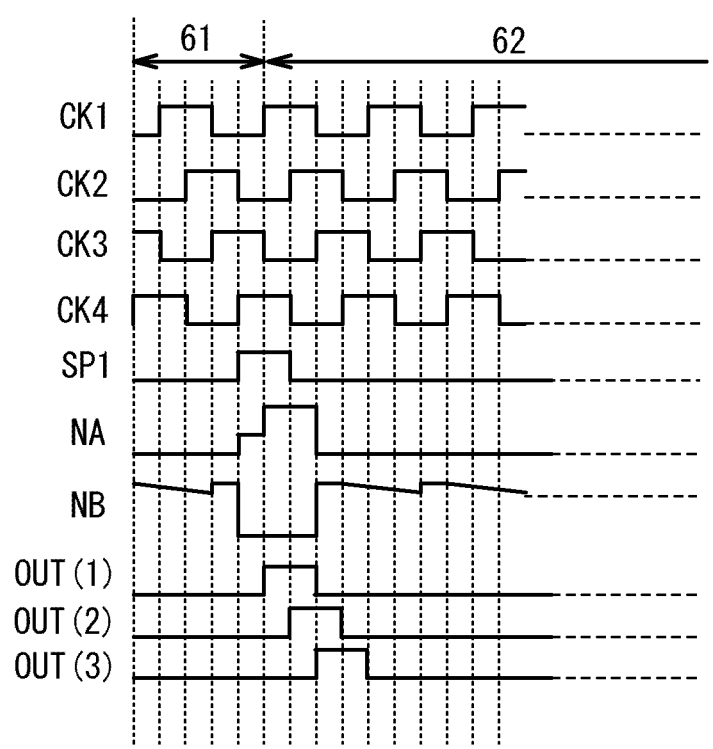
FIG. 27 is a timing chart of an operation of a shift register.

FIG. 27 is a timing chart of a shift register including the plurality of pulse output circuits illustrated in FIG. 26C. In the case where the shift register is a gate line driver circuit, a period 61 in FIG. 27 is a vertical retrace period and a period 62 is a gate selection period.

Figure 28:
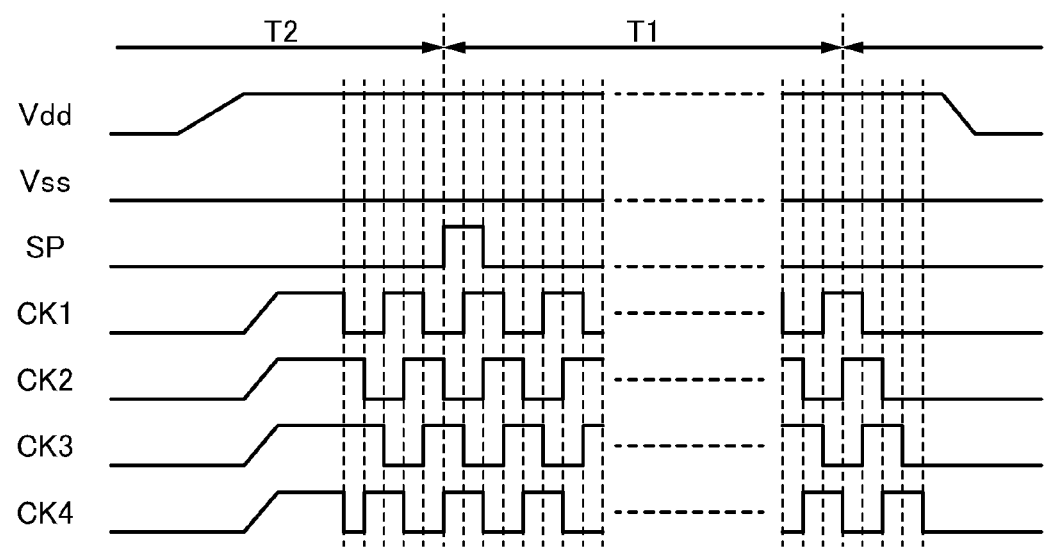
FIG. 28 is a timing chart of an operation of a shift register.

The procedure of supplying, or stopping the supply of, a potential to each wiring of the driver circuit portion during the operations to display a still image and a moving image, or the operation to rewrite a voltage to be applied to a driving TFT of an EL element in a pixel portion (hereinafter the operation is also referred to as refresh operation), in the driver circuit manufactured using a plurality of n-channel transistors, which is given as an example in FIGS. 26A to 26C and FIG. 27, will be described with reference to FIG. 28. FIG. 28 illustrates changes in potentials, before and after a period T1, of a wiring for supplying a high power supply potential (Vdd), a wiring for supplying a low power supply potential (Vss), a wiring for supplying a start pulse (SP), and wirings for supplying first to fourth clock signals (CK1 to CK4) to a shift register.

The liquid crystal display device according to this embodiment can display a still image and a mobbing image and display a still image by refresh operation without constantly operating the driver circuit portion. Therefore, as illustrated in FIG. 28, there are a period in which control signals such as the high power supply potential (Vdd), the first to fourth clock signals (CK1 to CK4), and the start pulse are supplied to a shift register and a period in which control signals are not supplied. Note that the period T1 illustrated in FIG. 28 corresponds to the period in which control signals are supplied, in other words, a period in which a moving image is displayed and a period in which refresh operation is performed. The period T2 illustrated in FIG. 27 corresponds to the period in which control signals are not supplied, in other words, a period in which a still image is displayed.

In FIG. 28, a period in which the high power supply potential (Vdd) is supplied is provided not only in the period T1 but also in part of the period T2. In addition, in FIG. 28, a period in which the first to fourth clock signals (CK1 to CK4) are supplied is provided between the start of the supply of the high power supply potential (Vdd) and the stop of the supply of the high power potential (Vdd).

Moreover, as illustrated in FIG. 28, the first to fourth clock signals (CK1 to CK4) may be set so as to start to oscillate at a constant frequency after being set to a high potential once before the period T1 begins and stop oscillating after being set to a low potential after the period T1 ends.

As described above, in the display device according to this embodiment, the supply of control signals such as the high power supply potential (Vdd), the first to fourth clock signals (CK1 to CK4), and the start pulse to the shift register is stopped in the period T2. Then, in the period in which the supply of control signals is stopped, whether each transistor is turned on or turned off is controlled and the output of a pulse signal from the shift register is also stopped. Therefore, power consumption of the shift register and power consumption of the pixel portion which is driven by the shift register can be reduced.

Note that the above-described refresh operation needs to be performed regularly because there is a possibility that the quality of a displayed still image may deteriorate. In the display device according to this embodiment, the above-described transistor including an oxide semiconductor is employed as a switching element for controlling a voltage to be applied to a driving TFT of an EL element in each pixel. Thus, off-state current can be drastically decreased, and a change in voltage to be applied to the driver TFT of the EL element in each pixel can be reduced. In other words, even when the period in which the operation of the shift register is stopped is long due to display of a still image, the deterioration of image quality can be suppressed. For example, even when the period is 3 minutes long, the quality of a displayed still image can be maintained. For example, if a display device in which rewrite is performed 60 times per second and a display device in which refresh operation is performed once in 3 minutes are compared with each other, power consumption can be reduced to approximately 1/10000.

Note that the stop of the supply of the high power supply potential (Vdd) is to set a potential equal to the low power supply potential (Vss) as illustrated in FIG. 28. Note that the stop of the supply of the high power supply potential (Vdd) may be to set the potential of a wiring, to which the high power supply potential is supplied, in a floating state.

Note that when the potential of the wiring to which the high power supply potential (Vdd) is supplied is increased, which means that the potential is increased from the low power supply potential (Vss) to the high power supply potential (Vdd) before the period T1, it is preferable that the potential of the wiring is controlled so as to change gradually. If the gradient of the change in potential of the wiring is steep, there is a possibility that the change in potential may become noise and an irregular pulse may be output from the shift register. In the case where the shift register is included in a gate line driver circuit, the irregular pulse serves as a signal for turning on a transistor. Thus, there is a possibility that a voltage to be applied to a driver TFT of an EL element might be changed by the irregular pulse and the quality of a still image might be changed. Therefore, it is preferable that the change in potential of the wiring be controlled as described above. In view of the above content, FIG. 28 illustrates an example in which a rise in signal to the high power supply potential (Vdd) is more gradual than a fall. In particular, in the display device according to this embodiment, when a still image is displayed in the pixel portion, the stop of the supply, and the resupply, of the high power supply potential (Vdd) to the shift register are performed as appropriate. In other words, in the case where a change in potential of the wiring for supplying the high power supply potential (Vdd) adversely affects the pixel portion as noise, the noise directly leads to deterioration of a display image. Therefore, it is important to control the display device according to this embodiment so as to prevent a change in potential (particularly, an increase in potential) of the wiring from entering the pixel portion as noise.

This application is based on Japanese Patent Application serial no. 2009-242757 filed with Japan Patent Office on Oct. 21, 2009, and Japanese Patent Application no. 2009-278997 filed with Japan Patent Office on Dec. 8, 2009, the entire contents of which are hereby incorporated by reference.

The invention claimed is:

1. A display device comprising:
a scan line;
a signal line;
a wiring; and
a pixel region comprising:
a first transistor;
a second transistor; and
a light-emitting element,
wherein the second transistor comprises a first gate electrode, a second gate electrode and an oxide semiconductor layer, the first gate electrode being electrically connected to the scan line,
wherein one of a source electrode and a drain electrode of the second transistor is electrically connected to a gate electrode of the first transistor,
wherein the other of the source electrode and the drain electrode of the second transistor is electrically connected to the signal line,
wherein one of a source electrode and a drain electrode of the first transistor is electrically connected to the wiring,
wherein the other of the source electrode and the drain electrode of the first transistor is electrically connected to a first electrode of the light-emitting element,
wherein a first voltage applied to the wiring is greater than a second voltage applied to a second electrode of the light-emitting element,
wherein the oxide semiconductor layer includes a channel formation region,
wherein when the second transistor is off state, a drain current of the second transistor per a channel width of 1 µm is less than or equal to $1 \times 10^{-16}$ A/µm, and
wherein the first gate electrode and the second gate electrode overlap with the channel formation region and sandwich the oxide semiconductor layer.

2. The display device according to claim 1, wherein the oxide semiconductor layer of the second transistor has a band gap of greater than or equal to 2 eV.

3. The display device according to claim 1, wherein the oxide semiconductor layer of the second transistor has a hydrogen concentration of less than or equal to $5 \times 10^{19}/cm^3$.

4. The display device according to claim 1, wherein a carrier concentration of the oxide semiconductor layer is less than $1 \times 10^{14}/cm^3$.

5. The display device according to claim 1, wherein the second transistor is configured to hold the first transistor in an on state and connect the wiring to the light-emitting element to display a still image.

6. The display device according to claim 1, wherein the wiring supplies a DC current.

7. The display device according to claim 1
wherein the light-emitting element comprises:
a layer containing a light-emitting organic substance between the first and the second electrodes.

8. An electronic device comprising the display device according to claim 1.

9. The display device according to claim 1, wherein the display device is a lighting device.

10. A display device comprising:
a scan line;
a signal line;
a wiring; and
a pixel region comprising:
a first transistor;
a second transistor; and
a light-emitting element,
wherein the second transistor comprises a first gate electrode, a second gate electrode and a first oxide semiconductor layer, the first gate electrode being electrically connected to the scan line,
wherein one of a source electrode and a drain electrode of the second transistor is electrically connected to a gate electrode of the first transistor,
wherein the other of the source electrode and the drain electrode of the second transistor is electrically connected to the signal line,
wherein the first transistor comprises a second oxide semiconductor layer,
wherein one of a source electrode and a drain electrode of the first transistor is electrically connected to the wiring,
wherein the other of the source electrode and the drain electrode of the first transistor is electrically connected to a first electrode of the light-emitting element,
wherein a first voltage applied to the wiring is greater than a second voltage applied to a second electrode of the light-emitting element,
wherein the first oxide semiconductor layer includes a channel formation region,
wherein, when the second transistor is off state, a drain current of the second transistor per a channel width of 1 µm is less than or equal to $1 \times 10^{-16}$ A/µm, and
wherein the first gate electrode and the second gate electrode overlap with the channel formation region and sandwich the first oxide semiconductor layer.

11. The display device according to claim 10, wherein the first oxide semiconductor layer of the second transistor has a band gap of greater than or equal to 2 eV.

12. The display device according to claim 10, wherein the first oxide semiconductor layer of the second transistor has a hydrogen concentration of less than or equal to $5 \times 10^{19}/cm^3$.

13. The display device according to claim 10, wherein a carrier concentration of the first oxide semiconductor layer is less than $1 \times 10^{14}/cm^3$.

14. The display device according to claim 10, wherein the second transistor is configured to hold the first transistor in an on state and connect the wiring to the light-emitting element to display a still image.

15. The display device according to claim 10, wherein the wiring supplies a DC current.

16. The display device according to claim 10,
wherein the light-emitting element comprises:
a layer containing a light-emitting organic substance between the first and the second electrodes.

17. An electronic device comprising the display device according to claim 10.

18. The display device according to claim 10, wherein the display device is a lighting device.

* * * * *